(12) United States Patent
Nishi

(10) Patent No.: US 6,813,000 B1
(45) Date of Patent: Nov. 2, 2004

(54) EXPOSURE METHOD AND APPARATUS

(75) Inventor: Kenji Nishi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 463 days.

(21) Appl. No.: 09/628,310

(22) Filed: Jul. 28, 2000

Related U.S. Application Data

(63) Continuation-in-part of application No. PCT/JP99/00363, filed on Jan. 28, 1999.

(30) Foreign Application Priority Data

Jan. 29, 1998 (JP) .......................................... 10-017222

(51) Int. Cl.[7] ........................ G03B 27/42; G03B 27/52; G01B 11/00
(52) U.S. Cl. ............................. 355/53; 355/55; 356/401
(58) Field of Search .............................. 355/53, 55, 72, 355/77; 356/399, 400, 401

(56) References Cited

U.S. PATENT DOCUMENTS

| | | | | |
|---|---|---|---|---|
| 5,114,234 A | * | 5/1992 | Otsuka et al. ............... | 356/500 |
| 5,448,332 A | | 9/1995 | Sakakibara et al. | |
| 5,461,237 A | | 10/1995 | Wakamoto et al. | |
| 5,510,892 A | * | 4/1996 | Mizutani et al. ......... | 356/139.1 |
| 5,602,400 A | * | 2/1997 | Kawashima ................ | 250/548 |
| 5,657,130 A | | 8/1997 | Shirasu et al. | |
| H1774 H | | 1/1999 | Miyachi | |
| 6,122,036 A | * | 9/2000 | Yamasaki et al. ............. | 355/53 |
| 6,411,387 B1 | | 6/2002 | Kaneko et al. | |

FOREIGN PATENT DOCUMENTS

| | | | | |
|---|---|---|---|---|
| JP | H06-283403 | * | 10/1994 | |
| JP | 6-283403 | * | 10/1994 | ......... H01L/21/027 |
| JP | A-9-15872 | | 1/1997 | |
| JP | A-9-223650 | | 8/1997 | |
| JP | A-10-116781 | | 5/1998 | |
| JP | 10-177950 | | 6/1998 | |
| JP | 10-261567 | | 9/1998 | |
| JP | A-10-270305 | | 10/1998 | |
| JP | A-10-275768 | | 10/1998 | |

* cited by examiner

Primary Examiner—Alan Mathews
(74) Attorney, Agent, or Firm—Oliff & Berridge, PLC

(57) ABSTRACT

An exposure method is disclosed, in which a surface of a wafer can be conformed to an image plane highly accurately even when an angle of inclination of a running surface of a wafer stage is varied when a pattern for a semiconductor device or the like is transferred onto the wafer in accordance with the scanning exposure system. The focusing is performed in an exposure area on the basis of a focus position detected in a pre-reading area in which the focus position can be detected highly accurately although the detection range is narrow, disposed in front of the exposure area on the wafer in the scanning direction. In order to allow the surface of the wafer to be included in the detection range of the focus position in the pre-reading area, the focus position of the wafer is roughly conformed to the image plane on the basis of a result of detection at a rough detecting point for roughly detecting the focus position in front of the pre-reading area with a wide detection range.

53 Claims, 23 Drawing Sheets

(a)

(b)

EXPOSURE METHOD AND APPARATUS

CROSS-REFERENCE

This application is a Continuation-In-Part Application of International Application No. PCT/JP99/003635 which was filed on Jan. 28, 1999 claiming the conventional priority of Japanese patent application No. 10-17222 filed on Jan. 29, 1998.

BACKGROUND OF THE INVENTION

1. Field of the Invention

The present invention relates to an exposure method and an apparatus for being used to transfer a pattern such as a mask pattern to a photosensitive substrate in the photolithography step for producing, for example, semiconductor elements, image pickup elements (for example, CCD), liquid crystal display elements, or thin film magnetic heads. Especially, the present invention is preferably used for a projection exposure apparatus of the scanning exposure type such as the step-and-scan system.

2. Description of the Related Art

For example, when the semiconductor element is produced, the reduction projection type exposure apparatus (stepper) of the step-and-repeat system (full field exposure type) has been hitherto used in many cases as an exposure apparatus for transferring a pattern on a reticle as a mask to respective shot areas on a wafer applied with photoresist. Recently, on the other hand, in order to respond to such a request that a large area circuit pattern is transferred highly accurately without exerting excessive load on the projection optical system, attention is paid to the projection exposure apparatus of the so-called step-and-scan system for successively transferring an image of a pattern on a reticle to respective shot areas on a wafer by synchronously moving the reticle and the wafer with respect to a projection optical system in a state in which a part of the pattern on the reticle is projected onto the wafer via the projection optical system.

In the case of the projection exposure apparatus of the scanning exposure type such as the step-and-scan system, it is also necessary that the exposure is performed in a state in which the surface of the wafer is adjusted or conformed (focused) with respect to the image plane of the projection optical system in the same manner as in the full field exposure type. However, in the case of the scanning exposure type, the exposure is performed while moving the surface of the wafer with respect to the exposure area defined by the projection optical system. Therefore, when any difference in level or the like exists on the surface of the wafer, it is desirable to previously detect the difference in level or the like. Accordingly, the following pre-reading control technique as been developed for the scanning exposure type, for example, as disclosed in Japanese Patent Application Laid-Open No. 6-283403, the content of which is incorporated hereinto by reference. That is, the focus position (position in the optical axis direction of the projection optical system) of the surface of the wafer is detected (pre-read) in a pre-reading area disposed on the front side in the scanning direction with respect to the exposure area. The focus position and the angle of inclination of the surface of the wafer are controlled on the basis of the result of the detection in accordance with the autofocus system and the autoleveling system.

As described above, in the conventional scanning exposure type projection exposure apparatus, the surface of the moving wafer can be focused within a predetermined allowable range with respect to the image plane in the exposure area of the projection optical system by using the pre-reading control technique. In the conventional projection exposure apparatus, for example, the system, in which a movable stage is driven in a contact manner along a guide having good straightness (hereinafter referred to as "contact type guide system"), has been principally adopted for the wafer stage for driving the wafer.

On the contrary, recently, the necessity to move the wafer at a high speed is increased in order to improve the throughput in the exposure step. Therefore, those dominantly used is the stage apparatus based on the non-contact guide system including a system in which a movable stage is arranged with an air guide (air bearing) along a guide having good flatness at least partially, and the movable stage is driven in a non-contact manner by using a linear motor, and a system in which a movable stage is supported in accordance with a magnetically floating system over a guide surface having good flatness at least partially, and the movable stage is driven in a non-contact manner by using a linear motor. The stage apparatus based on the non-contact guide system has the following many advantages. That is, for example, the stage apparatus is scarcely affected by foreign matters on the guide surface, and it is excellent in maintenance performance. Further, the vibration from a base board as a guide in the horizontal direction is hardly transmitted to the movable stage.

However, the stage apparatus based on the non-contact guide system tends to suffer from the existence of waviness having a relatively large pitch and a relatively large amplitude along the guide surface, as compared with the contact type guide system. It has been feared that the surface of the wafer as the exposure objective is defocused, even when the focusing is performed in accordance with the autofocus system and the autoleveling system by using the pre-reading control technique. That is, in the case of the conventional pre-reading control, the control is made assuming that the flatness of the running surface of the wafer stage is satisfactory from the pre-reading position for the focus position on the wafer surface to the exposure position. Therefore, it has been feared that if the flatness of the running surface is unsatisfactory, the defocus amount remains corresponding to the product of the angle of inclination of the running surface and the distance from the pre-reading position to the exposure position.

Recently, in order to respond to finer circuit patterns as the transfer objective, the numerical aperture of the projection optical system is further increased, and the depth of focus of the projected image becomes small in accordance therewith. Therefore, a situation arises, in which it is impossible to neglect the defocus amount based on the angle of inclination of the running surface of the wafer stage as described above.

Taking the foregoing points into consideration, a first object of the present invention is to provide an exposure method which makes it possible to highly accurately conform a surface of a substrate as an exposure objective to an image plane even when the substrate as the exposure objective is relatively moved with respect to an optical system such as a projection optical system, for example, when the exposure is performed in accordance with the scanning exposure system.

A second object of the present invention is to provide an exposure method which makes it possible to highly accurately conform a surface of a substrate to an image plane even when the angle of inclination of a running surface of a stage for moving the substrate is gently changed when the substrate as an exposure objective is relatively moved with respect to a projection optical system, for example, when the exposure is performed in accordance with the scanning exposure system.

A third object of the present invention is to provide an exposure apparatus in which the exposure method as described above can be used, and a high-performance device which is produced by using the exposure method as described above.

SUMMARY OF THE INVENTION

A first exposure method according to the present invention lies in an exposure method for forming a predetermined image on a substrate by using an optical system which radiates an exposure light beam onto the substrate and a substrate stage which relatively moves the substrate with respect to the optical system, wherein a surface of the substrate and an image plane of the optical system are set to be in a predetermined positional relationship in at least a part of an area in an exposure area defined by the optical system, the method comprising the steps of: measuring a height of the surface of the substrate at a measuring point disposed in front of the part of the area in the relative movement direction; and setting the positional relationship to perform exposure on the basis of information about the measured height of the surface of the substrate and information about an inclination angle of a running surface of the substrate stage.

According to the first exposure method of the present invention as described above, even when the running surface of the substrate stage is inclined, the surface of the substrate can be highly accurately conformed to the image plane of the optical system by correcting the height of the surface of the substrate on the basis of the measured angle of inclination of the running surface of the substrate stage.

In another aspect, a second exposure method according to the present invention lies in an exposure method for forming a predetermined image on a substrate using an optical system which radiates an exposure light beam onto the substrate and a substrate stage which relatively moves the substrate with respect to the optical system, the method comprising the steps of: measuring at least one of a rolling amount of the substrate stage, a pitching amount of the substrate stage, and a displacement amount of the substrate stage in an optical axis direction of the optical system at a plurality of positions within a movement stroke of the substrate stage using a fiducial member having good flatness arranged on the substrate stage, and storing a result of measurement; and correcting at least one of a running direction of the substrate stage in and a height of a surface of the substrate on the basis of the result of measurement during exposure for the substrate.

According to the second exposure method as described above, the distribution of the rolling amount and the pitching amount of the substrate stage is previously measured. By doing so, it is possible to determine the variation values of the rolling amount and the pitching amount of the substrate stage brought about by the torsion of the substrate stage or the like. Accordingly, for example, it is possible to reduce the influence of the error in the leveling control of the substrate stage performed during the exposure by using the variation value.

In still another aspect, a third exposure method according to the present invention lies in an exposure method for forming a predetermined image on a substrate using an optical system which radiates an exposure light beam onto the substrate and a substrate stage which relatively moves the substrate with respect to the optical system, wherein the substrate and an image plane of the optical system are set to be in a predetermined positional relationship in at least a part of an area in an exposure area defined by the optical system, the method comprising the steps of: measuring a height position of the substrate at a first measuring point which arrives at an image-forming area on the substrate prior to the part of the area in the relative movement direction; measuring a height of the substrate at a second measuring point which arrives at the image-forming area on the substrate prior to the first measuring point in the relative movement direction; and moving the substrate to a height position within a detectable range of a unit for measuring the height position of the substrate at the first measuring point, on the basis of a measured value obtained at the second measuring point.

According to the third exposure method as described above, for example, the height of the substrate is roughly detected with a wide detection range at the second measuring point, and thus the height of the substrate can be derived for example, into a narrow detection range with a high resolution at the first measuring point. Therefore, even when the difference in level is large on the surface of the substrate, it is possible to conform the surface of the substrate to the image plane highly accurately.

In still another aspect, a first exposure apparatus according to the present invention lies in an exposure apparatus which comprises an optical system which radiates an exposure light beam onto a substrate, and a substrate stage which relatively moves the substrate with respect to the optical system, wherein a surface of the substrate and an image plane of the optical system are set to be in a predetermined positional relationship in at least a part of an area in an exposure area defined by the optical system, in order to form a predetermined image on the substrate, the exposure apparatus including: a focus position-measuring unit which measures a height of the surface of the substrate at a measuring point disposed in front of the part of the area in the relative movement direction; and a focusing stage which conforms the surface of the substrate to the image plane of the optical system in the exposure area of the optical system on the basis of a value measured by the focus position-measuring unit and information about an inclination angle of a running surface of the substrate stage.

According to the first exposure apparatus of the present invention as described above, it is possible to carry out the first exposure method of the present invention.

In still another aspect, a second exposure apparatus according to the present invention lies in an exposure apparatus which comprises an optical system which radiates an exposure light beam onto a substrate, and a substrate stage which relatively moves the substrate with respect to the optical system, and which forms a predetermined image on the substrate, the exposure apparatus including: a measuring unit with a fiducial member having good flatness arranged on the substrate stage, which measures at least one of a rolling amount of the substrate stage, a pitching amount of the substrate stage, and a displacement amount of the substrate stage in an optical axis direction of the optical system at a plurality of positions within a movement stroke of the substrate stage; and a focusing stage which stores a result of measurement performed by the measuring unit and which corrects at least one of a running direction of the substrate stage and a height of a surface of the substrate on the basis of the result of measurement during exposure for the substrate.

According to the second exposure apparatus of the present invention as described above, it is possible to carry out the second exposure method of the present invention.

In still another aspect, a third exposure apparatus according to the present invention lies in an exposure apparatus comprising an optical system which radiates an exposure light beam onto a substrate, and a substrate stage which relatively moves the substrate with respect to the optical system, wherein a surface of the substrate and an image plane of the optical system are set to be in a predetermined positional relationship in at least a part of an area in an exposure area defined by the optical system, in order to form a predetermined image on the substrate, the exposure apparatus including: a first focus position-measuring unit which measures a height position of a surface of the substrate at a first measuring point disposed in front of the part of the area in the relative movement direction; a second focus position-measuring unit which measures a height position of the substrate at a second measuring point set in the vicinity of the first measuring point; and a focusing stage which allows a height of the surface of the substrate to be included within a detectable range of the first focus position-measuring unit on the basis of a result of measurement performed by the second focus position-measuring unit.

According to the third exposure apparatus as described above, for example, a detection system, which has extremely fine (high) detection resolution (accuracy) although the detectable range (detection range) is narrow, is used for the first focus position-detecting unit. As a result, when the angle of inclination of the running surface of the substrate stage is partially changed to a great extent, the first measuring point on the substrate tends to be deviated from the detectable range of the first focus position-detecting unit. When the first measuring point is deviated from the detectable range as described above, for example, the height of the substrate is roughly measured in the vicinity of the first measuring point by using, for example, the second focus position-detecting unit which has a wide detectable range although the detecting resolution is not so fine. Based on a result of the measurement, the height (focus position) in the vicinity of the first measuring point is conformed to the image plane of the optical system (PL). Thus, the height of the first measuring point is included in the detectable range of the first focus position-detecting unit. Therefore, the first or third exposure method of the present invention can be carried out with ease.

It is desirable that the second measuring point (84A, 84B) is arranged in front of the first measuring point (81A to 81E) in the relative movement direction. When the second measuring point is disposed on the front side as described above, for example, the surface of the substrate can be conformed to the image plane before starting the scanning exposure when the scanning exposure is performed.

It is desirable that a detection range of the second focus position-measuring unit is wider than a detection range of the first focus position-measuring unit. Accordingly, even when the height of the substrate greatly varies at the edge of the substrate, the height of the substrate can be detected by using the second focus position-detecting unit.

It is desirable that a plurality of second measuring points (84A, 84B) are provided. The angle of inclination of the substrate can be also roughly corrected on the basis of the result of measurement performed at the plurality of measuring points.

It is desirable that the focusing stage controls (performs max-min control) a position of the substrate in an optical axis direction of the optical system on the basis of an intermediate value between a maximum value and a minimum value of the height position of the substrate measured at the first measuring point and the second measuring point (desirably at five points or more), and it controls (performs autoleveling control) an angle of inclination of the substrate by correcting an error brought about when the position concerning the optical axis direction is controlled (subjected to autofocus control), by using a value of the height position of the substrate. According to the simulation, the residual error of the defocus amount is decreased as a whole with respect to waviness at various wavelengths under this condition.

In still another aspect, a device according to the present invention lies in a device in which a predetermined pattern is formed, wherein the exposure method or the exposure apparatus of the present invention is used to transfer the image of the pattern onto a substrate (W). Accordingly, the surface of the substrate can be conformed to the image plane of the projection optical system highly accurately. Thus, it is possible to produce the high-performance device.

The predetermined pattern in the exposure method or the exposure apparatus of the present invention described above is exemplified by a pattern for transfer formed on a mask.

DETAILED DESCRIPTION OF PREFERRED EMBODIMENT OF THE INVENTION

Figure 1:
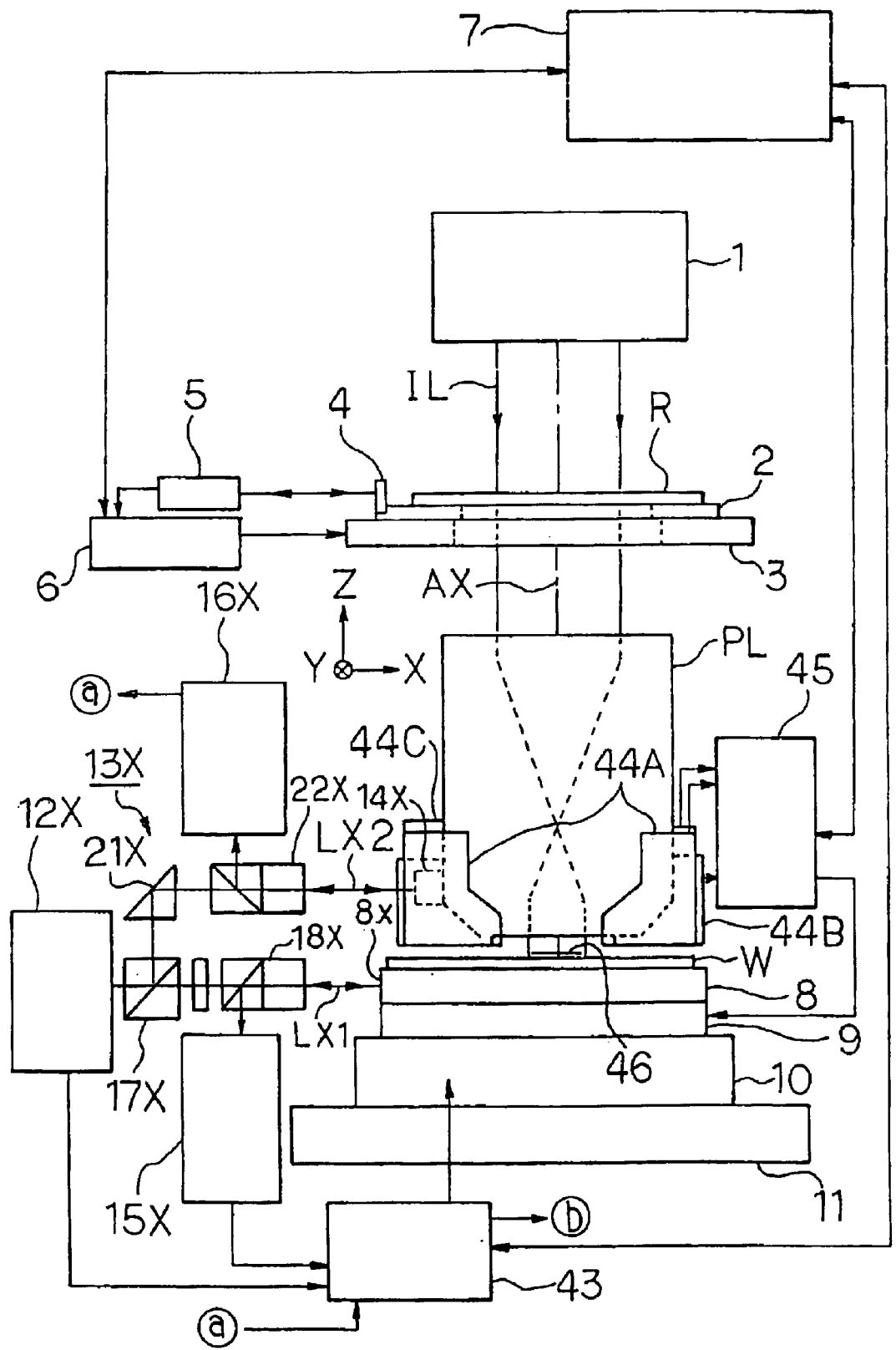
FIG. 1 shows a schematic arrangement illustrating a projection exposure apparatus to be used in an exemplary preferred embodiment of the present invention.

An exemplary preferred embodiment of the present invention will be explained below with reference to the drawings. In this embodiment, the present invention is applied to a projection exposure apparatus based on the step-and-scan system. FIG. 1 shows the projection exposure apparatus based on the step-and-scan system of this embodiment. In FIG. 1, when the exposure is performed, a slit-shaped illumination area on a pattern plane (lower surface) of a reticle R is illuminated with an exposure light beam IL such as an i-ray of a mercury lamp or an excimer laser beam radiated from an illumination optical system 1 including, for example, a light source, a fly's eye lens, a field diaphragm, and a condenser lens. A slit-shaped exposure area 46 on a wafer W applied with photoresist is exposed by projection with an image of the pattern in the illumination area on the reticle R under the exposure light beam IL at a predetermined projection magnification β (for example, β is ¼ or ⅕) by the aid of a projection optical system PL. The following explanation will be made assuming that the Z axis is parallel to the optical axis AX of the projection optical system PL, the X axis is parallel to the plane of paper in FIG. 1 in the plane perpendicular to the optical axis AX, and the Y axis is perpendicular to the plane of paper in FIG. 1.

At first, the reticle R is held by a reticle stage 2 by means of vacuum attraction. The reticle stage 2 is continuously moved in the Y direction (scanning direction) by the aid of a linear motor in a state of floating over a reticle base 3 by the aid of an air bearing. The position of the reticle R is finely adjusted in the X direction, the Y direction, and the rotational direction. A measuring laser beam is radiated from an external laser interferometer 5 onto a movement mirror 4 (actually composed of two movement mirrors perpendicular to one another) fixed on the side surface of the reticle stage 2. The interference light beam, which is obtained from an unillustrated reference laser beam generated at the inside of the laser interferometer 5 and a laser beam reflected from the movement mirror 4, is received by a photoelectric detector disposed in the laser interferometer 5. Accordingly, the two-dimensional position of the reticle stage 2 (reticle R) is measured. An obtained result of measurement is supplied to a reticle stage control system 6. The reticle stage control system 6 controls the position and the movement velocity of the reticle stage 2 under the control of a main control system 7 which collectively controls the operation of the entire apparatus.

On the other hand, the wafer W is held on a sample base 8 which is also used as a wafer holder, by means of vacuum attraction. The sample base 8 is fixed on a Z tilt stage 9, and the Z tilt stage 9 is placed on an XYθ stage 10. The XYθ stage 10 moves and positions the sample base 8 (wafer W) in the X direction, in the Y direction (scanning direction), and in the rotational direction by the aid of a linear motor in a state of floating over a base board 11 by the aid of an air bearing. The wafer stage is constructed by the Z tilt stage 9, the XYθ stage 10, and the base board 11. The Z tilt stage 9 controls the angle of inclination (leveling), and it controls the position (focus position) of the wafer W in the direction of the optical axis AX of the projection optical system PL.

According, an autofocus sensor (hereinafter referred to as "AF sensor"), which serves as a multi-point focus position-detection system based on the optical system and based on the oblique incidence system, is arranged on the side surface of the projection optical system PL. The AF sensor is used detect the focus position at a plurality of detecting points in the exposure area on the surface of the wafer W and in the pre-reading area disposed in front thereof in the scanning direction. A result of detection is supplied to a focusing control system 45. FIG. 1 shows those included in the AF sensor, i.e., and AF sensor 44B for detecting the focus position in the exposure area, and AF sensors 44A, 44C for detecting the focus position in the pre-reading areas in the two directions. The focusing control system 45 calculates the control amount of the angle of inclination and the focus position of the Z tilt stage 9 corresponding to the position of the wafer W in order to focus the surface in the exposure area of the wafer W to the image plane of the projection optical system PL, from the supplied information on the focus position under the control of the main control system 7. The operation of the Z tilt stage 9 is controlled on the basis of the control amount in accordance with the autofocus system and the autoleveling system. In this embodiment, a result of measurement of the pitching amount for the scanning direction of the Z tilt stage 9 is also supplied to the focusing control system 45. The focusing control system 45 corrects the control amount of the angle of inclination and the focus position of the Z tilt stage 9 on the basis of the result of measurement of the pitching amount.

The sample base 8, which is also used as the wafer holder of this embodiment, is made of, for example, quartz or glass ceramics having a low coefficient of expansion. The side surfaces of the sample base 8 disposed in the −X direction and in the +Y direction are mirror-finished to form a mirror surface 8x for the X axis and a mirror surface By for the Y axis (see FIG. 2). The mirror surfaces 8x, 8y are reflecting surfaces which are substantially perpendicular to the X axis and the Y axis respectively, and they are orthogonal to one another. The mirror surfaces 8x, 8y function as the movement mirrors for the interferometers respectively. The sample base 8 of this embodiment can be regarded to be used as the two-axis movement mirror as well. Further, a reference mirror 14X for the X axis, which has a reflecting surface substantially parallel to the mirror surface 8x, is fixed at a lower portion of the side surface in the −X direction of the projection optical system PL. A reference mirror 14Y for the Y axis, which has a reflecting surface substantially parallel to the mirror surface 8y, is fixed to a lower portion of the side surface in the +Y direction thereof (see FIG. 2).

With reference to FIG. 1, the laser beam, which is radiated from an X axis main interferometer body 12X, is branched by a branching/combining optical system 13X into a measuring laser beam (hereinafter referred to as "measuring beam") LX1 and a reference laser beam (hereinafter referred to as "reference beam") LX2 parallel to the X axis respectively. The measuring beam LX1 comes into the mirror surface 8x for the X axis of the sample base 8, and the reference beam LX2 comes into the reference mirror 14X for the X axis. The measuring beam LX1 makes two round trips between the branching/combining optical system 13X and the mirror surface 8x, and it returns to the main interferometer body 12X. The reference beam LX2 also makes two round trips between the branching/combining optical system 13X and the reference mirror 14X, and it returns to the main interferometer body 12X (as described in detail later on). That is, a laser interferometer based on the double-pass system for the X axis is constructed by the main interferometer body 12X, the branching/combining optical system 13X, and the reference mirror 14X. The main interferometer body 12X performs interpolation and addition processing for a detection signal obtained by photoelectrically converting the interference light beam of the returning measuring beam LX1 and the reference beam LX2 so that the displacement of the mirror surface 8x in the X direction is determined on the basis of the reference mirror 14X. The obtained displacement is supplied to the wafer stage control system 43. The wafer stage control system 43 adds a predetermined offset to the displacement to determine the X coordinate of the sample base 8.

In this case, for example, light fluxes, which are obtained by frequency-modulating a He—Ne laser beam having a wavelength of 633 nm with predetermined frequencies Δf and −Δf respectively, are used for the measuring beam LX1 and the reference beam LX2. For example, the both beams are linearly polarized with polarization directions perpendicular to one another respectively. The both light fluxes are divided and combined in accordance with this system. Thus, the displacement is measured in accordance with the heterodyne system. This embodiment is based on the double-pass system. Therefore, assuming that the wavelength of the measuring beam LX1 is λ, the displacement of the sample base 8 can be detected with a resolution of λ/4 when no electric interpolation is performed. The resolution is ½ of a resolution (λ/2) obtained when the single path system is used. Further, in this embodiment, the electric interpolation processing is added to obtain, for example, a final resolution of about λ/40 ($\approx$10 nm) to λ/400 ($\approx$1 nm).

In this embodiment, a laser interferometer based on the double-pass system for the Y axis is also provided together with the laser interferometer based on the double-pass system for the X axis.

Figure 2:
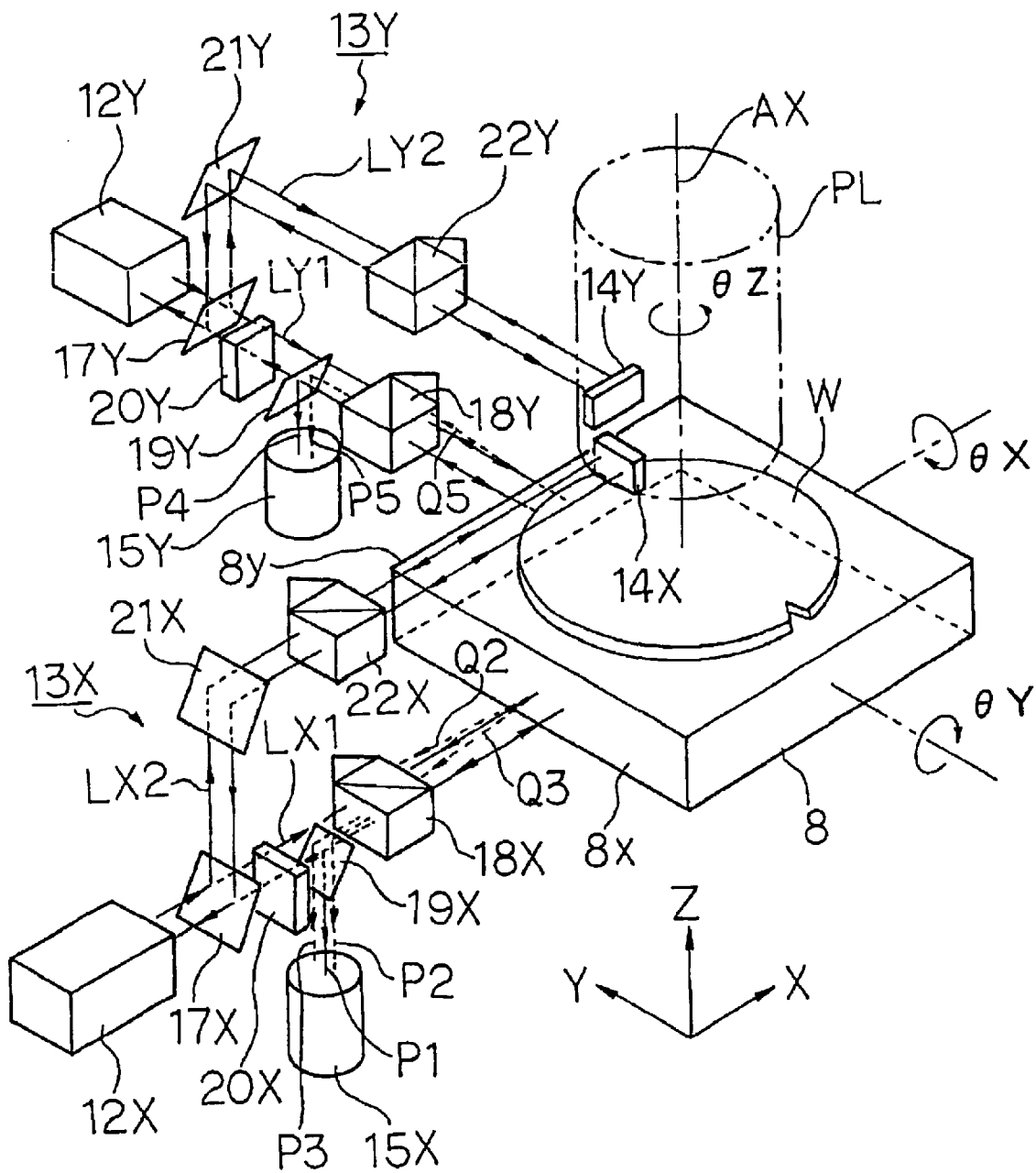
FIG. 2 shows a perspective view, with partial simplification, illustrating a laser interferometer system for a wafer-side stage of the projection exposure apparatus shown in FIG. 1.
Figure 3:
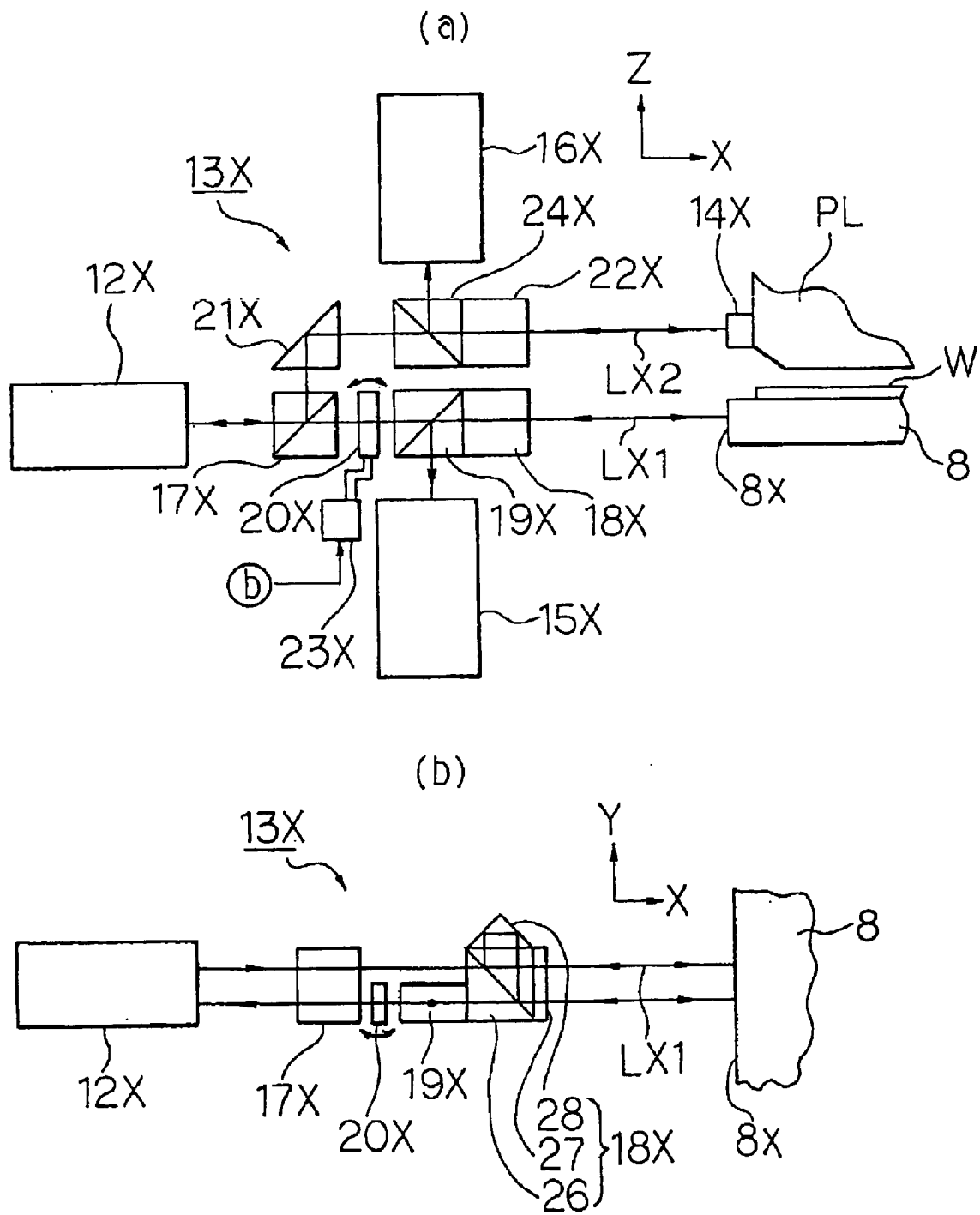
FIG. 3(a) shows a front view illustrating an arrangement of a branching/combining optical system 13X shown in FIG. 2 and members disposed therearound.
FIG. 3(b) shows a plan view illustrating a double-pass unit 18X and other components shown in FIG. 3(a).

FIG. 2 shows the laser interferometer system for the wafer-side stage of the projection exposure apparatus shown in FIG. 1. However, in FIG. 2, for the purpose of better understanding, optical members are partially omitted. Further, for example, a prism-shaped beam splitter is depicted as a flat plate-shaped beam splitter. With reference to FIG. 2, the laser beam, which is radiated from the main interferometer body 12Y for the Y axis, is branched by the branching/combining optical system 13Y into a measuring beam LY1 and a reference beam LY2 parallel to the Y axis respectively. The measuring beam LY1 comes into the mirror surface 8y for the Y axis of the sample base 8, and the reference beam LY2 comes into the reference mirror 14Y for the Y axis. The measuring beam LY1 makes two round trips between the branching/combining optical system 13Y and the mirror surface 8y, and it returns to the main interferometer body 12Y. The reference beam LY2 also makes two round trips between the branching/combining optical system 13Y and the reference mirror 14Y, and it returns to the main interferometer body 12Y. The main interferometer body 12Y performs interpolation and addition processing for a detection signal obtained by photoelectrically converting the interference light beam of the returning measuring beam LY1 and the reference beam LY2 so that the displacement of the mirror surface 8y in the Y direction is determined on the basis of the reference mirror 14Y. The obtained displacement is supplied to the wafer stage control system 43 shown in FIG. 1. The wafer stage control system 43 adds a predetermined offset to the displacement to determine the Y coordinate of the sample base 8.

As shown in FIG. 2, the optical axis of the measuring beam LX1 for the X axis (center line for making the two round trips) is disposed on a straight line which is parallel to the X axis and which passes through the optical axis AX of the projection optical system PL. The optical axis of the measuring beam LY1 for the Y axis is also disposed on a straight line which is parallel to the Y axis and which passes through the optical axis AX. Therefore, in this embodiment, it is possible to highly accurately measure, without any Abbe error, the position of the optical axis AX of the projection optical system PL, i.e., the position of the center (exposure center) of the substantially slit-shaped exposure area.

With reference to FIG. 1 again, the wafer stage control system 43 controls the movement velocity and the positioning operation of the XYθ stage 10 on the basis of the X coordinate and the Y coordinate of the sample base 8 measured by the aid of the main interferometer bodies 12X, 12Y under the control of the main control system 7. During the exposure, the XYθ stage 10 is firstly subjected to the stepping driving, and thus the shot area on the wafer W to be subsequently exposed is set to the scanning start position. After that, the reticle stage 2 is used to scan the reticle R in the +Y direction (or in the −Y direction) at a velocity $V_R$, in synchronization with which the XYθ stage 10 is used to scan the wafer W in the −Y direction (or in the +Y direction) at a velocity $V_W$, (=β·$V_R$) (β represents the projection magnification of the projection optical system PL from the reticle R to the wafer W). Thus, the concerning shot area is exposed with the pattern image of the reticle R in a scanning manner.

Although not shown, the projection exposure apparatus of this embodiment is provided with an alignment sensor for measuring the position of the reticle R and the position of the wafer W. The positional adjustment is performed for the reticle R and the respective shot areas on the wafer W on the basis of a result of measurement performed by the alignment sensor.

In this embodiment, as described above, the X coordinate and the Y coordinate of the sample base 8 (wafer W) are measured by using the one-axis laser interferometers based on the double-pass system for the X direction and the Y direction respectively. The positioning of the sample base 8 and the scanning exposure are performed on the basis of the results of measurement. However, for example, if any rotation (yawing) about the axis parallel to the Z axis occurs in the sample base 8 during the scanning exposure, any overlay error occurs between the reticle R and the wafer W.

In this embodiment, the spacing distance is provided in the Z direction between the surface of the wafer W and the height of the measuring beams LX1, LY1 Therefore, if the sample base 8 suffers from any rotation about the axis parallel to the X axis (pitching in the scanning direction) or any rotation about the axis parallel to the Y axis (rolling in the scanning direction), any positional discrepancy occurs due to the Abbe error between the actual position of the wafer W and the coordinates measured by the main interferometer bodes 12X, 12Y. Further, if there is any change in angle of inclination of the surface of the base board 11 for moving the XYθ stage 10 thereon, i.e., the running surface of the XYθ stage 10, especially in angle of inclination about the axis parallel to the X axis (pitching direction during the scanning exposure), the focus position on the surface of the wafer W is changed depending on the position of the wafer W in the Y direction during the scanning exposure. Accordingly, in this embodiment, the yawing amount, the pitching amount, and the rolling amount of the sample base 8 are always measured during the scanning exposure.

Detailed explanation will be made below for a mechanism for measuring the angle of rotation of the sample base 8 about the axis parallel to each of the X axis, the Y axis, and the Z axis. In this embodiment, the angle of rotation is also measured by using the measuring beams LX1, LY1 of the laser interferometer based on the double-pass system for measuring the displacement. Therefore, detailed explanation will be made with reference to FIGS. 2 to 6 including the arrangement of the laser interferometer.

In FIG. 2, the laser beam, which is radiated from the main interferometer body 12X for the X axis, comes into a polarizing beam splitter 17X in the branching/combining optical system 13X, and it is branched into a reference beam LX2 of S polarization which is reflected by the polarizing beam splitter 17X and a measuring beam LX1 of P polarization which is transmitted through the polarizing beam splitter 17X to travel in parallel to the X axis. The latter measuring beam LX1 comes into the double-pass unit 18X.

FIG. 3(a) shows a front view in which the branching/combining optical system 13X shown in FIG. 2 is viewed in the +Y direction, and FIG. 3(b) shows a plan view illustrating the double-pass unit 18X shown in FIG. 3(a). As shown in FIG. 3(b), the double-pass unit 18X comprises a polarizing beam splitter 26, a ¼ wavelength plate 27 installed to an outgoing plane thereof, and a corner cube 28 installed to a side surface of the polarizing beam splitter 26. The measuring beam LX1, which comes into the double-pass unit 18X, is once transmitted through the polarizing beam splitter 26 and the ¼ wavelength plate 27, and it is reflected by the mirror surface 8x of the sample base 8 in the circularly polarized state. The reflected measuring beam LX1 passes through the ¼ wavelength plate 27 to be in the S-polarized state, and it is reflected by the polarizing beam splitter 26. After that, the beam is reflected by the corner cube 28, and it is reflected by the polarizing beam splitter 26 again. The beam passes through the ¼ wavelength plate 27, and it is reflected by the mirror surface 8x again in the circularly polarized state. The reflected measuring beam LX1 passes through the ¼ wavelength plate 27 to be in the P-polarized state, it is transmitted through the polarizing beam splitter 26, and it comes into a beam splitter 19x having a small reflectance.

As shown in FIG. 3(a), the measuring beam LX1, which is reflected by the beam splitter 19X, comes into a stage rotation angle-detecting system 15X. The measuring beam LX1, which is transmitted through the beam splitter 19X, passes through a parallel plate glass 20X having a variable angle of inclination, and then it is transmitted through the polarizing beam splitter 17X to be returned to the main interferometer body 12X. The parallel plate glass 20X is constructed such that it is tiltable by a desired angle about perpendicular two axes by the aid of a driving unit 23X. The operation of the driving unit 23X is controlled by the wafer stage control system 43 shown in FIG. 1. The angle of inclination of the parallel plate glass 20X is controlled so that the overlap amount is maximized for the measuring beam LX1 and the reference beam LX2.

Returning to FIG. 2 again, the reference beam LX2, which is reflected by the polarizing beam splitter 17X, is reflected by a mirror (actually a reflecting prism) 21X in a direction parallel to the X axis, and then it is converted into the P-polarized beam by the aid of an unillustrated ½ wavelength plate for rotating the polarization direction by 90° to come into a double-pass unit 22X. The double-pass unit 22X is constructed in the same manner as the double-pass unit 18X shown in FIG. 3(b). The reference beam LX 2 makes two round trips between the double-pass unit 22X and the reference mirror 14X, and then it passes through the double-pass unit 22X. Although omitted in FIG. 2 for the purpose of better understanding, a beam splitter 24X having a small reflectance is actually arranged on an outgoing plane on the side of the −X direction of the double-pass unit 22 as shown in FIG. 3(a). The reference beam LX2, which is reflected by the beam splitter 24X, comes into a reference rotation angle-detecting system 16X. The reference beam LX2, which is transmitted through the beam splitter 24X, passes through an unillustrated ½ wavelength plate to be in the S polarization. The beam is reflected by a mirror 21X, and then it is reflected by the polarizing beam splitter 17X to be returned to the main interferometer body 12X.

In this arrangement, with reference to FIG. 2, for example, when the sample base 8 is rotated by an angle (yawing amount) θZ about the axis (for example, the optical axis AZ) parallel to the Z axis, the measuring beam LX1, which is firstly reflected by the mirror surface 8x, is reflected obliquely in the Y direction. However, the angle of inclination (angle of deflection) is converted into a lateral shift amount as a result of the two round trips with respect to the double-pass unit 18X.

Figure 4:
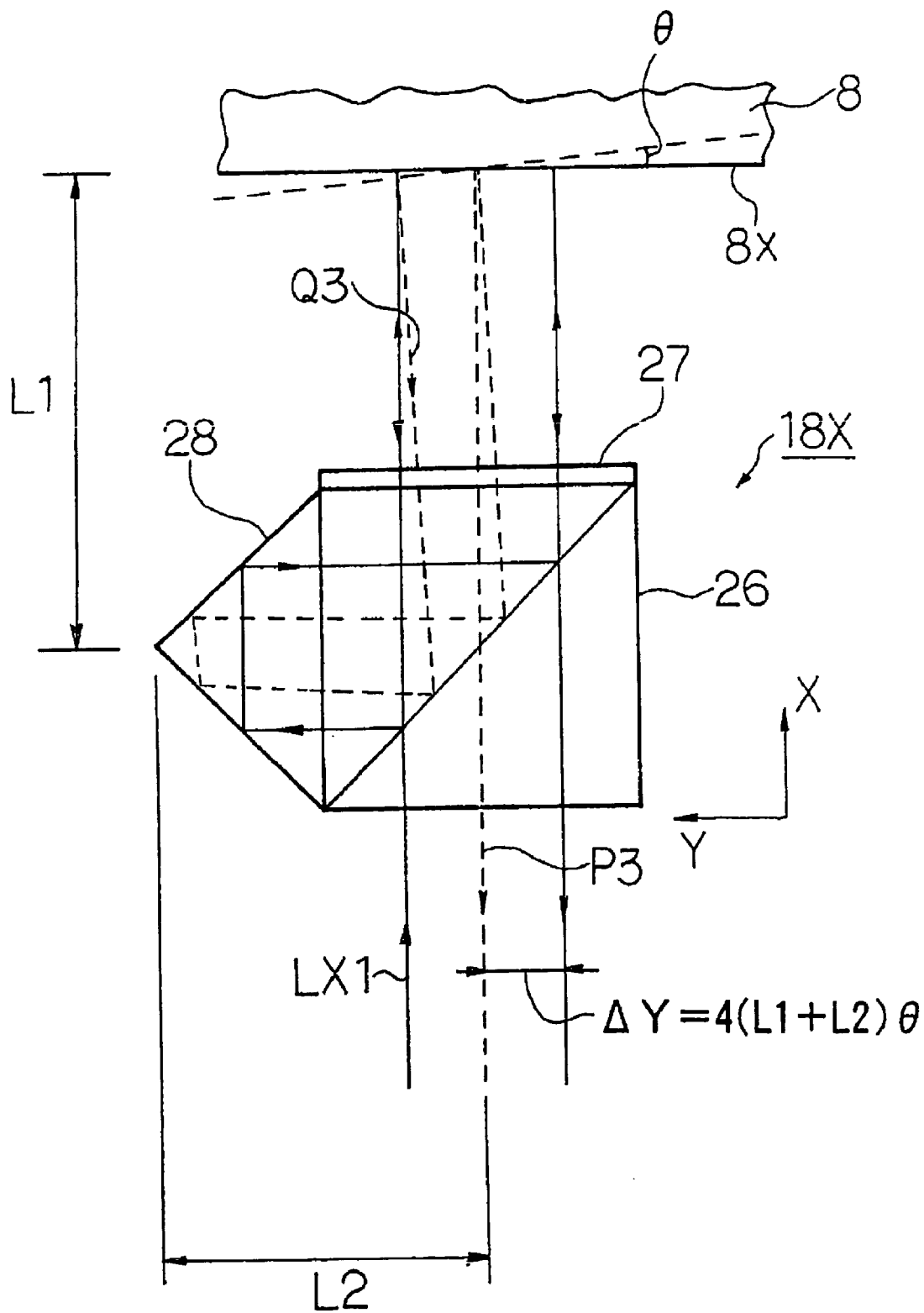
FIG. 4 illustrates the fact that the inclination of a mirror surface 8x causes the lateral shift of a measuring beam LX1 in accordance with the double-pass interference system.

FIG. 4 illustrates the fact that the angle of rotation of the mirror surface 8x generates the lateral shift of the measuring beam LX1 in the double-pass unit 18X. In FIG. 4, L1 represents the distance from the point of intersection between the optical axis of the measuring beam LX1 and the reflecting surface of the polarizing beam splitter 26 in the double-pass unit 18X to the mirror surface 8x, and L2 represents the distance from the point of intersection described above to the apex of the corner cube 28. The distance L1 is a function of the X coordinate of the sample base 8. Therefore, in the following description, the distance L1 is referred to as "L1(X)". It is assumed that the measuring beam LX1 makes two round trips along the optical path indicated by the solid line between the double-pass unit 18X and the mirror surface 8x in a state in which the mirror surface 8x is not rotated. On this assumption, when the mirror surface 8x is rotated by an angle θ (rad) about the axis parallel to the Z axis, the direction of the measuring beam LX1 reflected first time is inclined by the angle θ as shown by an optical path Q3 indicated by the broken line. However, the incoming light flux is parallel to the outgoing light flux in the corner cube 28. Accordingly, the measuring beam LX1, which is inclined as described above, is inclined by the same angle when it is reflected from the double-pass unit 18X to the mirror surface 8x. Therefore, the direction of the measuring beam LX1 reflected second time from the mirror surface 8x is parallel to the incoming direction as shown by an optical path P3 indicated by the broken line. Further, the measuring beam LX1 is subjected to the lateral shift in an amount of ΔY in the Y direction as compared with the case in which the mirror surface 8x is not rotated. The measuring beam LX1 makes two round trips between the double-pass unit 18X and the mirror surface 8x. Therefore, the lateral shift amount ΔY is approximated as follows.

$$\Delta Y = 4(L1(X) + L2)\theta \tag{1}$$

Similarly, when the mirror surface 8x is rotated by an angle θ (rolling amount in the Y direction) about the axis parallel to the Y axis, the measuring beam LX1, which is returned after the two round trips between the double-pass unit 18X and the mirror surface 8x, is subjected to the lateral shift in the Z direction in the same amount as that of the expression (1).

With reference to FIG. 2 again, when the yawing amount θZ is generated for the mirror surface 8x, and the measuring beam LX1, which is reflected by the mirror surface 8x, is inclined in the Y direction as shown by the optical path Q3, then the position of the measuring beam LX1 reflected by the beam splitter 19X after passing through the double-pass unit 18X to come into the stage rotation angle-detecting system 15X as described above is subjected to the lateral shift in the Y direction as shown by an optical path P3. Similarly, when the rolling amount θY is generated for the mirror surface 8x, and the measuring beam LX1, which is reflected by the mirror surface 8x, is inclined in the Z direction as shown by the optical path Q2, then the position of the measuring beam LX1 reflected by the beam splitter 19X after passing through the double-pass unit 18X to come into the stage rotation angle-detecting system 15X is subjected to the lateral shift in the X direction as shown by an optical path P2.

However, when the lateral shift and the inclination are generated for the laser beam itself radiated from the main interferometer body 12X, for example, due to any fluctuation of the laser light source, the position of the measuring beam LX1 coming into the stage rotation angle-detecting system 15X is also subjected to the lateral shift. Accordingly, in order to correct the lateral shift resulting from the lateral shift and the inclination of the laser beam itself, the stage rotation angle-detecting system 15X measures an angle of inclination ΔϕX1 (rad, the followings are the same) in the X direction and an angle of inclination ΔϕY1 in the Y direction with respect to the initial angle of inclination (angle of deflection) of the measuring beam LX1, in addition to the lateral shift amount ΔX1 in the X direction and the lateral shift amount ΔY1 in the Y direction with respect to the initial position of the incoming measuring beam LX1. Results of measurement are supplied to the wafer stage control system 43 shown in FIG. 1. The arrangement of the stage rotation angle-detecting system 15X will be described later on.

Further, in order to separate the lateral shift amount resulting from the change of angle or the lateral discrepancy of the laser beam itself from the apparent lateral shift amounts ΔX1, ΔY1 of the measuring beam LX1 measured by the stage rotation angle-detecting system 15X in FIG. 2, the reference rotation angle-detecting system 16X is used as shown in FIG. 3(a) to measure the two-dimensional lateral shift amounts ΔX2, ΔY2 of the reference beam LX2 and the two-dimensional angles of inclination ΔϕX2, ΔϕY2. Results of measurement are supplied to the wafer stage control system 43 shown in FIG. 1. For example, the wafer stage control system 43 determines the correct lateral shift amounts ΔX$_R$, ΔY$_R$ of the reference beam LX2 after removing the influence of the inclination of the laser beam as follows. That is, it is assumed that L$_0$ represents the distance from the outgoing point of the laser beam in the main interferometer body 12X to the detecting plane for the lateral shift amount in the reference rotation angle-detecting system 16X. On this assumption, the following expressions generally hold.

$$\Delta X_R = \Delta X2 - L_0 \cdot \Delta \phi X2 \tag{2A}$$

$$\Delta Y_R = \Delta Y2 - L_0 \cdot \Delta \phi Y2 \tag{2B}$$

Subsequently, the wafer stage control system 43 subtracts the correct lateral shift amounts ΔX$_R$, ΔY$_R$ of the reference beam LX2 and the lateral shift amount resulting from the inclination of the measuring beam LX1 from the apparent lateral shift amounts ΔX1, ΔY1 of the measuring beam LX1 to determine the lateral shift amounts ΔX$_M$, ΔY$_M$ resulting from only the angle of rotation of the mirror surface 8x. During this process, when the distance, which ranges from the outgoing point of the laser beam in the main interferometer body 12X to the detecting plane for the lateral shift amount in the stage rotation angle-detecting system 15X, is represented by a function L(X) of the X coordinate of the sample base 8, the lateral shift amounts in the X direction and in the Y direction, which result from the angles of inclination ΔϕX1, ΔϕY1 of the measuring beam LX1, are approximately L(X)·ΔϕX1 and L(X)·ΔϕY1 respectively. Therefore, the wafer stage control system 43 calculates the lateral shift amounts ΔX$_M$, ΔY$_M$ of the measuring beam LX1 resulting from only the angle of rotation of the mirror surface 8x in accordance with the following expressions respectively.

$$\Delta X_M = \Delta X1 - \Delta X_R - L(X) \cdot \Delta \phi X1 \tag{3A}$$

$$\Delta Y_M = \Delta Y1 - \Delta Y_R - L(X) \cdot \Delta \phi Y1 \tag{3B}$$

In principle, the angles of inclination ΔϕX1, ΔϕY1 of the measuring beam LX1, which are detected by the stage rotation angle-detecting system 15X, are equal to the angles of inclination ΔϕX2, ΔϕY2 of the reference beam LX2 which are detected by the reference rotation angle-detecting system 16X. Therefore, the angles of inclination ΔϕX1, ΔϕY1 in the expressions (3A) and (3B) may be substituted with the angles of inclination ΔϕX2, ΔϕY2. In this case, it is unnecessary that the stage rotation angle-detecting system 15X has the function to detect the angle of deflection of the measuring beam LX1. Alternatively, the reference rotation angle-detecting system may be provided for the both to investigate the change in perpendicularity between the mirror surfaces 8*x*, 8*y* by determining the difference in result of detection therebetween.

As shown in FIG. 4, the distance L2, which ranges from the optical axis of the measuring beam LX1 to the apex of the corner cube 28, may be previously determined and stored. The distance L1, which ranges from the point of intersection between the optical axis and reflecting surface of the polarizing beam splitter 26 to the mirror surface 8*x*, may be determined as a sum of the X coordinate of the sample base 8 measured by the main interferometer body 12X and a predetermined offset. Accordingly, the wafer stage control system 43 calculates the rolling amount θY by substituting the lateral shift amount ΔY in the expression (1) with the lateral shift amount $\Delta X_M$ in the expression (3A), and it calculates the yawing amount θZ by substituting the lateral shift amount ΔY in the expression (1) with the lateral shift amount $\Delta Y_M$ in the expression (3B).

AS shown in FIG. 2, the branching/combining optical system 13Y for the Y axis is also operated symmetrically with the branching/combining optical system 13X for the X axis. That is, the laser beam, which is radiated from the main interferometer body 12Y, is branched by the polarizing beam splitter 17Y into the measuring beam LY1 which travels in parallel to the Y axis and the reference beam LY2. The measuring beam LY1 makes two round trips between the double-pass unit 18Y and the Y axis mirror surface 8*y* of the sample base 8, and then it is returned to the main interferometer body 12Y via the beam splitter 19Y, the parallel plate glass 20Y having a variable angle of inclination, and the polarizing beam splitter 17Y. The measuring beam LY1, which is reflected by the beam splitter 19Y, comes into the stage rotation angle-detecting system 15Y for the Y axis. The lateral shift amount and the angle of inclination (angle of deflection) are detected therein. On the other hand, the reference beam LY2 is reflected by the mirror 21Y, it makes two round trips between the double-pass unit 22Y and the Y axis reference mirror 14Y, and then it is returned to the main interferometer body 12Y via the mirror 21Y and the polarizing beam splitter 17Y. Also in this case, although not shown, a beam splitter is arranged between the double-pass unit 22Y and the mirror 21Y. The reference beam LY2, which is reflected by the beam splitter, comes into the reference rotation angle-detecting system for the Y axis constructed in the same manner as the reference rotation angle-detecting system 16X shown in FIG. 3(*a*). The lateral shift amount and the angle of rotation are also detected therein.

With reference to FIG. 2, when the sample base 8 causes the pitching in the Y direction, and it is rotated by an angle (pitching amount in the scanning direction) θX about the axis parallel to the X axis, then the measuring beam LY1, which is reflected first time by the mirror surface 8*y*, is inclined in the Z direction as shown by an optical path Q5 indicated by the broken line. The position of the measuring beam LY1 coming into the stage rotation angle-detecting system 15Y after passing through the double-pass unit 18Y is subjected to the lateral shift in the Y direction as shown by an optical path P5. Also in this case, the lateral shift amount of the measuring beam LY1, from which the influence of the inclination and the lateral shift of the laser beam itself is eliminated, is represented by using the Y coordinate of the mirror surface By and the pitching amount θX in the same manner as in the expression (1). Therefore, the wafer stage control system 43 calculates the pitching amount θX from the lateral shift amount.

When the sample base 8 is rotated by an angle (yawing amount) θX about the axis parallel to the Z axis, the measuring beam LY1 also causes the lateral shift in the x direction in the stage rotation angle-detecting system 15Y for the Y axis. Therefore, the wafer stage control system 43 calculates the yawing amount θZ on the basis of the lateral shift amount in the X direction of the measuring beam LY1 detected by the stage rotation angle-detecting system 15Y for the Y axis. Usually, the yawing amount θZ, which is calculated on the basis of the lateral shift amount of the measuring beam LX1 in the stage rotation angle-detecting system 15X for the X axis, is used. However, for example, when the bending amount of the mirror surface 8*x* for the X axis is measured by moving the sample base 8 in the Y direction, the yawing amount θZ, which is calculated on the basis of the lateral shift amount of the measuring beam LY1 in the stage rotation angle-detecting system 15Y for the Y axis, is used.

It is also preferable that a laser beam from a common laser light source is used for the main interferometer body 12X for the X axis and the main interferometer body 12Y for the Y axis. In this case, the lateral shift amount and the angle of inclination are common for the laser beams themselves radiated from the two main interferometer bodies 12X, 12Y. Therefore, for example, it is unnecessary that the branching/combining optical system 13Y for the Y axis is provided with the reference rotation angle-detecting system for detecting the angle of inclination and the lateral shift amount of the reference beam LY2. Thus, the arrangement of the optical system is simplified.

As described above, in this embodiment, the two-dimensional lateral shift amount and the angle of inclination of the incoming light beam are detected by the stage rotation angle-detecting systems 15X, 15Y and the reference rotation angle-detecting system 16X. The method for conveniently detecting the lateral shift amount of the light beam includes, for example, a method based on the use of a four-divided light-receiving element having its light-receiving surface divided into four, a photoelectric detector capable of detecting the two-dimensional position of the center of gravity of the light amount distribution of an incoming light flux, or an image pickup element composed of CCD. Similarly, in order to detect the angle of inclination of the light beam, the lateral shift amount of the light beam may be measured on an optical Fourier transformation plane (pupil plane) of a lens system by using, for example, the four-divided light-receiving element, the photoelectric detector, or the image pickup element composed of CCD as described above. However, in this embodiment, in order to highly accurately detect the angle of inclination and the lateral shift amount of the light beam, the two-light flux laser interference system is used as described below. A representative arrangement of the stage rotation angle-detecting system 15X for the X axis will be explained with reference to FIG. 5.

Figure 5:
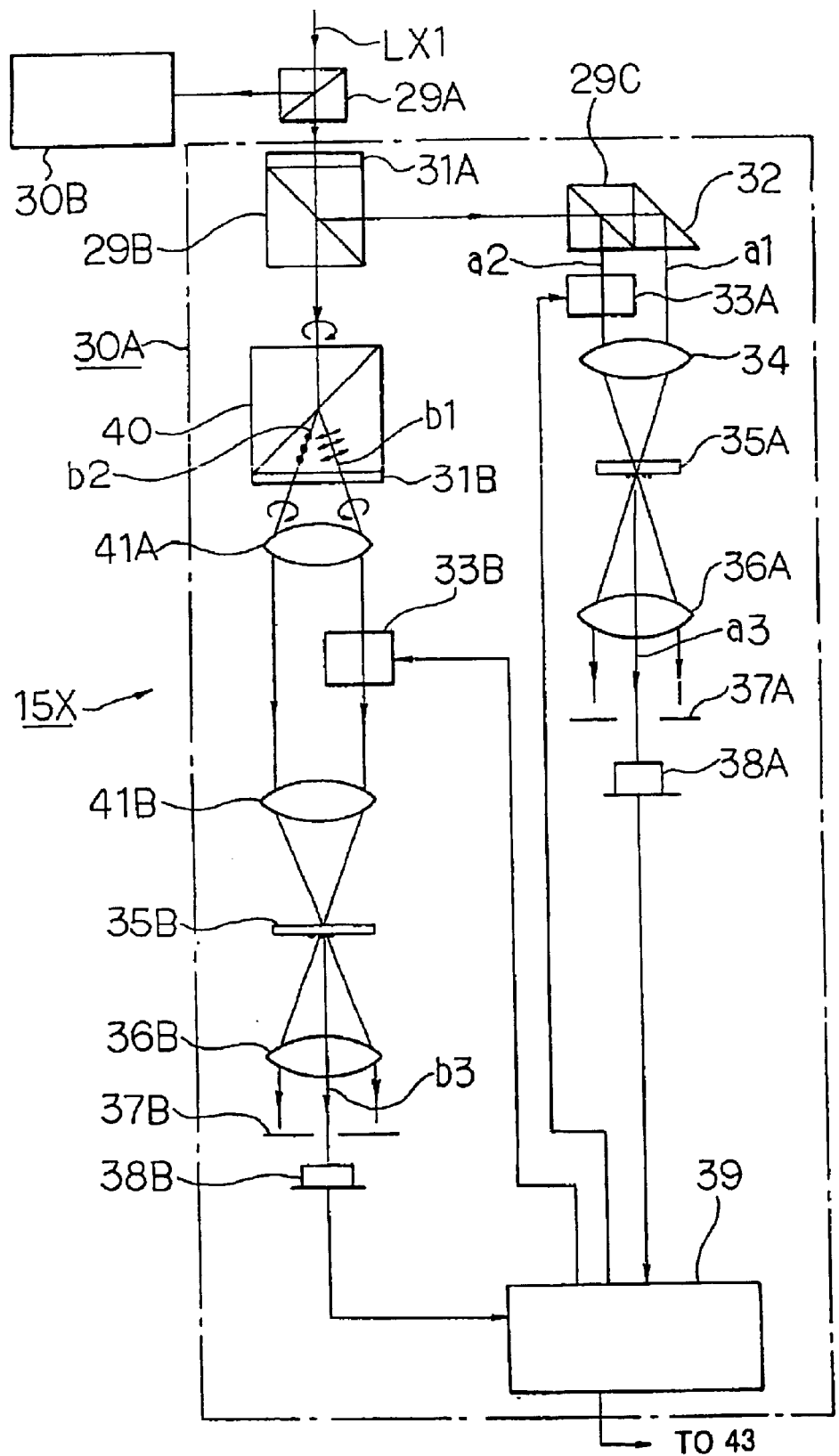
FIG. 5 shows an arrangement of a stage rotation angle-detecting system 15X shown in FIG. 2.

FIG. 5 shows the arrangement of the stage rotation angle-detecting system 15X. In FIG. 5, the incoming linearly polarized measuring beam LX1 is divided into two by a half mirror 29A. One of the light fluxes comes into a first lateral shift/angle of inclination-detecting system 30A, and the other light flux comes into a second lateral shift/angle of inclination-detecting system 30B. The latter lateral shift/angle of inclination-detecting system 30B is coincident with one obtained by rotating the former lateral shift/angle of inclination-detecting system 30A by 90°. In the lateral shift/angle of inclination-detecting system 30A, the incoming light flux is circularly polarized by a ¼ wavelength plate 31A, and it is divided into two light fluxes by a half mirror 29B.

The light flux (referred to as "measuring beam LX1" as well), which is transmitted through the half mirror 29B, is divided by a double refraction prism 40 into a P-polarized first light flux b1 and an S-polarized second light flux b2 to expand substantially symmetrically. The first light flux b1 and the second light flux b2 are returned to circularly polarized light beams by a ¼ wavelength plate 31B, and they pass through a first relay lens 41A to form light fluxes which are parallel to one another. The first light flux b1 comes into an acousto-optic modulator 33B to be frequency-modulated with a predetermined frequency F. The second light flux b2 and the frequency-modulated first light flux b1 pass through a second relay lens 41B, and they are collected at a predetermined angle of intersection onto a diffraction grating 35B having a predetermined pitch. Interference fringes moving in the pitch direction are formed on the diffraction grating 35B as a result of the frequency modulation. In this embodiment, the pitch of the diffraction grating 35B is set to be twice the pitch of the interference fringes. In order to decrease the beat frequency, the first light flux b1 and the second light flux b2 may be frequency-modulated with acousto-optic modulators having driving frequencies which are different from each other by a predetermined amount.

As a result, the +1-order diffracted light beam of the first light flux b1 brought about by the diffraction grating 35B and the −1-order diffracted light beam of the second light flux b2 outgo in parallel to one another as an interference light beam b3 from the diffraction grating 35B. The interference light beam b3 is a beat light beam with its intensity which varies at the frequency F. Other light beams including, for example, a 0-order light beam also outgo from the diffraction grating 35B. The diffracted light beams pass through a light-collecting lens 36B, and they come into a pupil filter 37B. Only the interference light beam b3, which is composed of the ±1-order diffracted light beams, passes through an aperture of the pupil filter 37B, and it is received by a photoelectric detector 38B. A beat signal having the frequency F, which is obtained by photoelectrically converting the interference light beam b3 by the photoelectric detector 38B, is supplied to a signal processing system 39. A driving circuit for the acousto-optic modulator 33B is also incorporated in the signal processing system 39. The signal processing system 39 determines, for example, a phase difference REF1 (rad) between the driving signal having the frequency F for the driving circuit and the beat signal having the frequency F supplied from the photoelectric detector 38B.

Figure 6:
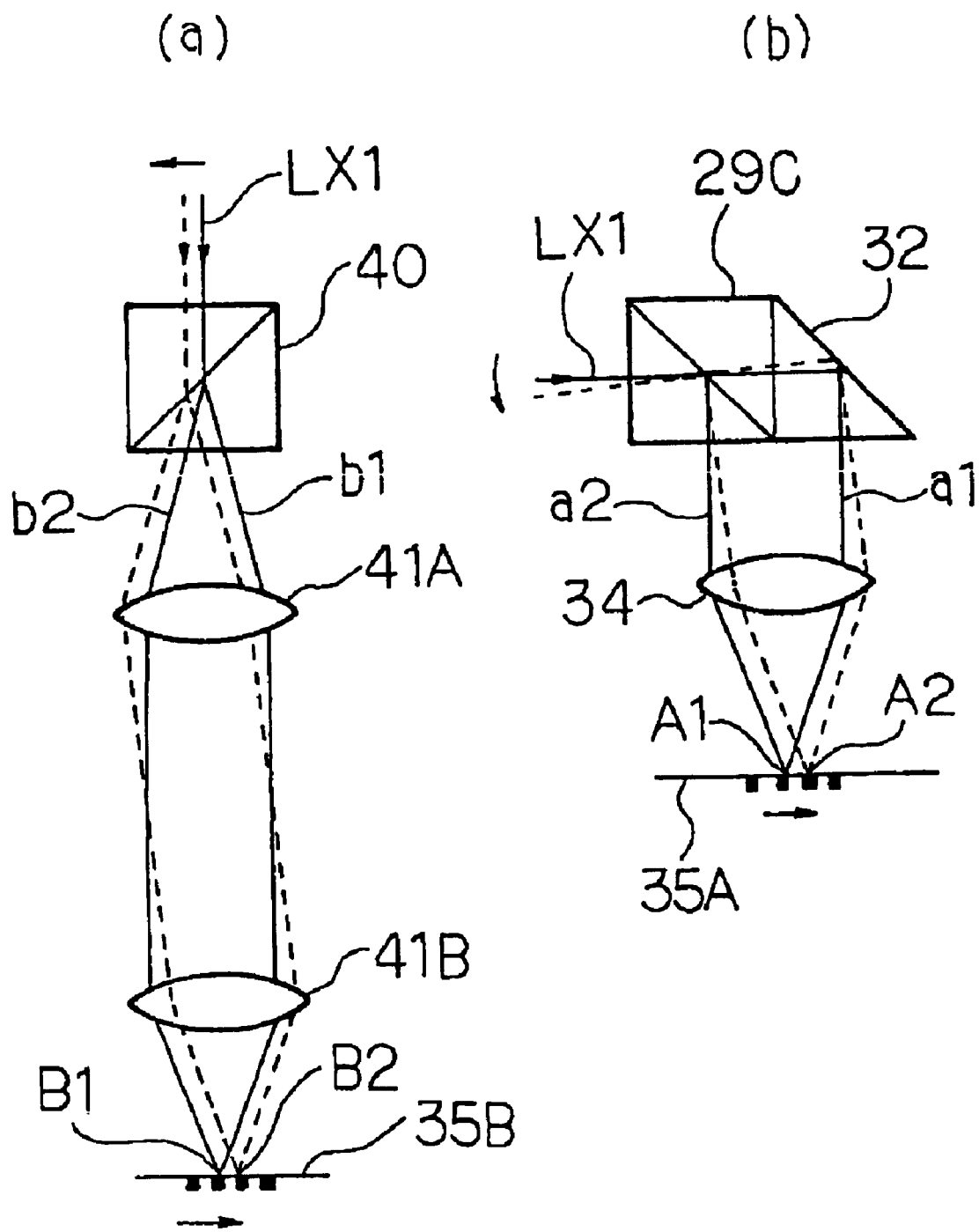
FIG. 6(a) shows a situation in which the focusing point of two light fluxes is moved on a diffraction grating 35B in accordance with the lateral shift of the measuring beam LX1 shown in FIG. 5.
FIG. 6(b) shows a situation in which the focusing point of two light fluxes is moved on a diffraction grating 35A in accordance with the inclination of the measuring beam LX1 shown in FIG. 5.

In this embodiment, the incoming position of the measuring beam LX1 in the double refraction prism 40 and the light-collecting position of the two light fluxes b1, b2 on the diffraction grating 35B are conjugate to one another in relation to the relay lenses 41A, 41B. Therefore, as shown in FIG. 6(*a*), when the incoming position of the measuring beam LX1 in the double refraction prism 40 is subjected to lateral discrepancy from a position indicated by solid lines to a position indicated by broken lines, then the light-collecting position of the two light fluxes b1, b2 on the diffraction grating 35B is subjected to lateral discrepancy from a position B1 to a position B2, and the phase difference REF1 described above is changed. On this condition, assuming that the pitch of the diffraction grating 35B is P1, the lateral shift amount of the measuring beam LX1 (represented by $\Delta X1$) can be expressed as follows with a predetermined coefficient k1. Accordingly, the signal processing system 39 supplies, to the wafer stage control system 43, the lateral shift amount $\Delta X1$ determined according to the following expression.

$$\Delta X1 = k1 \cdot P1 \cdot REF1/(2\pi) \qquad (4)$$

In FIG. 5, the light flux (referred to as "measuring beam LX1" as well), which is reflected by the half mirror 29B, is divided by a half mirror 29C and a mirror 32 into a first light flux a1 and a second light flux a2 which travel in parallel to one another with a predetermined spacing distance. The first light flux a1 comes into an fθ lens 34. The second light flux a2 is subjected to frequency modulation with a frequency F by an acousto-optic modulator 33A, and then it comes into the fθ lens 34. The two light fluxes a1, a2, which have passed through the fθ lens 34, are collected at a predetermined angle of intersection onto a diffraction grating 35A having a predetermined pitch. Interference fringes moving in the pitch direction are formed on the diffraction grating 35A by the frequency modulation. The pitch of the diffraction grating 35A is set to be twice the pitch of the interference fringes.

As a result, the +1-order diffracted light beam of the first light flux a1 brought about by the diffraction grating 35A and the −1-order diffracted light beam of the second light flux a2 outgo in parallel to one another as an interference light beam a3 from the diffraction grating 35A. The interference light beam a3 is a beat light beam with its intensity which varies at the frequency F. Various diffracted light beams outgoing from the diffraction grating 35A pass through a light-collecting lens 36A, and they come into a pupil filter 37A. Only the interference light beam a3, which is composed of the ±1-order diffracted light beams, passes through an aperture of the pupil filter 37A, and it is received by a photoelectric detector 38A. A beat signal having the frequency F, which is obtained by photoelectrically converting the interference light beam a3 by the photoelectric detector 38A, is supplied to the signal processing system 39. A driving circuit for the acousto-optic modulator 33A is also incorporated in the signal processing system 39. The signal processing system 39 determines, for example, a phase difference REF2 (rad) between the driving signal having the frequency F for the driving circuit and the beat signal having the frequency F supplied from the photoelectric detector 38A.

In this embodiment, the arrangement plane of the diffraction grating 35A is approximately an optical Fourier transformation plane (pupil plane) by the aid of the fθ lens 34 with respect to the dividing plane of the half mirror 29C as the incoming position of the measuring beam LX1. The angle of inclination of the measuring beam LX1 coming into the half mirror 29C is converted into the lateral shift amount in the diffraction grating 35A. Therefore, as shown in FIG. 6(*b*), when the angle of inclination of the measuring beam LX1 with respect to the half mirror 29C is subjected to the change from an optical path indicated by solid lines to an optical path indicated by broken lines, then the light-collecting position of the two light fluxes a1, a2 on the diffraction grating 35A is subjected to the lateral discrepancy from a position A1 to a position A2, and the phase difference REF2 described above is changed. Assuming that the pitch of the diffraction grating 35A is P2, the angle of inclination of the measuring beam LX1 (represented by $\Delta\phi X1$) can be expressed as follows with a predetermined coefficient k2. Accordingly, the signal processing system 39 supplies, to the wafer stage control system 43, the angle of inclination $\Delta\phi X1$ determined according to the following expression.

$$\Delta\phi X1 = k2 \cdot P2 \cdot REF2/(2\pi) \quad (5)$$

The other light flux, which is divided by the half mirror 29A in the stage rotation angle-detecting system 15X, comes into the second lateral shift/angle of inclination-detecting system 30B to detect therein a lateral shift amount $\Delta Y1$ and an angle of inclination $\Delta\phi Y1$ of the measuring beam LX1 in a direction perpendicular to the lateral shift amount and the angle of inclination detected by the lateral shift/angle of inclination-detecting system 30A. Results of detection are supplied to the wafer stage control system 43. Similarly, the lateral shift amount and the angle of inclination (angle of deflection) of the incoming measuring beam or the reference beam are also detected respectively in accordance with the two-light flux interference system in the stage rotation angle-detecting system 15Y for the Y axis shown in FIG. 2 and the reference rotation angle-detecting system 16X shown in FIG. 3(a).

In this embodiment, as described above, the yawing amount $\theta Z$ of the sample base 8, the pitching amount $\theta X$, and the rolling amount $\theta Y$ are always measured by utilizing the measuring beams LX1, LX2 for measuring the displacement, radiated from the main interferometer bodies 12X, 12Y shown in FIG. 2 to the sample base 8. In this arrangement, the wafer stage control system 43 rotates the sample base 8 by the aid of the XY$\theta$ stage 10 of the wafer stage shown in FIG. 1 so as to offset the yawing amount OZ during the scanning exposure. Accordingly, it is possible to obtain a high overlay accuracy between the reticle R and the wafer W.

When the pitching amount $\theta X$ and the rolling amount $\theta Y$ of the sample base 8 are generated, Abbe errors occur in an amount of $\delta Z \cdot \theta Y$ in the X direction and in an amount of $\delta Z \cdot \theta X$ in the Y direction, assuming that $\delta z$ represents the spacing distance in the Z direction between the surface of the wafer W and the measuring beams LX1, LX2 in FIG. 2. Accordingly, the wafer stage control system 43 corrects the position of the wafer W in the X direction and in the Y direction by the aid of the XY$\theta$ stage 10 so as to offset the Abbe errors. Accordingly, the wafer W is positioned highly accurately. In this arrangement, as shown in FIG. 2, for example, the angle of inclination of the sample base 8 is measured by utilizing the one-axis measuring beams LX1, LX2 in this embodiment. Therefore, the entire width of the mirror surface 8x of the sample base 8 in the Y direction and the entire width of the mirror surface 8y in the X direction are approximately the movement strokes.

This embodiment is based on the double-pass system. Therefore, the measuring beams LX1, LX2 make the two round trips with respect to the corresponding mirror surfaces respectively. However, in this process, the spacing distance between the optical paths of the measuring beams to make the round trips is considerably narrow as compared with the spacing distance for the two-axis single-pass laser beam as in the illustrative conventional technique. The expansion of the measuring beams LX1, LX2 is of a negligible degree. Therefore, on condition that it is enough to obtain the movement stroke equivalent to that of the illustrative conventional technique, it is possible to use compact sizes of movement mirrors, i.e., of the mirror surfaces 8x, 8y of the sample base 8 in this embodiment, and consequently it is possible to realize a small size and a light weight of the sample base 8. Therefore, it is possible to enhance the control performance such as the movement velocity of the sample base 8. Further, it is possible to decrease the installation area (foot print) of the projection exposure apparatus.

For example, the following arrangement has been hitherto used when the width of the movement mirror in the Z direction is narrow, and there is no extra space for measuring the pitching amount and the rolling amount of the sample base by radiating the two-axis measuring beam in the Z direction. That is, an angle of inclination-measuring mechanism (for example, a digital micrometer) is provided in a stage corresponding to the Z tilt stage shown in FIG. 1 to indirectly measure the angle of inclination of the sample base. The position of the wafer W is corrected on the basis of the measured angle of inclination. In this system, the mechanism of the stage is complicated, and the processing of the measurement result of the angle of inclination is complicated. on the contrary, in this embodiment, the angle of inclination of the sample base 8 is directly measured. Therefore, the stage mechanism is simplified, and it is further possible to control the position of the wafer W highly accurately. Even when the thickness of the mirror surface 8x, 8y as the movement mirror is thin, it is possible to measure the pitching amount and the rolling amount highly accurately.

Further, the Z tilt stage 9 is driven on the basis of the information on the focus position of the wafer W detected by the AF sensors 44A, 44B, 44C shown in FIG. 1 concurrently with the exposure operation. Accordingly, the surface of the wafer W is focused on the image plane of the projection optical system PL in accordance with the autofocus system and the autoleveling system. In this process, the operation of the Z tilt stage 9 can be principally performed on the basis of only the results of measurement of the AF sensors 44A, 44B, 44C. Therefore, the focusing operation can be performed at a higher follow-up velocity at a higher degree of accuracy.

Next, explanation will be made for the basic focusing operation based on the use of, for example, the AF sensor 44A and the AF sensor 44C shown in FIG. 1, and an exemplary arrangement of the AF sensors.

Figure 8:
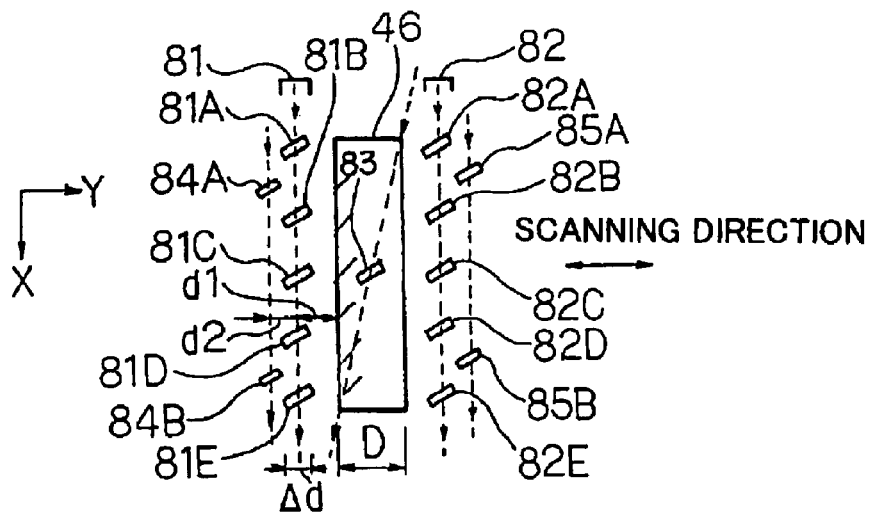
FIG. 8 shows a plan view illustrating an arrangement of an exposure area and focus position-detecting points in the embodiment.

FIG. 8 shows an example of the distribution of focus position-detecting points, for example, for the AF sensors 44A, 44C. In FIG. 8, pre-reading areas 81, 82 having a width $\Delta d$ for the AF sensor are set with a spacing distance d1 on both sides in the scanning direction (Y direction) with respect to the slit-shaped exposure area 46 having a width D defined by the projection optical system PL. Five detecting points 81A to 81E, 82A to 82E, each of which is used to detect the focus position highly accurately although the detection range is not so wide, are set in the pre-reading areas 81, 82 respectively. In this embodiment, interference fringes having a predetermined pitch are projected obliquely with respect to the surface of the wafer in the pre-reading areas 81, 82 respectively. Centers of partial areas, which are obtained by dividing the respective interference fringes into five, are regarded as the detecting points 81A to 81E, 82A to 82E.

Rough pre-reading areas, which are used to roughly detect the focus position with a wide detection range, are set with a spacing distance d2 in front of the pre-reading areas 81, 82 in the scanning direction. Two detecting points 84A, 84B are set in the rough pre-reading area in the −Y direction. Two detecting points 85A, 85B are set in the rough pre-reading area in the +Y direction. The focus position is detected by the AF sensor 44A shown in FIG. 1 at the rough detecting points 84A, 84B and the highly accurate detecting points 81A to 81E in the pre-reading areas on the side in the −Y direction with respect to the exposure area 46. The focus position is detected by the AF sensor 44C arranged symmetrically to the AF sensor 44A shown in FIG. 1 at the rough detecting points 85A, 85B and the highly accurate detecting points 82A to 82E in the pre-reading areas on the side in the +Y direction with respect to the exposure area 46.

On detecting point 83 is set at the center of the exposure area 46 shown in FIG. B. The focus position is also detected highly accurately at the detecting point 83 with a detection range which is not so wide. The focus position at the detecting point 83 is detected by the AF sensor 44B disposed at the center as shown in FIG. 1. The system of the AF sensor 44B may be a system in which interference fringes are projected as described later on. Alternatively, the system of the AF sensor 44B may be a system in which a slit image is projected onto the detecting point, and the lateral shift amount of the refocused image is detected as in the conventional technique.

The information on the focus positions detected at the respective detecting points is supplied to the focusing control system 45 shown in FIG. 1 respectively. Each of the focus positions detected as described above is subjected to calibration so that zero is obtained at the image plane of the projection optical system PL (best focus position). For example, the calibration can be executed such that the Z tilt stage 9 is driven to perform test printing by changing the focus position of an evaluating wafer by a predetermined amount in order to determine the focus position when a predetermined pattern is obtained after development.

When the shot area as the exposure objective on the wafer W is subjected to the scanning in the +Y direction with respect to the exposure area 46 shown in FIG. 8 during the scanning exposure, the focusing control system 45 drives the Z tilt stage 9 so that the focus position, which is detected by the AF sensor 44A at the rough detecting points 84A, 84B is zero (image plane), for example, in the run-up interval from the start of the scanning until the achievement of synchronization between the reticle R and the wafer W. After that, the focus position of the surface of the wafer W is reliably included in the detection range at the highly accurate detecting points 81A to 81E. Therefore, the focusing control system 45 continuously detects the focus position at the detecting points 81A to 81E by the aid of the AF sensor 44A to continuously control the focus position and the angle of inclination of the Z tilt stage 9 so that the focus position is zero when the points on the wafer W detected as described above successively arrive at the exposure area 46.

The focus position, which is detected at the detecting point 83 disposed at the center of the exposure area 46 by the AF sensor 44B, represents the actual defocus amount at the center of the exposure area 46. Therefore, the final driving amount of the Z tilt stage 9 in the Z direction is set so that the focus position detected at the detecting point 83 is zero (image plane). This means the fact that the focus position at the detecting point 83 in the exposure area 46 is used for the follow-up control. During the period in which the reticle R and the wafer W are moved in synchronization with each other, the pre-reading control and the focusing based on the follow-up control are continuously performed in accordance with the autofocus system and the autoleveling system.

When the pitching amount θX of the sample base 8 is detected by the main interferometer body 12Y during the scanning exposure, the focus position of the wafer W is changed only by the movement of the XYθ stage 10, because the running surface of the XYθ stage 10 is inclined in the scanning direction.

Figure 11:
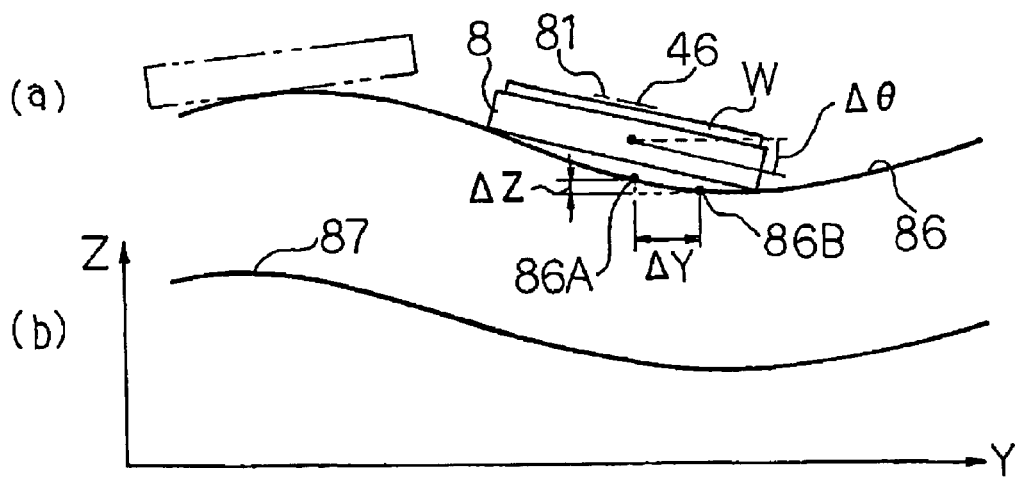
FIGS. 11(a) and (b) show a situation in which the pitching amount θX is varied depending on the variation of the angle of inclination of a running surface of a wafer stage.

FIG. 11(b) shows a situation in which the angle of inclination of the running surface 87 of the XYθ stage 10 is changed. Correspondingly thereto, as shown in FIG. 11(a), the sample base 8 is moved along the running surface 86 which is parallel to the running surface 87. In this case, when the sample base 8 is moved in a distance ΔY in the Y direction with the pitching amount θX, the focus position of the wafer W on the sample base 8 is changed approximately by ΔZ represented by the following expression.

$$\Delta Z = \theta X \cdot \Delta Y \tag{6}$$

In this state, when the detecting points 81A to 81E in the pre-reading area 81 shown in FIG. 8 arrive at the center of the exposure area 46, the focus position is changed approximately in an amount of θX·(d1+D/2). Accordingly, the pitching amount θX, which is detected by the main interferometer body 12Y, is also supplied to the focusing control system 45 shown in FIG. 1 via the wafer stage control system 43 and the main control system 9. The focusing control system 45 drives the Z tilt stage 9 so that the pitching amount is zero, the pitching amount being previously obtained by subtracting the amount of variation of the focus position θX·(d1+D/2) corresponding to the pitching amount θX from the focus position detected in the pre-reading area 81. Accordingly, it is possible to perform the focusing operation at a high follow-up velocity even when the running surface of the XYθ stage 10 is inclined in the scanning direction.

On the other hand, when the shot area as the exposure objective on the wafer W is subjected to the scanning in the −Y direction with respect to the exposure area 46 shown in FIG. 8 during the scanning exposure, the focusing control system 45 firstly drives the Z tilt stage 9 so that the focus position detected at the rough detecting points 85A, 85B on the side in the +Y direction is zero (image plane) with respect to the exposure area 46. After that, the focusing operation is continuously performed with respect to the exposure area 46 while combining the pre-reading control and the follow-up control on the basis of the focus position detected at the highly accurate detecting points 82A to 82E in the pre-reading area 82 on the side in the +Y direction, the pitching amount θX detected by the main interferometer body 12Y, and the focus position detected at the detecting point 83 disposed at the center of the exposure area 46.

As described above, in this embodiment, the focus position is detected at the plurality of detecting points in the pre-reading areas 81, 82 separated from the exposure area 46 in the scanning direction. Therefore, even when the operating distance of the projection optical system PL is, for example, about not more than several mm which is short, it is possible to avoid the shading of the light flux for detecting the focus position by the projection optical system PL. The detecting point 83 for the follow-up control is also set at the center of the exposure area 46. It is enough to measure the focus position at only one point at the center. Therefore, no trouble occurs even when the operating distance of the projection optical system PL is short.

Next, explanation will be made for an exemplary arrangement of the AF sensor 44A for detecting the focus position at the highly accurate detecting points in the pre-reading area 81 and at the rough detecting points 84A, 84B disposed in front thereof.

Figure 7:
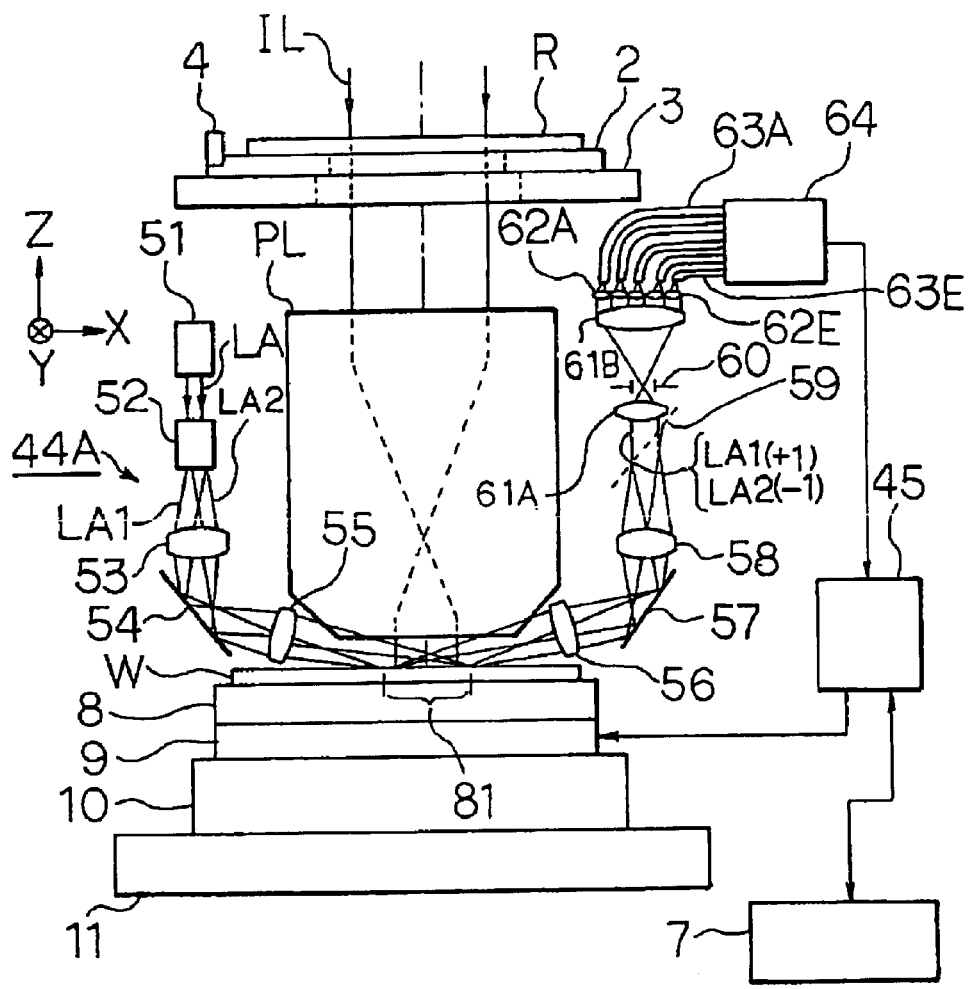
FIG. 7 shows a side view illustrating an arrangement of a highly accurate sensor unit of an AF sensor 44A in the embodiment of the present invention.

FIG. 7 shows a highly accurate sensor unit of the AF sensor 44A for highly accurately detecting the focus position with a relatively narrow detection range in the pre-reading area 81. In FIG. 7, a coherent detecting light beam LA, which is obtained, for example, by mixing laser beams having a plurality of wavelengths different from each other, is radiated from an illumination light source 51. The wavelength region of the detecting light beam LA is a wavelength region with weak sensitivity with respect to the photoresist on the wafer W. Those usable as the detecting light beam LA include, for example, a semiconductor laser, a He—Ne laser, and a He—Cd laser. When the detecting light beam having the multiple wavelengths of two or more wavelengths is used as described above, it is possible to reduce the harmful influence due to the thin film interference, even when the surface to be detected is coated with the thin film such as the photoresist. The detecting light beam LA comes into a heterodyne beam-generating optical system 52.

The heterodyne beam-generating optical system 52 includes a plurality of acousto-optic modulators. The acousto-optic modulators are driven by driving signals supplied from an unillustrated driving system. Accordingly, two coherent light fluxes LA1, LA2 are generated, as mutually having a predetermined difference in frequency Δf (Δf is, for example, several 10 kHz), from the incoming detecting light beam. Further, the driving system generates a reference beat signal having a frequency Δf, for example, by mixing the driving signals for the two acousto-optic modulators. The reference beat signal is supplied to the focusing control system 45. The two light fluxes LA1, LA2, which are generated as described above, are radiated from the heterodyne beam-generating optical system 52 at a predetermined angle of intersection, and then they are once subjected to optical Fourier transformation by the aid of a light-collecting system 53. The light fluxes are reflected by a mirror 54, and then they pass through a light-feeding objective system 55. The light fluxes make intersection in the pre-reading area 81 on the surface of the wafer W as the surface to be detected. Thus, moving interference fringes are formed in the pre-reading area 81. The angle of incidence Θ of the optical axes of the two light fluxes LA1, LA2 with respect to the surface to be detected is a large angle which is approximately close to 90°. The pitch direction of the interference fringes formed in the pre-reading area 81 is set, for example, to be a direction to make intersection at approximately 45° with respect to the X axis and the Y axis in order to reduce the influence of the already formed circuit pattern.

In this embodiment, the focus position is independently detected in the five measuring areas arranged in one array in the X direction in the pre-reading area 81 respectively. The centers of the five measuring areas are the detecting points 81A to 81E shown in FIG. 8.

Figure 9:
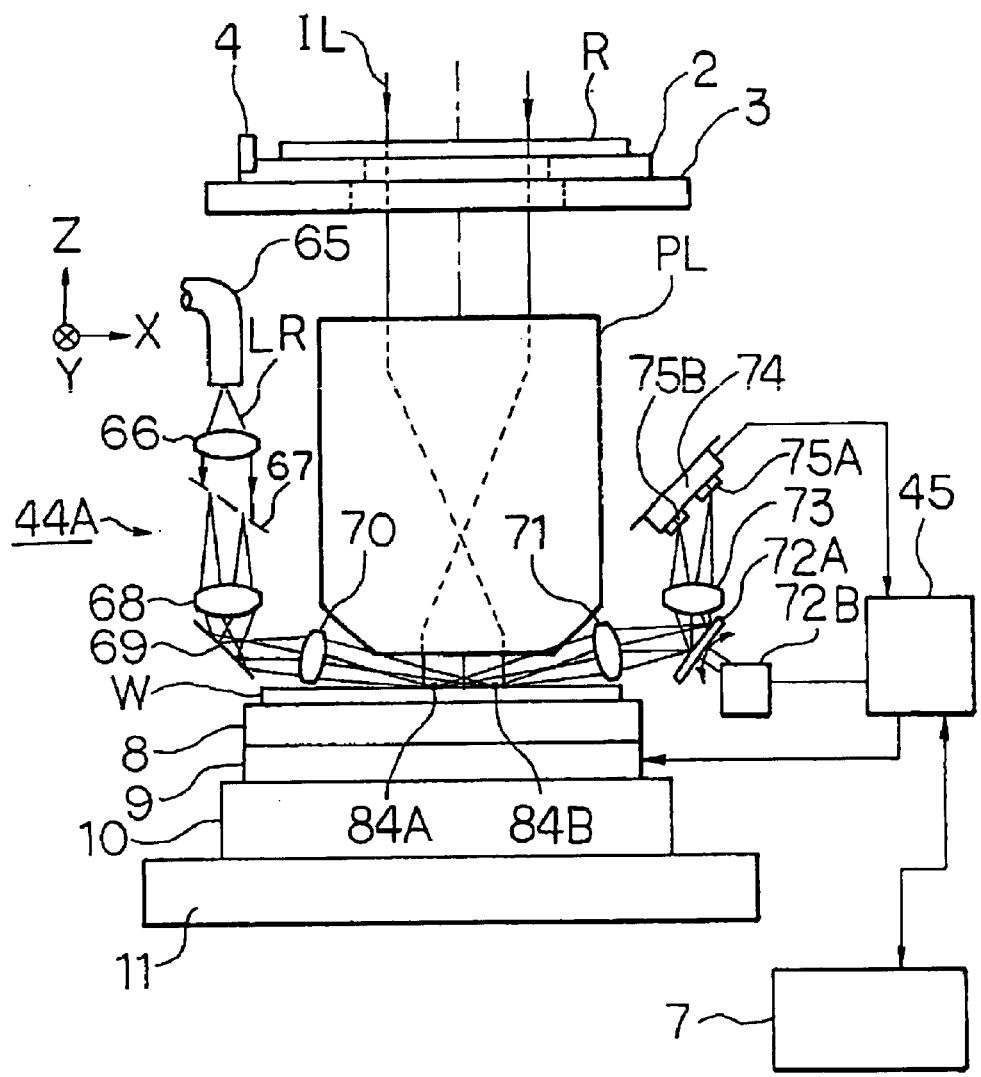
FIG. 9(a) shows a side view illustrating an arrangement of a sensor unit having a wide detection range of the AF sensor 44A in the embodiment.
FIG. 9(b) shows a slit image and the like in FIG. 9(a).
Figure 9:
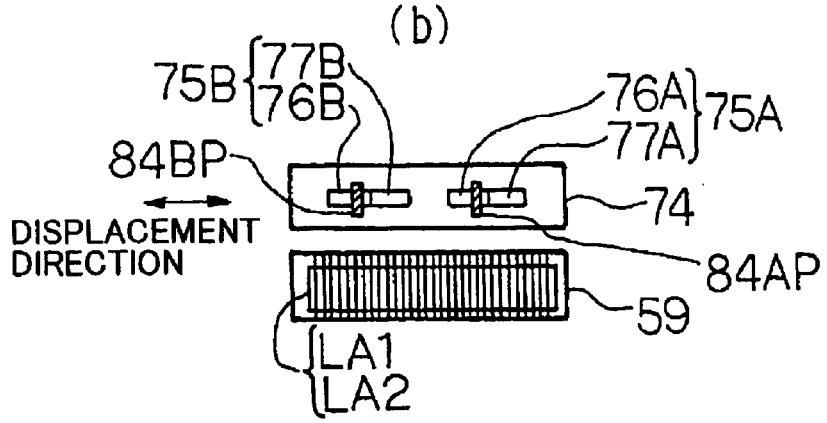

The two light fluxes LA1, LA2, which are reflected by the surface of the wafer W as the surface to be detected, pass through the detecting objective system 56, and they are reflected by an optical path-bending mirror 57. After that, the light fluxes pass through an image-forming system 58, and they come into a diffraction grating 59 for synthesizing the received light beam (see FIG. 9(b)). In a state in which the surface of the wafer W is focused on the image plane of the projection optical system PL, the surface and the diffraction grating 59 are in the conjugated relationship (boosting image formation relationship) in relation to the detecting objective system 56 and the image-forming system 58. The +1-order diffracted light beam LA1 (+1) of the light flux LA1 and the −1-order diffracted light beam LA2 (−1) of the light flux LA2, which are formed by the diffraction grating 59, are synthesized in parallel, so as to pass through a light-collecting lens 61A and pass through a spatial filter 60 so that a parallel light flux is formed by the aid of a lens 61B. One aperture is formed on the optical axis of the spatial filter 60. The ±1-order diffracted light beams LA1 (+1), LA2 (−1) pass through the aperture. Diffracted light beams (including the 0-order diffracted light beam) other than the above are shut off.

As shown in FIG. 7, the heterodyne interference light beam, which is composed of the diffracted light beams LA1 (+1), LA2 (−1) outgoing from the lens 61B, come into light-collecting lenses 62A to 62E. The light-collecting lenses 62A to 62E are arranged corresponding to the five measuring areas disposed about the centers of the detecting points 81A to 81E (see FIG. 8) in the pre-reading area 81 on the wafer W respectively. The interference light beams, which are included in the interference light beam composed of the diffracted light beams LA1 (+1), LA2 (−1) and which are collected by the light-collecting lenses 62A to 62E, come into photoelectric detectors in a light-received signal-generating unit 64 via optical fibers 63A to 63E respectively. Detection beat signals having a frequency Δf respectively are outputted from the photoelectric detectors, and they are also supplied to the focusing control system 54.

The focusing control system 45 detects phase differences ϕA to ϕE of the five detection beat signals corresponding to the interference light beams obtained via the optical fibers 63A to 63E respectively on the basis of a reference beat signal outputted from an unillustrated driving system for the heterodyne beam-generating optical system 52. In this process, in a state in which the pre-reading area 81 shown in FIG. 8 is substantially coincident with the image plane of the projection optical system PL beforehand (for example, in a state in which the surface of the wafer is conformed to the image plane in the exposure area 46 when the XYθ stage 10 is located at a predetermined reference position, and then the XYθ stage 10 is driven to move the surface of the wafer W to the pre-reading area 81), values (reference values) ϕA1 to ϕE1 of the phase differences ϕA to ϕE of the detection beat signals are determined, and they are stored in a storage unit in the focusing control system 45. During the scanning exposure, the focusing control system 45 determines deviations ΔϕA to ΔϕE from the reference values ϕA1 to ϕE1 of the phase differences ϕA to ϕE of the detection beat signals. It is assumed that the deviations ΔϕA to ΔϕE are representatively expressed by Δϕ, P1 represents the pitch of the interference fringes projected onto the pre-reading area 81, and Θ represents the angle of incidence of the optical axes of the two light fluxes LA1, LA2 shown in FIG. 7 with respect to the surface of the wafer W. On this assumption, the focusing control system 45 calculates the focus position $Z_{P1}$ at the concerning detecting point in accordance with the following expression.

$$Z_{P1} = \{1/(2 \cdot \sin \Theta)\} \cdot P \cdot \Delta\phi/(2\pi) \tag{7}$$

In this case, the detection range ZR1 is $\{1/(2 \cdot \sin \Theta)\} \cdot P$. For example, if the pitch P1 is 20 μm, the detection range ZR1 is approximately 10 μm. The resolution of the focus position $Z_{P1}$ is approximately 0.01 μm by performing the detection with a resolution of about $10^{-1}$ for $\{\Delta\phi/(2\pi)\}$. Therefore, the focus positions at the respective detecting points 81A to 81E can be detected extremely highly accurately within the detection range ZR1.

In this embodiment, for example, the sensor unit having a wide detection range is provided for the AF sensor 44A in order to allow the focus position of each of the detecting points 81A to 81E to be previously included within the detection range ZR1, even in the area such as the periphery of the wafer W in which the focus position of the wafer W is varied relatively greatly.

FIG. 9(a) shows the sensor unit having the wide detection range in the AF sensor 44A. In FIG. 9(a), an illumination light beam LR, which is in a wavelength region insensitive to the photoresist on the wafer W unlike the exposure light beam IL, is introduced from an unillustrated illumination light source via an optical fiber bundle 65. The illumination light beam LR, which is radiated from the optical fiber bundle 65, passes through a light-collecting lens 66, and it illuminates a pattern formation plate 67 having two slit-shaped apertures. The illumination light beam LR, which is transmitted through the apertures of the pattern formation plate 67, passes through a lens 68, a mirror 69, and an illumination objective lens 70, and it is projected onto the surface of the wafer W obliquely with respect to the optical axis of the projection optical system PL. Slit images, which are images of the apertures of the pattern formation plate 67, are formed and projected on the detecting points 84A, 84B on the surface of the wafer W.

The illumination light beams LR, which are reflected at the detecting points 84A, 84B on the wafer W, pass through a collecting objective lens 71, an tiltable plate 72A which is tiltable in the rotation direction, and an image-forming lens 73, and they form slit images again on photoelectric sensors 75A, 75B on a light-receiving system 74 respectively. As shown in FIG. 9(b), the slit images 84AP, 84BP are formed on the light-receiving system 74 by the reflected light beams from the detecting points 84A, 84B respectively. When the focus position of the wafer W is changed in FIG. 9(a), the positions of image formation of the slit images 84AP, 84BP are changed in the lateral direction in FIG. 9(b). The photoelectric sensor 75A, which receives the first slit image 84AP, is divided into two photoelectric detectors 76A, 77A such as photodiodes in the displacement direction of the slit image. The photoelectric sensor 75B, which receives the second slit image 84BP, is also divided into two photoelectric detectors 76B, 77B in the displacement direction of the slit image.

The difference $\Delta SA$ between the photoelectric conversion signals of the photoelectric detectors 76A, 77A is determined in the focusing control system 45. Similarly, the difference $\Delta SB$ between the photoelectric conversion signals of the photoelectric detectors 76B, 77B is also determined. Further, in a state in which the detecting points 84A, 84B are substantially coincident with the image plane of the projection optical system PL beforehand, the angle of inclination of the tiltable plate 72A is set by the aid of the focusing control system 45 and the driving unit 72B so that the differences $\Delta SA$, $\Delta SB$ are zero respectively. As a result, the focusing control system 45 can distinguish, from the difference $\Delta SA$, whether the slit image 84AP is disposed on either the photoelectric detector 76A or 77A, i.e., whether the focus position of the detecting point 84A is deviated upwardly or downwardly with respect to the image plane, and it can distinguish, from the difference $\Delta SB$, whether the focus position of the detecting point 84B is deviated upwardly or downwardly with respect to the image plane. In this process, the detection range of the focus position (range in which it is possible to distinguish whether the focus position is deviated upwardly or downwardly) is, for example, about ±1 mm.

In a range in which the slit images 84AP, 84BP are overlapped with a boundary between the photoelectric detectors 76A, 77A and a boundary between the photoelectric detectors 76B, 77B respectively, the differences $\Delta SA$, $\Delta SB$ are varied substantially linearly with "0" (image plane) as the center, depending on the focus positions of the detecting points 84A, 84B respectively. The range of the focus position, in which the differences $\Delta SA$, $\Delta SB$ are linearly varied, is, for example, several 10 $\mu$m. As a result, the focusing control system 45 drives the Z tilt stage 9 so that the differences $\Delta SA$, $\Delta SB$ are zero respectively. Thus, the focus position in the vicinity of the detecting points 84A, 84B on the surface of the wafer W can be reliably included in the detection range of the highly accurate sensor unit shown in FIG. 7 in the AF sensor 44.

Figure 10:
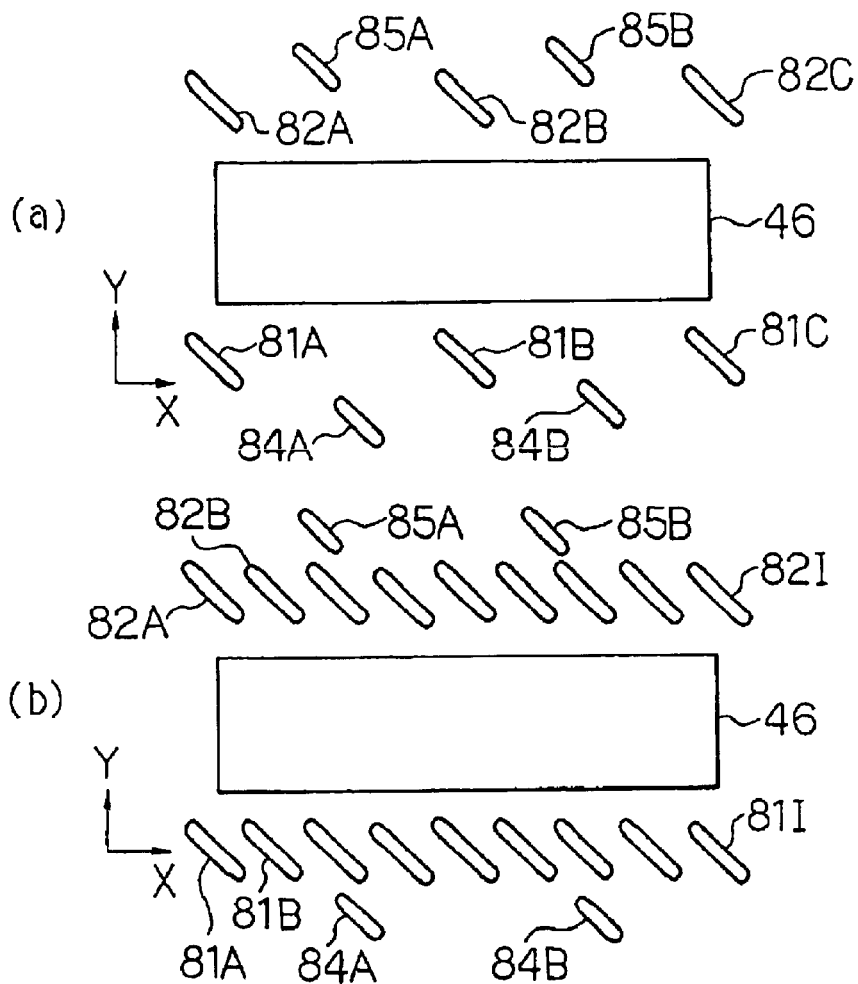
FIG. 10(a) shows a plan view illustrating another example of the arrangement of focus position-detecting points.
FIG. 10(b) shows a plan view illustrating still another example of the arrangement of focus position-detecting points.

In this embodiment, the highly accurate detecting points and the rough detecting points for the focus position in the pre-reading area are set as shown in FIG. 8. Other than the above, it is also preferable that the detecting points are set as shown in FIG. 10. That is, in FIG. 10(a), three highly accurate detecting points 81A to 81C, 82A to 82C are set in front of the exposure area 46 in the scanning direction (±Y direction) respectively. Rough detecting points 84A, 84B, 85A, 85B for the wide detection range are further set in front of the highly accurate detecting points in the scanning direction respectively. In FIG. 10(b), nine highly accurate detecting points 81A to 81I, 82A to 82I are set in front of the exposure area 46 in the scanning direction (±Y direction) respectively. Rough detecting points 84A, 84B, 85A, 85B for the wide detection range are further set in front of the highly accurate detecting points in the scanning direction respectively. One rough detecting point for the wide detection range may be provided for each scanning direction. However, as in this embodiment, when the two detecting points 84A, 84B, 85A, 85B are provided, it is possible to roughly set not only the focus position but also the angle of inclination.

A multi-point AF sensor based on the oblique incidence system, in which slit images are projected obliquely onto a plurality of detecting points respectively, and positions of the respective slit images formed again by the reflected light beam are detected in accordance with the photoelectric microscope system, may be used as the highly accurate sensor unit shown in FIG. 7, as having been hitherto used. A mechanical sensor based on the non-contact system including, for example, a pneumatic micrometer and an electrostatic capacity type gap sensor may be used as the sensor unit having the wide detection range shown in FIG. 9.

Next, another feature will be explained. In the embodiment described above, the correction amount of the focus position is adjusted depending on the angle of inclination of the running surface of the XY$\theta$ stage 10 shown in FIG. 1. However, the distribution of the angle of inclination of the running surface is the function of the coordinates (X, Y) of the XY$\theta\theta$ stage 10 (sample base 8), and the distribution resides in reproducible information after it is once measured. Accordingly, an example will be explained below with reference to FIGS. 12 and 13 for a method for substantially measuring the distribution of the angle of inclination of the running surface beforehand.

For this purpose, in a state in which the wafer W as the exposure objective is held by vacuum attraction on the wafer holder 88, for example, attracted and held on the recess on the sample base 8 as shown in FIG. 12(a) during the ordinary exposure, the wafer holder 88 is removed from the sample base 8 as shown in FIG. 12(b). After that, as shown in FIG. 12(c), an evaluating wafer (hereinafter referred to as "super flat thick wafer") 89, which is extremely excellent in parallelism, which has extremely high flatness of the surface, and which is considerably thick as compared with the ordinary wafer, is placed on the recess on which the wafer holder 88 has been placed on the sample base 8. The thickness of the super flat thick wafer 89 is such a thickness that the surface 89a is at the same height as that of the surface of the wafer W during the exposure in a state of being placed on the sample base 8. Projections 90A to 90C, which have tips with a spherical configuration, are embedded at three portions of the bottom surface.

After the super flat thick wafer 89 is placed on the sample base 8 as described above, the XYθ stage 10 shown in FIG. 1 is moved to a predetermined reference position to measure the focus position on the super flat thick wafer 89 at the respective detecting points shown in FIG. 8 by using, for example, the AF sensor 44A. The Z tilt stage 9 is driven on the basis of an obtained result of detection. The action of the Z tilt stage 9 is locked in a state in which the surface of the super flat thick wafer 89 in the vicinity of the exposure area 46 is conformed to the image plane. After that, the XYθ stage 10 is successively moved by a step amount in the X direction and in the Y direction, while the focus position (defocus amount from the image plane in this case) is detected at the respective detecting points shown in FIG. 8, for example, by the aid of the AF sensors 44A, 44C respectively. Obtained results of detection are stored in the storage unit in the focusing control system 45 as a map corresponding to the coordinates (X, Y) of the XYθ stage 10 (sample base 8). The map represents the distribution of the variation amount of the focus position of the running surface of the XYθ stage 10. For example, the angle of inclination is calculated by dividing the difference between the focus positions at the adjoining measuring points by the spacing distance between the measuring points.

Figure 12:
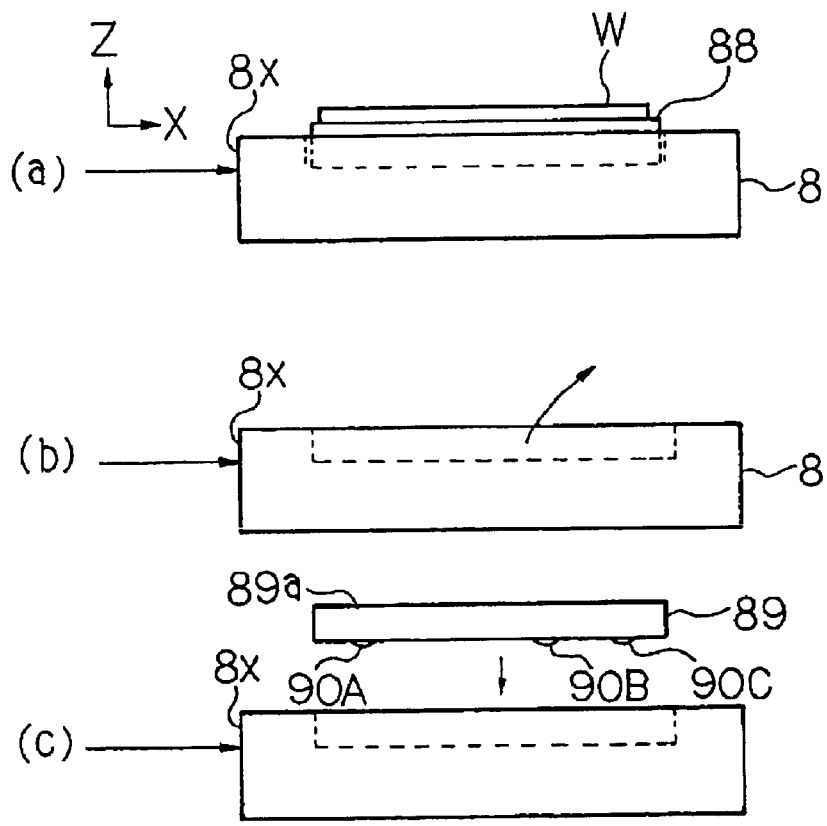
FIGS. 12(a)–(c) illustrate a situation in which a super flat thick wafer 89 is placed on a sample base 8 in place of a wafer holder 88.

Subsequently, as shown in FIG. 12(*a*) again, when the wafer holder 88 and the wafer W are placed on the sample base 8 to perform the exposure, the driving amount of the Z tilt stage 9, which is set on the basis of the focus position detected in the pre-reading areas 81, 82 shown in FIG. 8, for example, by the AF sensor 44A, is corrected with the focus position at the corresponding coordinate position on the stored map. Accordingly, even when the angle of inclination of the running surface of the XYθ stage 10 is varied, it is possible to perform the focusing at a high follow-up velocity.

Further, when the super flat thick wafer 89 is placed on the sample base 8 as described above to detect the focus position at the respective detecting points by moving the XYθ stage 10 by the predetermined amount, the pitching amount θX and the rolling amount θY of the sample base 8 are measured by the aid of the main interferometer bodies 12X, 12Y shown in FIG. 2. The pitching amount θX and the rolling amount θY of the sample base 8, which are determined from the result of detection of the focus position, are subtracted from the measured values. Accordingly, the variation value ΔθX of the pitching amount and the variation value ΔθY of the rolling amount, which are caused by the torsion of the mirror surfaces 8x, 8y of the sample base 8, are determined as a map (map of torsion error). Therefore, during the exposure, the pitching amount θX and the rolling amount θY of the sample base 8, which are detected by the main interferometer bodies 12X, 12Y shown in FIG. 2, are corrected with the variation value ΔθX of the pitching amount and the variation value ΔθY of the rolling amount which are stored. Accordingly, it is possible to dissolve the influence of the error (leveling control error) caused by the torsion of the mirror surfaces 8x, 8y of the sample base 8. The angle of torsion of the mirror surfaces 8x, 8y of the sample base 8 also affects the correction of the Abbe error generated by the spacing distance in the Z direction between the surface of the wafer W and the measuring beams LX1, LY1 described above. Therefore, it is necessary to correct the positions in the X, Y directions so that the angle of torsion is always corrected.

Figure 13:
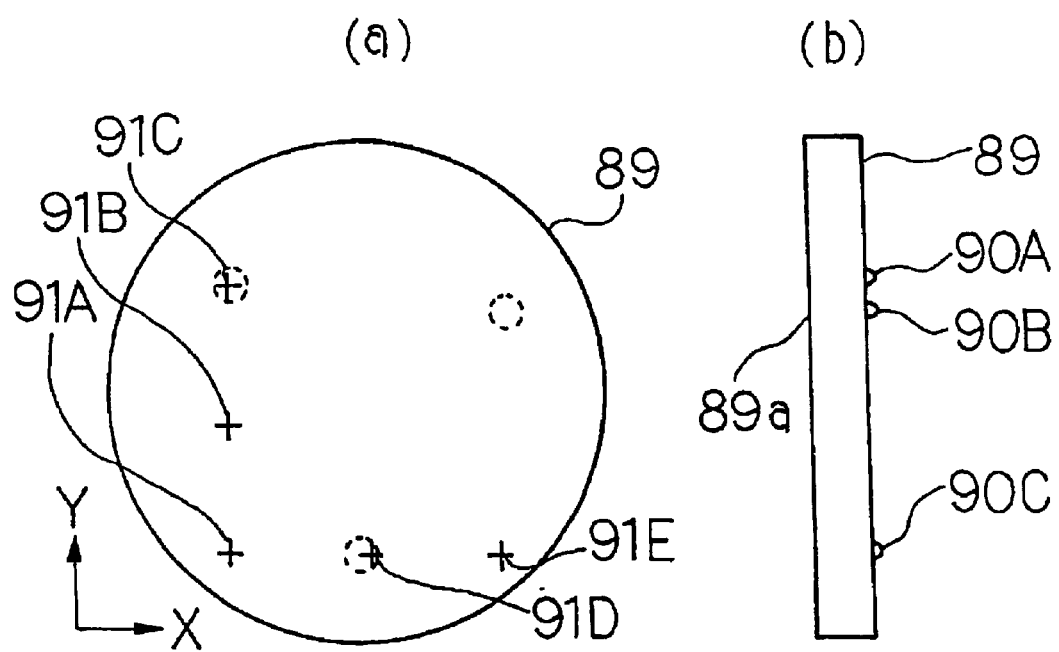
FIG. 13(a) shows a plan view illustrating the super flat thick wafer 89.
FIG. 13(b) shows a side view of FIG. 13(a).

As shown in FIG. 13(*b*), the super flat thick wafer 89 is supported at the three points based on the three projections 90A to 90C disposed on the bottom surface. It is possible to maintain high flatness of the surface 89*a* without depending on the shape and the distortion of the contact portions which would otherwise appear when the wafer holder 88 is removed on the sample base 8. That is, the super flat thick wafer 89 is designed and produced so that the flatness of the surface 89*a* is satisfactory when it is supported at the three points. Accordingly, the same super flat thick wafer 98 can be commonly used for a plurality of exposure apparatuses. The surface of the super flat thick wafer 89 can be regarded as a plane which serves as an absolute reference for each of the exposure apparatuses. However, during the measurement, the super flat thick wafer 98 is not fixed, for example, by means of the vacuum attraction, in order to maintain the good flatness. Therefore, it is necessary to drive the stage at a rate of acceleration which is not more than a predetermined allowable rate of acceleration. The focusing operation, which is based on the highly accurate complete pre-reading control, can be performed by using the method as described above.

Further, as shown in FIG. 13(*a*), fiducial marks 91A to 91C are formed at predetermined intervals on a straight line substantially along the Y direction on the surface of the super flat thick wafer 89, and fiducial marks 91A, 91D, 91E are formed at predetermined intervals on a straight line perpendicular to the straight line described above. It is possible to measure the discrepancy of the straightness of the XYθ stage 10 in the running direction concerning the Y direction by detecting the coordinate (X, Y) of the sample base 8 with the main interferometer bodies 12X, 12Y by driving the XYθ stage 10 shown in FIG. 1, while successively detecting the fiducial marks, for example, with the sensor for alignment. Therefore, the XYθ stage 10 is driven thereafter so that the discrepancy is corrected. Further, for example, the perpendicularity of the mirror surfaces 8x, 8y of the sample base 8 can be measured highly accurately according to the result of detection.

Next, explanation will be made for an example of a method for optimizing, for example, the spacing distance d1 of the pre-reading area 81, 82 with respect to the exposure area 46 shown in FIG. 8 and the number of individuals of the detecting points 81A to 81E, 82A to 82E. In this case, the condition is principally determined to perform the scanning exposure so that the defocus amount exceeding an allowable range is not generated in the exposure area 46 in accordance with the control system (hereinafter referred to as "complete pre-reading control") based on the focus position detected in only the pre-reading area (pre-reading area 81 and detecting points 84A, 84B) in front of the exposure area 46 in the scanning direction (designated as +Y direction) as shown in FIG. 8 by the control system (hereinafter referred to as "focusing system") for the focus position and the angle of inclination composed of the AF sensors 44A, 44B, the focusing control system 45, and the Z tilt stage 9 shown in FIG. 1. The case, in which the follow-up control is performed on the basis of the focus position at the central detecting point 83 in the exposure area 46, is also included in the complete pre-reading control.

At first, for the purpose of comparison with the complete pre-reading control described above, the following system (hereinafter referred to as "partial pre-reading control") will be investigated, in which a plurality of detecting points for the focus position, which are arranged in the X direction, are also provided at the center of the exposure area 46 shown in FIG. 8, and the focus position is detected with these detecting points and the plurality of detecting points in the pre-reading area 81.

Figure 14:
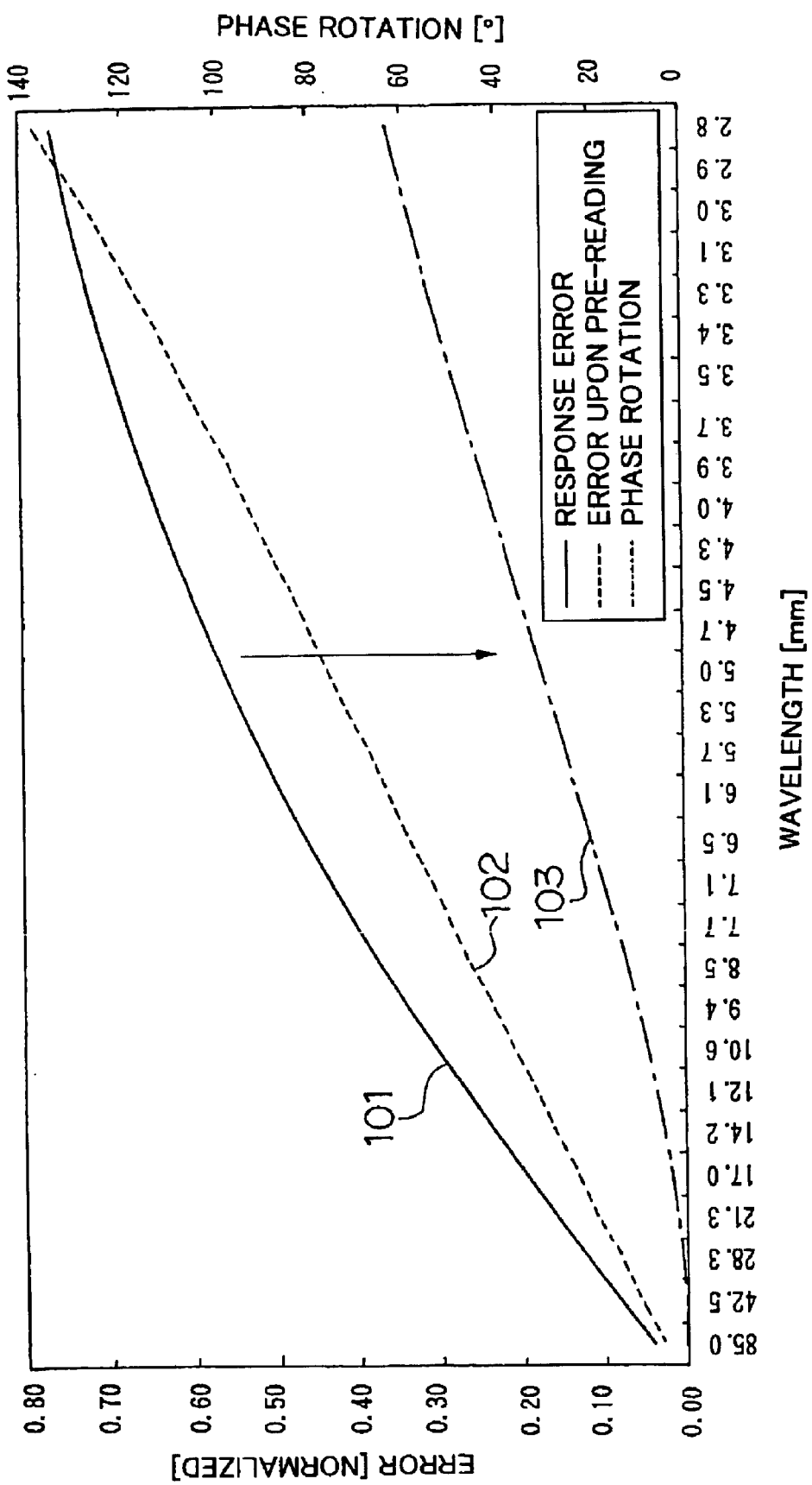
FIG. 14 shows the residual error which occurs when the focusing control is performed in the partial pre-reading.

FIG. 14 shows characteristics obtained when the scanning exposure is performed while effecting the autofocus in accordance with the partial pre-reading control. In FIG. 14, the horizontal axis represents the wavelength (pitch) in the scanning direction (Y direction) of the irregularity on the surface of the wafer as the exposure objective, and the vertical axis represents the phase rotation (°) and the error of the focus position (defocus amount) with respect to the image plane at the center of the exposure area 46. The error of the focus position represents the amplitude (normalized value) of the defocus amount assuming that the amplitude of the defocus amount, which is obtained when the wavelength of the cyclic irregularity on the wafer is 2 mm, is 1. The phase rotation represents the delay of the phase when the focus position of the wafer is controlled with respect to the phase of the cyclic irregularity on the wafer.

In the example shown in FIG. 14, the scanning velocity of the wafer is 85 mm/s, the frequency response of the driving unit in the Z direction of the Z tilt stage 9 is 25 Hz in a state in which the wafer stands still. Curves 101, 102, 103 represent the error of the focus position when the pre-reading control is not performed, the phase rotation, and the error of the focus position when the partial pre-reading control is performed, respectively. According to FIG. 14, the shorter the wavelength is, the larger the phase rotation error is. However, the error due to the phase delay can be corrected for the waviness of any wavelength if the spacing distance d1 of the pre-reading area 81 with respect to the exposure area 46 shown in FIG. 8 is about 2 mm. In the example shown in FIG. 14, the pre-reading area 81 is installed at a position in front of the exposure area 46 by 4 mm.

On the other hand, in order to perform the autoleveling control, for example, the differences between the results of detection at the detecting points 81A to 81E in the pre-reading area 81 and the result of detection at the central detecting point in the exposure area 46 are subjected to the least square approximation. Accordingly, the two-dimensional inclination is obtained. The width Ad of the pre-reading area 81 in the scanning direction is, for example, $2^{1/2}$ mm. Considering, for example, the prohibition zone having a width of about 3 mm at the periphery of the wafer as well, there is a possibility that the focusing control cannot be performed at the periphery of the wafer.

Next, investigation will be made for a case in which the complete pre-reading control is performed by detecting the focus position only in the pre-reading area 81 (or including the detecting points 84A, 84B as well) without detecting the focus position in the exposure area 46 except for the central one point. At first, it is assumed that the scanning velocity of the wafer is 100 to 250 mm/s, the settling time after arrival at the scanning velocities of the reticle and the wafer respectively until achievement of the synchronization of the both is 36 ms, the width (slit width) of the exposure area 46 in the scanning direction is 8 mm, and the size of the shot area is 25 mm (X direction)×33 mm (Y direction). On this assumption, the elapsed time (hereinafter referred to as "processing time") is determined under various conditions when the scanning exposure is performed for one shot area on the wafer in accordance with the exposure sequence of acceleration, settling, exposure, and deceleration.

Figure 15:
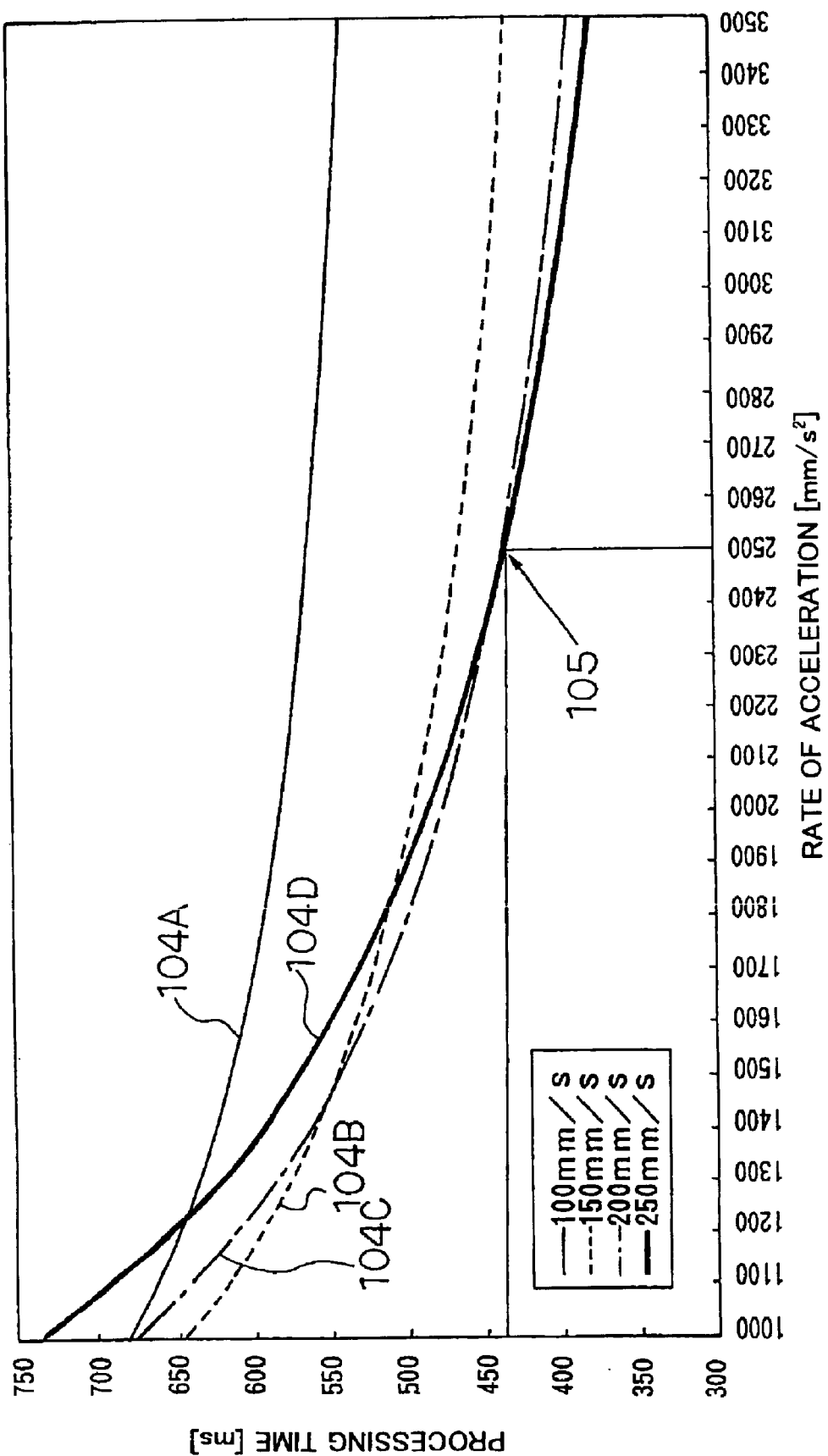
FIG. 15 shows a relationship between the rate of acceleration of the wafer stage and the processing time per one shot.

FIG. 15 shows the processing time when the rate of acceleration of the XYθ stage 10 is switched under the condition as described above. In FIG. 15, the horizontal axis represents the rate of acceleration (mm/s$^2$), and the vertical axis is the processing time (ms). Curves 104A, 104B, 104C, and 104D represent the processing times when the scanning velocity of the wafer is 100 mm/s, 150 mm/s, 200 mm/s, and 250 mm/s respectively. According to the resultant data 105, it can be confirmed that the processing time is most shortened, and the throughput can be most enhanced, by allowing the scanning velocity to be 200 mm/s, if the rate of acceleration of the XYθ stage 10 cannot be increased to be not less than 2500 mm/s$^2$.

In the following procedure, the position of the pre-reading area 81 to completely remove the phase rotation error corresponding to the response performance of the focusing system is determined when the scanning velocity of the XYθ stage 10 is 200 mm/s, and the rate of acceleration is 2500 mm/s$^2$.

Figure 16:
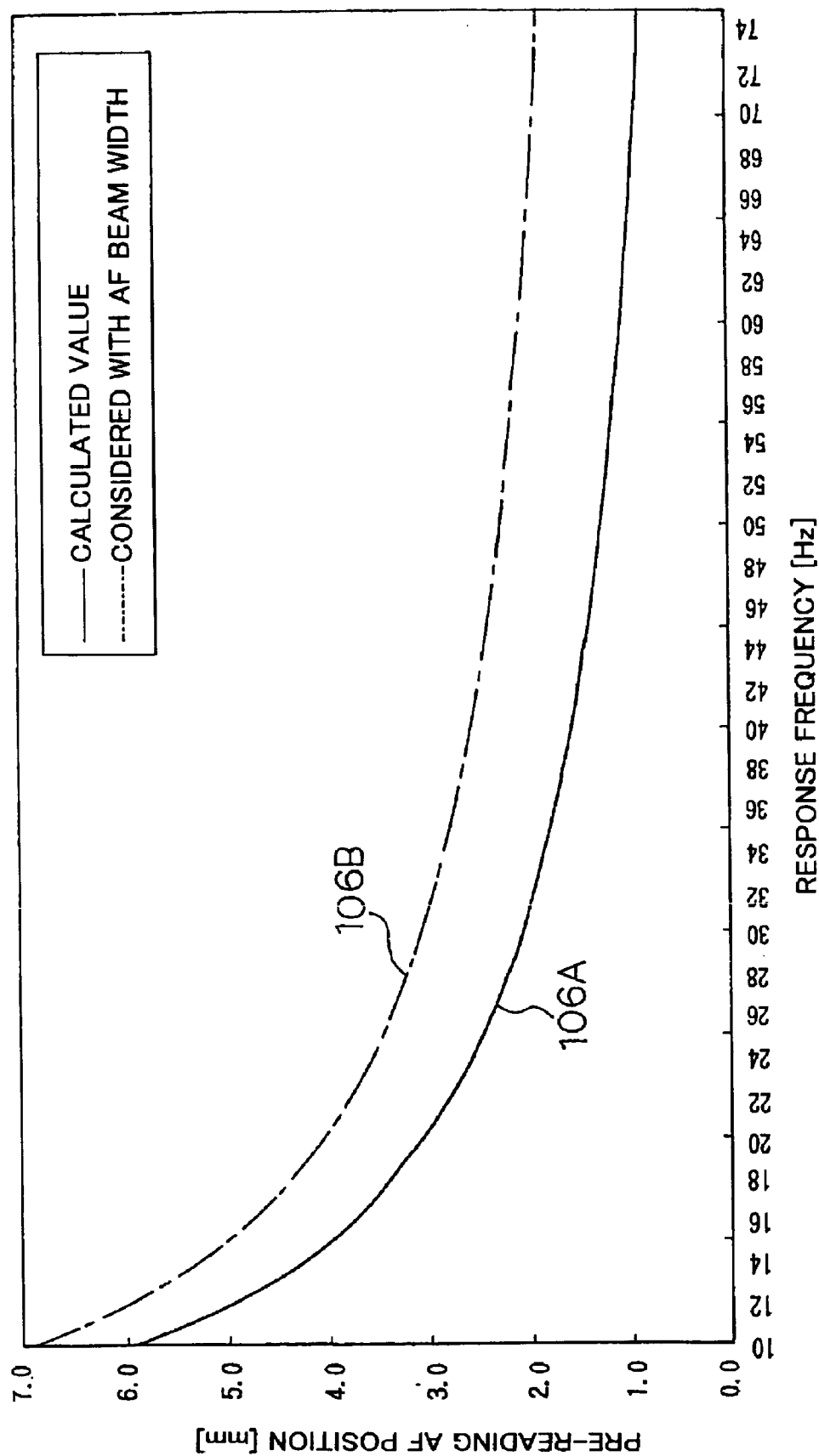
FIG. 16 shows the spacing distance between the exposure area and the pre-reading area necessary to completely eliminate the phase rotation error.
Figure 17:
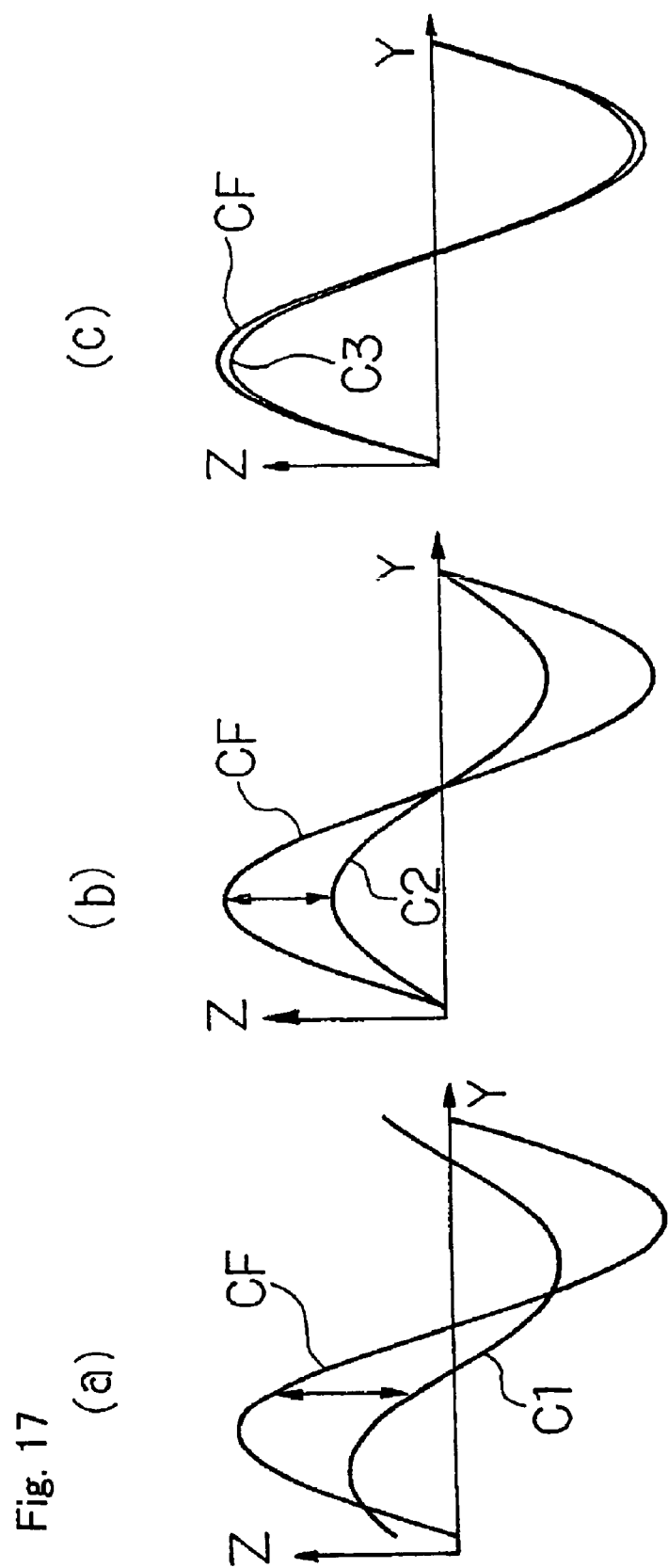
FIGS. 17(a)–(c) illustrate a case in which the gain is further increased when the phase rotation error is corrected.

FIG. 16 shows the result of calculation of the position of the pre-reading area 81 at which the phase rotation error can be removed substantially completely when the resonance frequency of the focusing system is switched. In FIG. 16, the horizontal axis represents the resonance frequency (Hz), and the vertical axis represents the shortest value of the spacing distance d1 (mm) of the pre-reading area 81 with respect to the exposure area 46 shown in FIG. 8, i.e., the shortest value of the pre-reading AF position. A curve 106A represents the calculated value obtained when the width of the pre-reading area 81 is not considered. A curve 106B represents the calculated value obtained when the width Δd of the pre-reading area 81 is 2 mm including the margin. That is, the pre-reading AF position in FIG. 16 resides in the shortest spacing distance necessary to generate no phase rotation error after the focus position is detected in the pre-reading area 81 in FIG. B. If the phase rotation error can be corrected as described above, as shown in FIG. 17, it is possible to allow the focus position in the exposure area 46 to completely follow up the image plane, by increasing the gain when the Z tilt stage 9 is driven by using the focusing system.

That is, if the pre-reading control is not performed, as shown in FIG. 17(a), when the surface of the wafer periodically waves in the scanning direction (Y direction), and the image plane varies as shown by a curve CF relatively with respect to the surface, then the surface of the wafer is displaced as shown by a curve C1 while being delayed to the variation of the image plane. On the contrary, if the pre-reading control is performed, and the phase rotation error is not generated, then the surface of the wafer is displaced (curve C2) to follow up the variation of the image plane (curve CF) as shown in FIG. 17(b). Further, when the gain for the defocus amount is increased, as shown in FIG. 17(c), the surface of the wafer is displaced (curve C3) to follow up the variation of the image plane (curve CF) substantially completely.

The result described above resides in the focusing control for a certain point in the exposure area 46. However, in the actual scanning exposure, it is necessary that the average plane in the slit-shaped exposure area 46 is conformed to the image plane. During this process, if the surface of the wafer has specified waviness, it is feared that the defocus occurs at any point in the exposure area 46 even when the complete correction is performed as shown in FIG. 17(c).

Figure 19:
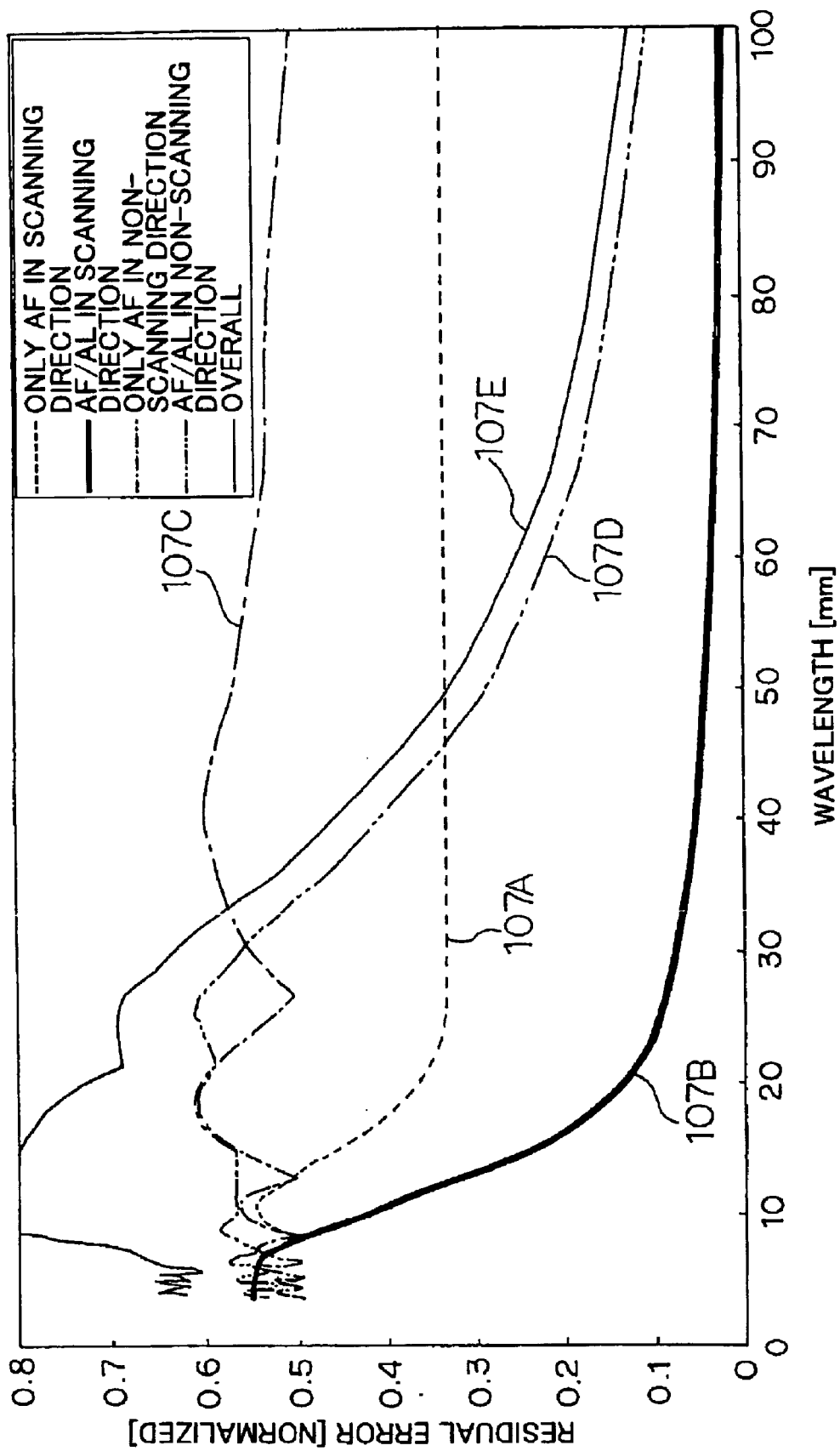
FIG. 19 shows the residual error of the focus position caused when the average value correction is performed for the AF control, and the least square approximation correction is performed for the AL control.
Figure 20:
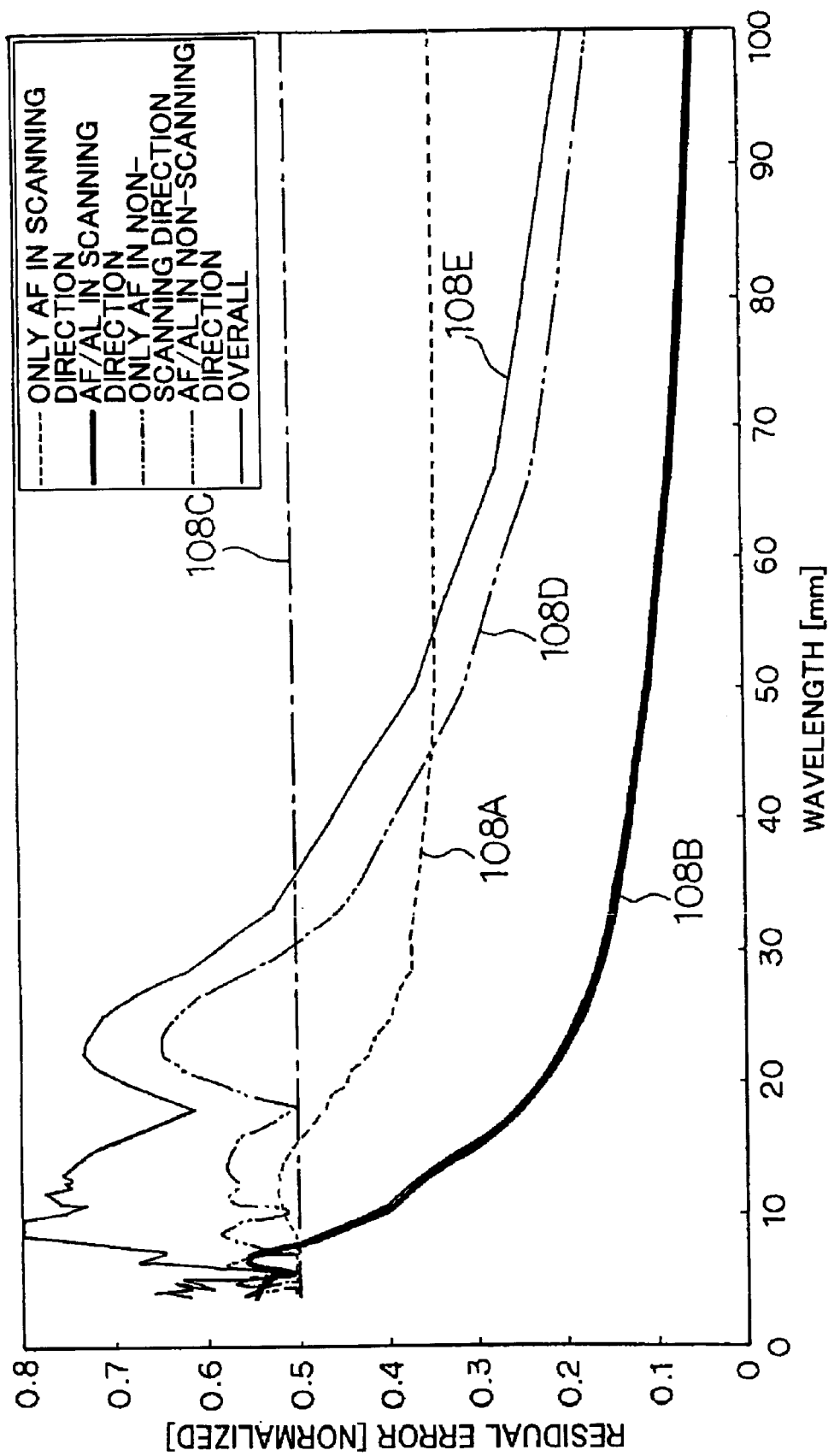
FIG. 20 shows the residual error of the focus position caused when the max-min correction is performed for the AF control, and the least square approximation correction is performed for the AL control.

Accordingly, in the complete pre-reading control in the embodiment described above, the angle of inclination in the non-scanning direction (X direction) is successively detected from the focus position detected at the array of the detecting points 81A to 81E in the pre-reading area 81 shown in FIG. 8. As for the scanning direction, the angle of inclination is detected according to the change of the focus position detected at the predetermined sampling cycle at the respective detecting points 81A to 81E. The defocus amount predicted in the exposure area 46 is corrected by adjusting the gain and offsetting the phase rotation error on the basis of the result of detection. However, the residual defocus amount (residual error) is changed as shown in FIGS. 19 and 20 depending on the method for detecting the angle of inclination based on the pre-reading area 81. Brief explanation will be made for the residual error with reference to FIG. 18.

FIGS. 18*a* to 18*c* show a case in which the image plane is varied as shown by a curve CF relatively with respect to the surface (when the correction is not performed) due to the waviness of the surface of the wafer in the scanning direction (Y direction). In this case, it is assumed that the slit width D of the exposure area 46 in FIG. 8 is set to be ½ with respect to the wavelength of the waviness of the surface, and the exposure is performed at a specified point CFP in the image plane, while performing the autofocus and the autoleveling in accordance with the complete pre-reading control system. It is assumed that the wafer stands still, and the exposure area 46 is relatively moved in the Y direction.

Figure 18:
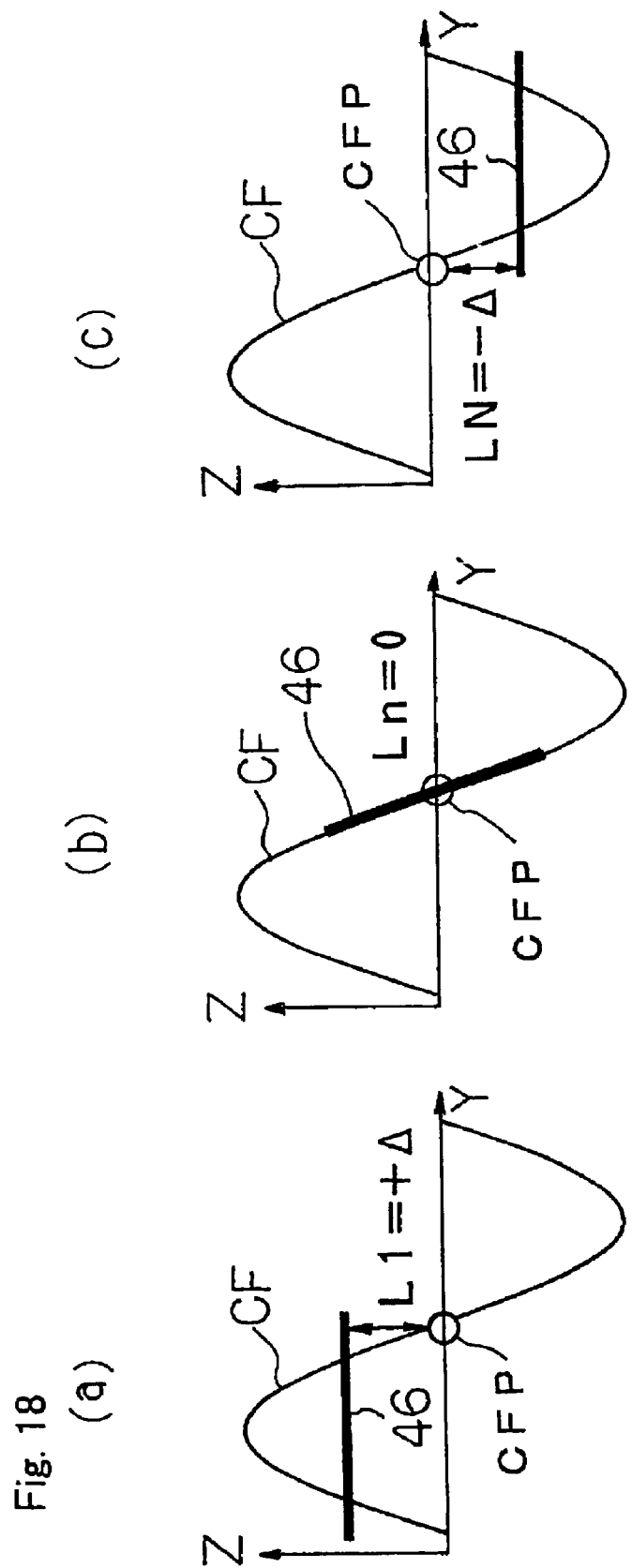
FIGS. 18(a)–(c) show a state in which the defocus amount is changed due to the waviness of the surface of the wafer.

At first, in FIG. 18(*a*), the defocus amount L1 at the point of time at which the point CFP arrives at the exposure area 46 is, for example, +Δ. After that, in FIG. 18(*b*), when the point CFP arrives at the center of the exposure area 46, then the surface of the wafer coincides with the image plane (curve CF), and the defocus amount Ln is zero in accordance with the autofocus and the autoleveling control. Subsequently, in FIG. 18(*c*), the defocus amount LN immediately before the point CFP is deviated from the exposure area 46 is −Δ. Accordingly, the defocus amount ΔZy at one point on the wafer exposed by the point CFP is obtained by integrating the defocus amount L(Y) at the respective positions in the scanning direction (Y direction) as follows, and averaging the integral value.

$$\Delta Zy = \int L(Y) dY / D \quad (8)$$

The integral of the expression (8) is executed in the interval in which the point CFP passes through the exposure area 46. Assuming that Zy represents the average value of the defocus amounts before the correction with respect to the image plane represented by the curve CF shown in FIG. 18, Zy is approximately zero in the example shown in FIG. 18. Actually, an effect equivalent to that of the multiple exposure is obtained for the defocus amount ΔZy in the expression (8). Therefore, the value on the simulation for the overall defocus amount Fy after the scanning exposure at each point of the wafer is approximately as follows.

$$Fy = Zy + \Delta Zy/3 \quad (9)$$

Similarly, assuming that the average value of the defocus amounts at the multiple detecting points arranged in the non-scanning direction is Zx, the value on the simulation for the overall defocus amount Ft considering the defocus amounts in the scanning direction and in the non-scanning direction is approximately as follows.

$$Ft = Zx + \Delta Zy/3 \quad (10)$$

Accordingly, FIG. 19 shows the result of calculation of the residual error of the defocus amount in the exposure area 46 when the waviness at each wavelength exists on the surface of the wafer under the condition in which the complete pre-reading control is performed, the correction (average value correction) is performed for the autofocus control (hereinafter referred to as "AF control") so that the average value of the obtained focus positions is allowed to approach the image plane, and the correction (least square approximation correction) is performed for the autoleveling control (hereinafter referred to as "AL control") so that the obtained focus positions are subjected to the least square approximation to calculate the two-dimensional angles of inclination and the angles of inclination are conformed to the image plane. In FIG. 19, the horizontal axis represents the wavelength (pitch) (mm) in the scanning direction of the waviness of the surface of the wafer, and the vertical axis represents the residual error of the defocus amount normalized such that the amplitude of the waviness at each wavelength is 1.

It is assumed that the slit width D of the exposure area 46 is 8 mm. A curve 107A is obtained by performing only the AF control for the scanning direction to determine the worst value of the defocus amount in the expression (9) for the waviness at each wavelength. A curve 107B is obtained by performing the AF control and the AL control for the scanning direction to determine the worst value of the defocus amount in the expression (9) for the waviness at each wavelength. A curve 107C is obtained by performing only the AF control for the non-scanning direction to determine the worst value of the defocus amount Zx for the waviness at each wavelength. A curve 107D is obtained by performing the AF control and the AL control for the non-scanning direction to determine the worst value of the defocus amount Zx for the waviness at each wavelength. A curve 107E resides in the overall defocus amount determined according to the expression (10) when the AF control and the AL control are performed for both of the scanning direction and the non-scanning direction.

FIG. 20 shows results of calculation of the residual error of the defocus amount in the exposure area 46 for the waviness at each wavelength of the wafer under the condition in which the complete pre-reading control is performed, the correction (max-min correction) is performed for the AF control to allow an intermediate value between the maximum value max and the minimum value min of the obtained focus positions to approach the image plane, and the least square approximate correction is performed for the AL control. In FIG. 20, a curve 108A indicates the worst value (residual error) of the defocus amount obtained when only the AF control is performed for the scanning direction. A curve 108B indicates the worst value of the defocus amount obtained when the AF control and the AL control are performed for the scanning direction. A curve 108C indicates the worst value of the defocus amount obtained when only the AF control is performed for the non-scanning direction. A curve 108D indicates the worst value of the defocus amount obtained when the AF control and the AL control are performed for the non-scanning direction. A curve 108E indicates the overall defocus amount obtained when the AF control and the AL control are performed for both of the scanning direction and the non-scanning direction.

According to FIGS. 19 and 20, it can be confirmed that the residual error is large for the waviness at the wavelength of 10 to 35 mm.

Figure 21:
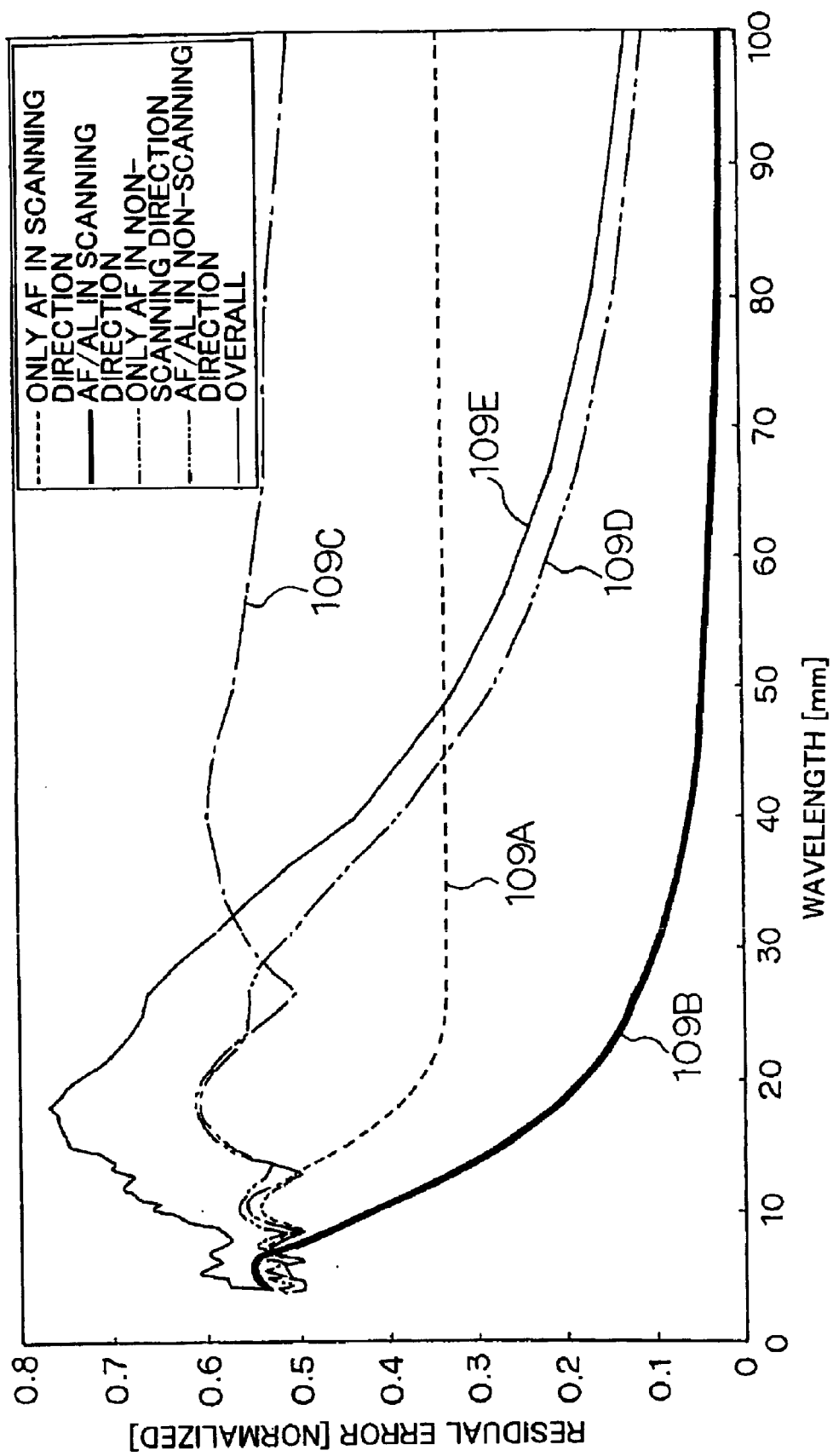
FIG. 21 shows the residual error of the focus position caused when the average value correction is performed for the AF control, and the least square approximation correction is performed for the AL control, on condition that the response frequency of the focusing system is 10 Hz.
Figure 22:
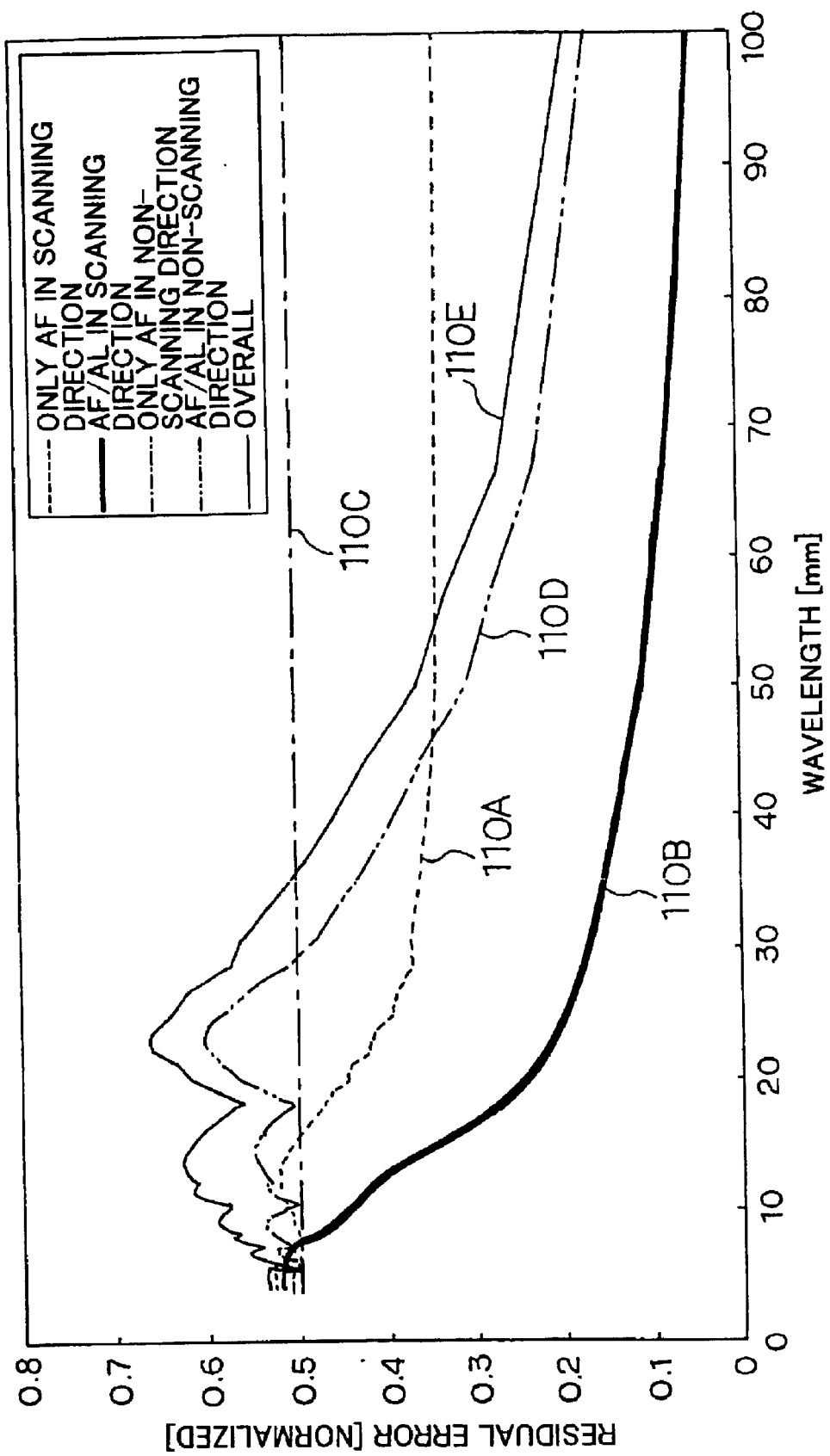
FIG. 22 shows the residual error of the focus position caused when the max-min correction is performed for the AF control, and the least square approximation correction is performed for the AL control, on condition that the response frequency of the focusing system is 10 Hz.

On the other hand, FIGS. 21 and 22 show simulation results for the residual error obtained when the AF control is performed in accordance with the complete pre-reading control, only the phase rotation error is corrected in accordance with the pre-reading control for the AL control, the resonance frequency of the focusing system is 10 Hz, and the other conditions are the same as those used in FIGS. 19 and 20 respectively. That is, the calculation condition in FIG. 21 is such that the AF control is based on the average value correction, and the AL control is based on the least square approximation correction, wherein curves 109A to 109E correspond to the curves 107A to 107E shown in FIG. 19. The calculation condition in FIG. 22 is such that the AF control is based on the max-min correction, and the AL control is based on the least square approximation correction, wherein curves 110A to 110E correspond to the curves 108A to 108E shown in FIG. 20.

According to FIGS. 21 and 22, it is understood that the residual error is improved for the waviness having the short wavelength, although the residual error is slightly deteriorated in the case of the waviness having the long wavelength at the resonance frequency of 10 Hz. The overall residual errors calculated with the expression (10), i.e., the overall residual errors represented by the curves 107E to 110E in FIGS. 19 to 22 are summarized as curves 111A to 111D shown in FIG. 23.

Figure 23:
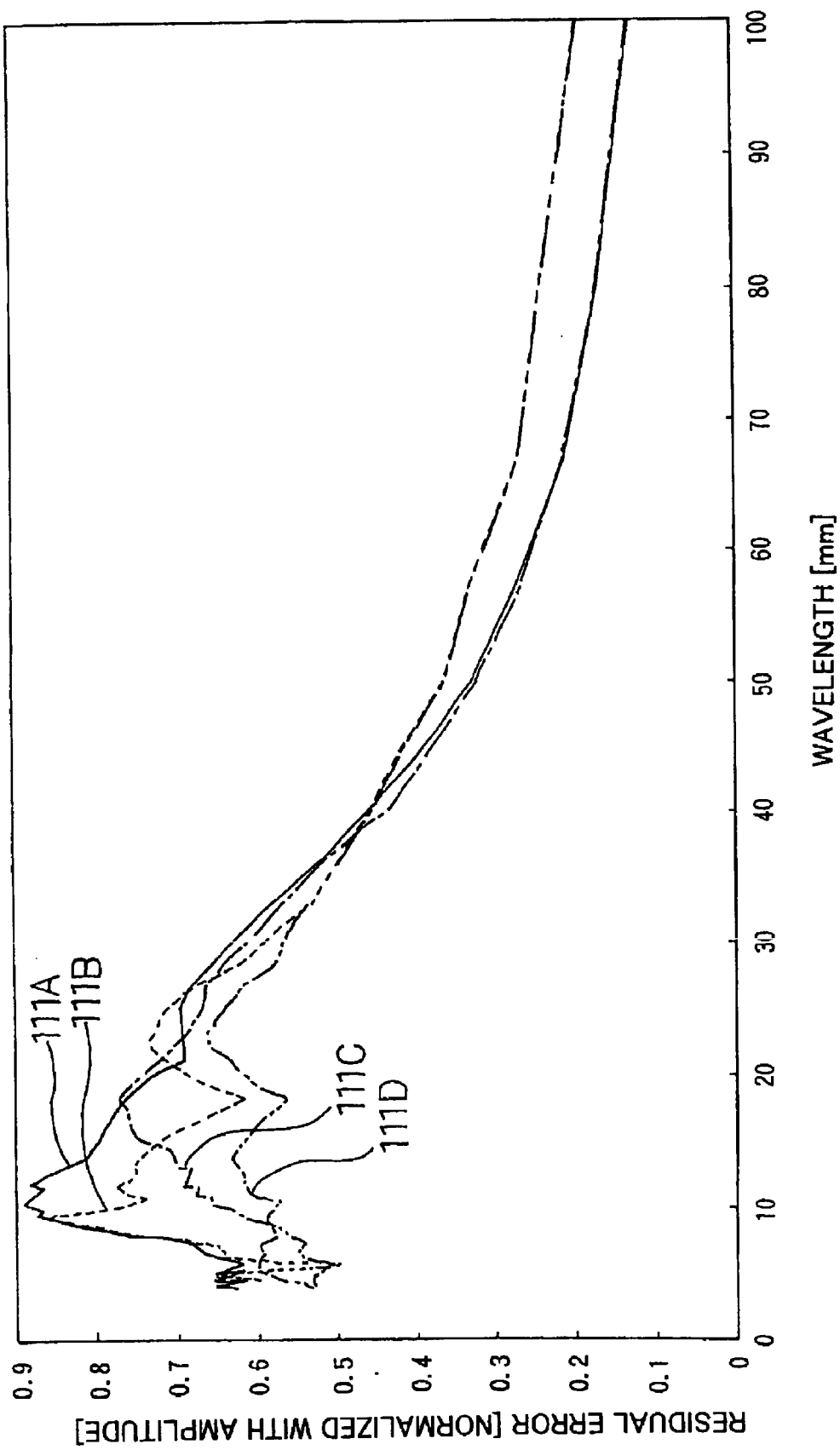
FIG. 23 collectively shows the overall residual errors of the focus positions shown in FIGS. 19 to 22.

According to FIG. 23, it is understood that the overall residual error is the smallest as a whole for the waviness at all of the wavelengths in the case of the curve 111D, i.e., when the AF control is based on the complete pre-reading max-min correction, the AL control is performed by correcting only the phase rotation error by means of the pre-reading, and the resonance frequency is 10 Hz.

Figure 24:
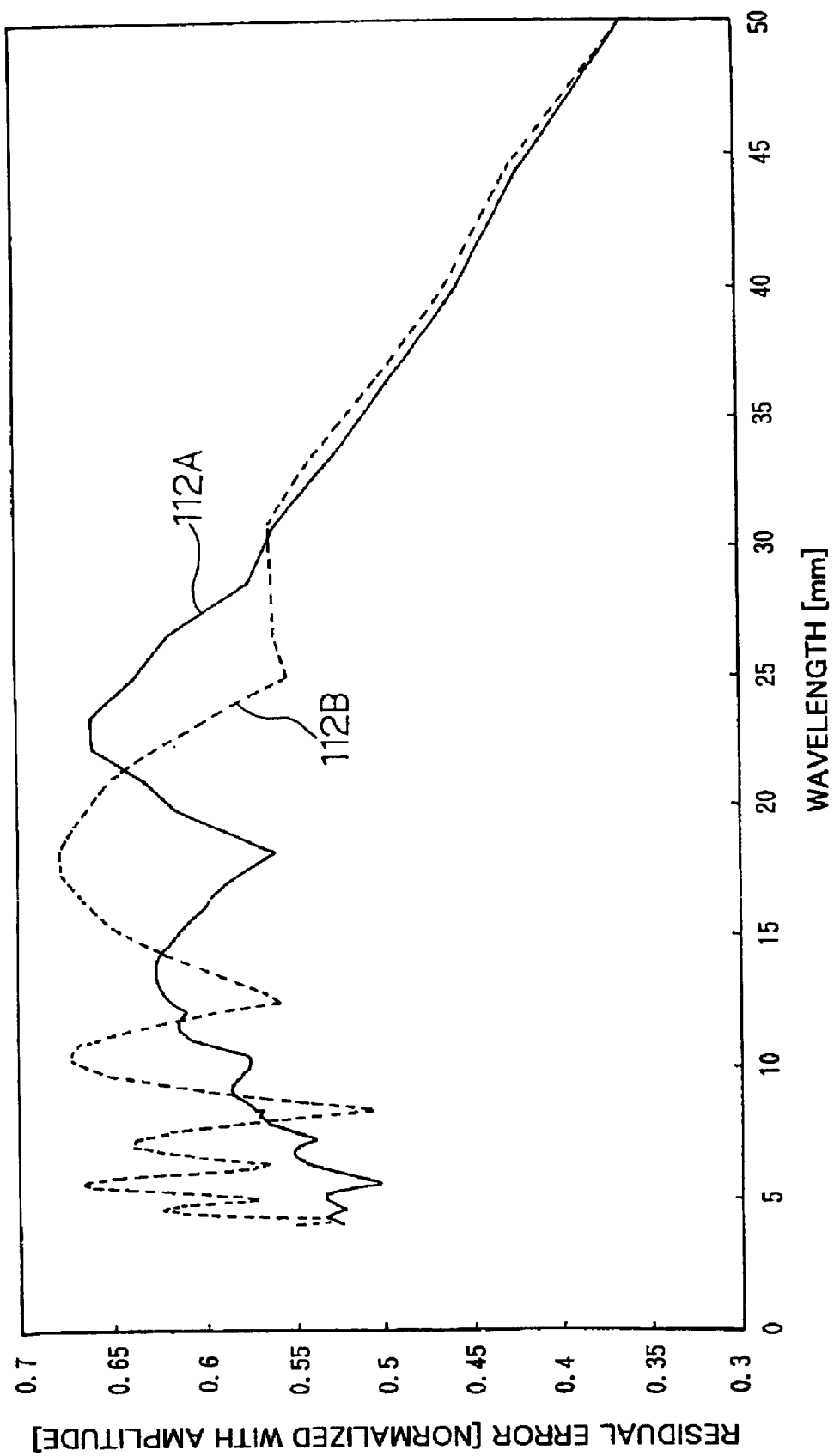
FIG. 24 shows the residual error in the AL control caused when the number of pre-reading points for the focus position is three and N.

Next, this control method is used to compare the case in which the number of the detecting points for the focus position in the pre-reading area is three as shown in FIG. 10(*a*) with the case in which the number of the detecting points is N which is not less than four (N=9 in the case of FIG. 10(*b*)) as shown in FIG. 10(*b*). In this process, the complete pre-reading max-min correction is performed for the AF control. The AL control is performed such that the two-dimensional angle of inclination is determined from results of detection of the focus position at the two detecting points 81A, 81C (or 82A, 82C) at both ends when the pre-reading is performed at the three points in FIG. 10(*a*), while the two-dimensional angle of inclination is determined by means of least square approximation of results of detection of the focus position at N individuals of the detecting points 81A to 81I (or 82A to 82I) when the pre-reading is performed at the N points in FIG. 10(*b*). As for the AL control, FIG. 24 shows the result of simulation of the residual error obtained when only the phase rotation error is corrected by means of the pre-reading, and the resonance frequency is 10 Hz. In FIG. 24, a curve 112A indicates the residual error when the pre-reading is performed at N points, and a curve 112B indicates the residual error when the pre-reading is performed at three points. According to these results, it is understood that the error is large depending on the wavelength band of the waviness in the case of the three-point measurement, while the stable result is obtained in the case of the N-point measurement. The inclination, which is determined with the pre-reading detecting points 81A to 81E (or 82A to 82E) and the central detecting point 83 shown in FIG. 8, may be used for the two-dimensional angle of inclination in the AL control. Alternatively, the inclination, which is determined with the time axis of the detecting points 81A to 81E or 82A to 82E, may be used for the two-dimensional angle of inclination in the AL control.

It is estimated that the device will have a larger size in future. Therefore, it is considered that two or more tip patterns are scarcely formed in the non-scanning direction in each shot area (not less than three individuals are scarcely formed). Therefore, in the case of the three-point measurement in the pre-reading area, it is feared that the detecting point for the focus position is overlapped with the street line between chip patterns, and the focusing accuracy is deteriorated for the chip pattern when two individuals are formed in the non-scanning direction. However, when four or more (or five or more including the detection at the center) of the detecting points for the focus position are used to make selection depending on the way of use, it is possible to avoid the deterioration of the focusing accuracy. Further, in view of the air-dependent fluctuation and the AL control performance, it is preferable to use a large number of detecting points for the focus position in the pre-reading area in order to enhance the averaging effect.

According to the results described above, it is preferable that the number of individuals of the detecting points for the focus position in the non-scanning direction in the pre-reading area is five in ordinary cases. However, in view of the recent advance of the technology of formation of flat wafer, there is such a tendency that the flatness of the wafer is improved in each shot area. Accordingly, it is also desirable to widen the illumination area of the detecting light beam at each detecting point (projection area of interference fringes when the interference fringes are projected) so that the averaging effect is enhanced for each case. Therefore, the optimum arrangement of the detecting points is successfully determined on the basis of the spacing distance of the detecting points for the focus position in the non-scanning direction and the measurement reproducibility of the AF sensor itself.

Next, another feature will be explained. As having been explained with reference to FIG. 8, the rough detecting points 84A, 84B, 85A, 85B are set in order to roughly detect the focus position with the wide detection range in front of the highly accurate pre-reading area 81, 82 in the embodiment described above. Explanation will be made for a specified example of a focusing method based on the use of the rough detecting points.

Figure 25:
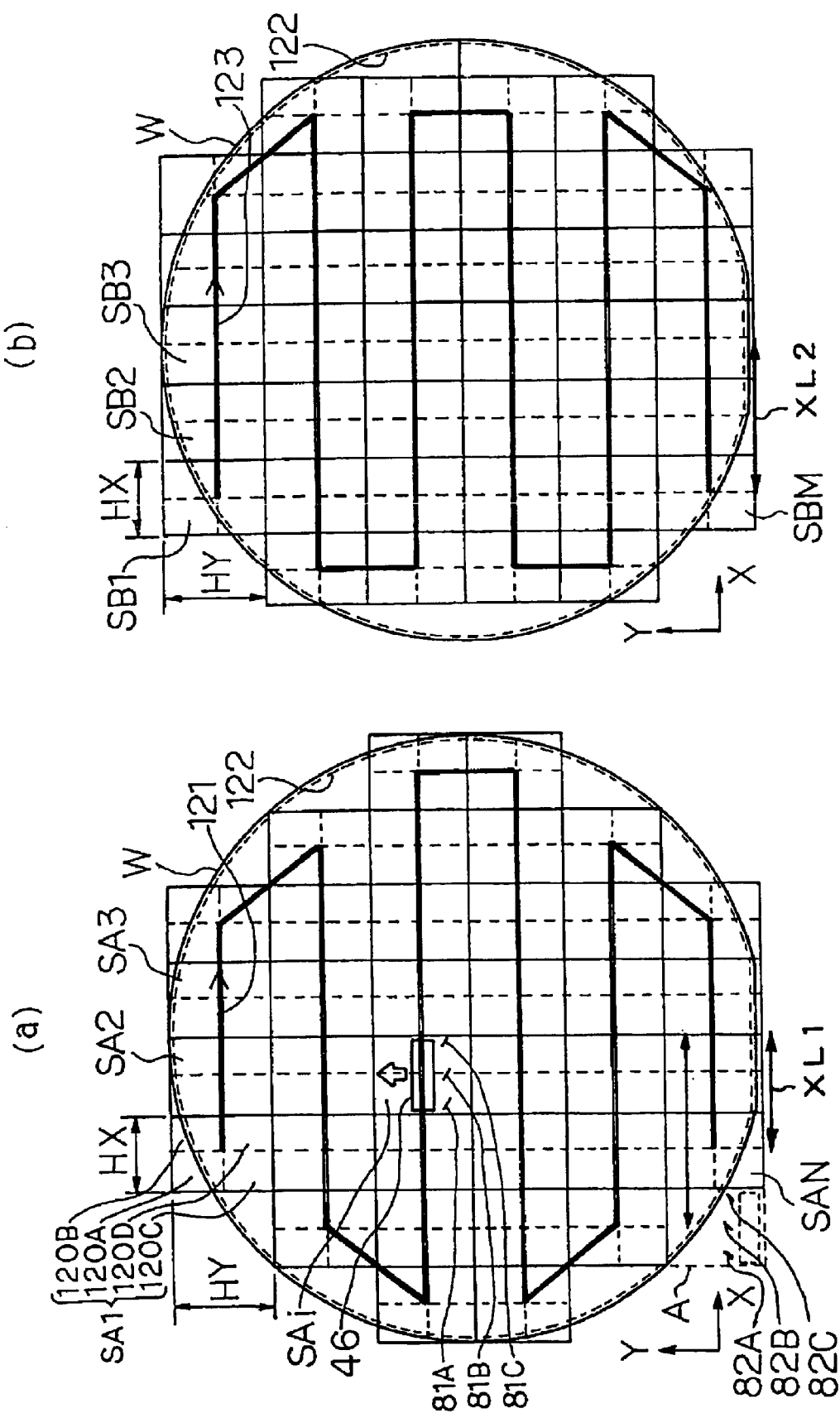
FIG. 25(a) shows a shot map in which the surface of the wafer W is divided to provide even numbers of shot areas in the X direction and in the Y direction respectively.
FIG. 25(b) shows a shot map in which the surface of the wafer W is divided to provide an odd number of shot areas in the X direction and an even number of shot areas in the Y direction.

FIGS. 25*a* and 25*b* show shot maps to be used when the exposure is performed for a large number of shots having a size of 25 mm (width HX in the X direction)×33 mm (width HY in the Y direction) respectively on a wafer W of 8 inches. In FIG. 25(*a*), shot areas SA1, SA2, . . . , SAN are arranged in an even number in the Y direction and in an even number in the X direction on the wafer W. In FIG. 25(*b*), shot areas SB1, SB2, . . . , SBM are arranged in an even number in the Y direction and in an odd number in the X direction on the wafer W. The shot area SA1 is comparted into four chip pattern areas 120A to 120D. Four individuals are also formed on the other shot areas. Arrow-affixed loci 121, 123 in FIGS. 25*a* and 25*b* indicate exposure sequences for the shot areas respectively.

For example, when the shot areas SA1 (i=1 to N) shown in FIG. 25(*a*) are subjected to the scanning exposure, then the shot area SAi is scanned in the +Y direction (or in the −Y direction) across the slit-shaped exposure area 46, and the focusing control is performed on the basis of the focus position detected at the detecting points 81A to 81C in the pre-reading area. The stepping between the shot areas is performed to make movement in the X direction in each row as indicated by the locus 121. Similarly, when the shot areas SB1 to SBM shown in FIG. 25(*b*) are subjected to the scanning exposure, the stepping is also performed in the X direction in each row as indicated by the locus 123. In these examples, the central positions of the shot areas SA1, SB1 to be firstly exposed are located at 37.5 mm (spacing distance XL1) and 50 mm (spacing distance XL2) from the center line in the X direction of the wafer W respectively.

In the shot map shown in FIG. 25, the throughput is rather enhanced when the stepping direction is the Y direction in some conditions. However, for example, under a condition in which the scanning velocity of the wafer is 200 mm, the rate of acceleration is 2500 mm/s$^2$, the settling time from the end of the acceleration to the completion of the synchronization is 36 ms to simultaneously accelerate the reticle and the wafer, the time required for the acceleration and the deceleration of the reticle is the rate-limiting condition, and no special problem occurs concerning the stepping direction of the wafer. However, assuming that the shot area is long in the scanning direction (Y direction), and the stepping is performed in the Y direction, the stepping time is prolonged when the stepping is performed in the Y direction provided that there is no great difference in rate of acceleration between the X direction and the Y direction. Therefore, in this embodiment, the stepping is performed in the non-scanning direction (X direction).

In the case of the ordinary wafer, the area of a width of 3 mm from the outer circumference is generally the exposure prohibition zone. The exposure is performed in the exposable area disposed just inside the exposure prohibition zone. Therefore, in the case of the 8-inch wafers W shown in FIGS. 25a and 25b, the detection of the focus position and the scanning exposure are performed within the exposable area 122 disposed inside the outer circumference by 3 mm. Therefore, for example, assuming that the exposure is performed for the virtual shot area A disposed at a position of a spacing distance of 62.5 mm (=2.5×HX) from the center line in the X direction of the wafer W, the lacking portion is maximized. That is, if the exposure is performed, the shot area A is the worst shot area having the large lacking portion.

Figure 26:
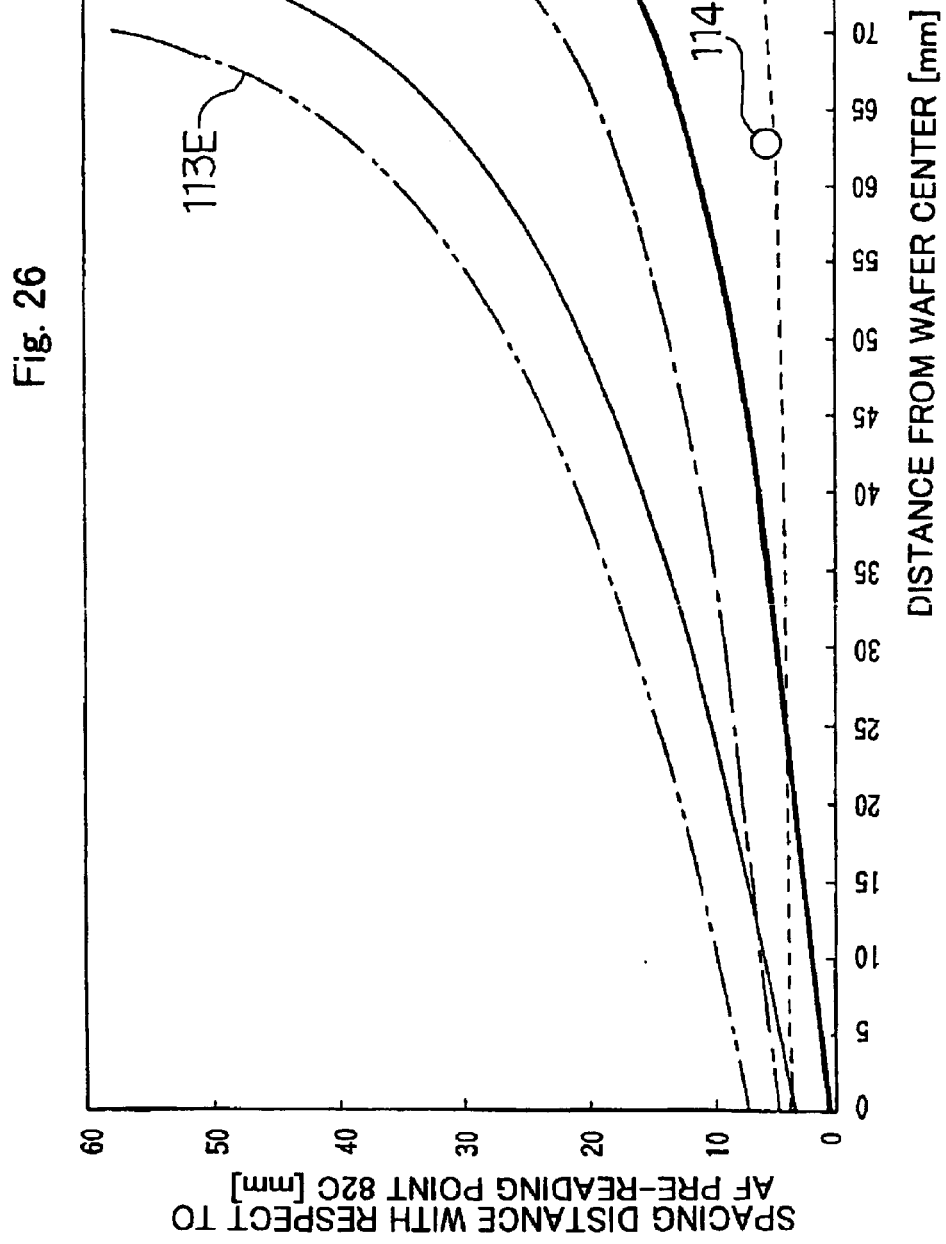
FIG. 26 shows, for example, the spacing distance for the movement of the wafer until the pre-reading position for the focus position arrives at the exposable area from the outer circumference of the wafer.

FIG. 26 shows results of determination of the position at which the focus position is detectable by means of the pre-reading in the exposable area 122 on the wafer W concerning FIG. 25(a). In this case, for example, in the shot area A, it is assumed that the exposure area is relatively subjected to the scanning from the outer side to the inner side of the wafer W, and the focus position is detected at the three detecting points 82A to 82C in the pre-reading area. In this process, the detecting point 82C in the +X direction firstly arrives at the edge of the wafer W, and it enters the exposable area 122. Therefore, in the following description, the consideration is made by using the detecting point 82C as a reference.

In FIG. 26, the horizontal axis represents the distance (mm) in the X direction from the center line in the X direction of the wafer W shown in FIG. 25(a), and the vertical axis represents the difference (hereinafter referred to as "spacing distance with respect to the AF pre-reading point 82C") (mm) between the position in the Y direction at which the detecting point 82C enters the exposable area 122 and the position in the Y direction at which the other detecting points 82B, 82A enter the exposable area 22. That is, a curve 113D represents the spacing distance between the detecting points 82B and 82C, and a curve 113E represents the spacing distance between the detecting points 82A and 82C. However, a curve 113C represents the spacing distance in which the wafer W is moved until the detecting point 82C enters the exposable area 122 from the outer circumference of the wafer W. A point 114 on the curve 113C corresponds to a case in which the exposure is performed for the shot area A under the worst condition shown in FIG. 25(a). A curve 113A represents the spacing distance in which the wafer W is moved until the detecting point 82B arrives at the outer circumference of the wafer W after the arrival of the detecting point 82C at the outer circumference of the wafer W. A curve 113B represents the spacing distance in which the wafer W is moved until the detecting point 82A arrives at the outer circumference of the wafer W after the arrival of the detecting point 82C at the outer circumference of the wafer W.

As shown by the point 114 on the curve 113C described above, in the shot area A under the worst condition of 62.5 mm in the X direction from the center of the wafer W shown in FIG. 25(a), the distance, with which the detecting point 82C firstly arrives at the exposable range 122, is 5.4 mm. For example, when the pre-reading control is performed therefrom at a resonance frequency of 40 Hz, a pre-reading distance of 1.6 mm (spacing distance until the pre-reading value is obtained) is required. Therefore, it is enough that the pre-reading areas 81, 82 are located at 7 mm (corresponding to the spacing distance d1 shown in FIG. 8) in front of the exposure area 46. However, as having been explained, the sensor unit for the highly accurate detecting points in the pre-reading areas 81, 82 shown in FIG. 8 has the narrow detection range (dynamic range) in order to achieve the high accuracy. If the highly accurate seat unit is allowed to have, for example, a measuring resolution of 10 nm (0.01 μm), the detection range is about ±10 μm which is about 1000 times the above.

However, there is a possibility that the focus position is deviated by about ±0.6 mm when the pre-reading area enters from the outer side at the outer circumference of the wafer W shown in FIG. 25. Therefore, it is necessary to roughly measure the focus position with the wide detection range (dynamic range) before measuring the focus position highly accurately. Accordingly, in this embodiment, as shown in FIG. 8, the rough detecting points 84A, 84B, 85A, 85B are arranged in front of the pre-reading areas 81, 82. When the focus position is detected at the rough detecting points, it is possible to judge whether the focus position on the surface of the wafer W is deviated either in the + direction or in the − direction with respect to the image plane even in the range of the exposure prohibition zone of the width of 3 mm from the outer circumference of the wafer W. Accordingly, the focus position on the surface of the wafer W is introduced into the detection range, for example, of the highly accurate detecting points 82A to 82C by driving the Z tilt stage 9 shown in FIG. 1. The focus position on the surface of the wafer W is also varied substantially continuously even in the exposure prohibition zone of the width of 3 mm from the outer circumference of the wafer W shown in FIG. 25. Therefore, when the focus position is pre-read with the rough detecting point from the exposure prohibition zone, it is possible to arrange the rough detecting point just in the vicinity of the highly accurate pre-reading areas 81, 82.

On the other hand, when the focus position cannot be measured if the rough detecting point is located within the range of the exposure prohibition zone at the outer circumference of the wafer, it is necessary to enhance the performance of the pre-reading, for example, at the highly accurate detecting points 82A to 82C. Accordingly, in the case of the example shown in FIG. 8, when the width Δd in the scanning direction of the highly accurate pre-reading area 81, 82 is 2 mm, it is necessary that the rough detecting points 81A, 81B, 82A, 82B are arranged at a position of 2 to 3 mm in front of the pre-reading areas 81, 82 with the frequency response of 40 Hz.

The focusing control to follow up the waviness on the surface of the wafer has been described above. However, in some cases, the angle of inclination of the running surface of the XYθ stage 10 shown in FIG. 1 may vary during the scanning exposure. The variation factor includes, for example, the flatness of the air guide surface for holding the XYθ stage 10, the stability of air supply of the air guide, the vibration of the Z tilt stage 9, and the fluctuation of the unillustrated vibration-preventive pedestal for supporting the base board 11 of the wafer stage. The variation of the angle of inclination of the running surface consequently causes the error of the angle of inclination and the focus position of the surface of the wafer with respect to the image plane of the projection optical system PL. As described above, it is preferable that the phase delay error is corrected for the control response with respect to the waviness of the surface of the wafer. Accordingly, it is enough to use a small resonance frequency of about 10 Hz. However, the variation frequency of the angle of inclination is about 100 Hz at the maximum, which exerts harmful influence on the exposure performance.

When the focusing is performed in accordance with the complete pre-reading control system, if the focus position is pre-read with the AF sensor, and then the control is made on condition that the inclination of the running surface of the XYθ stage 10 is not varied, then any defocus occurs. Accordingly, as having been already explained, this embodiment is constructed such that the pitching amount θX of the sample base 8 about the X axis and the rolling amount θY about the Y axis are measured by using the main interferometer bodies 12X, 12Y shown in FIG. 2 so that the defocus amount, which is caused by the variation of the angle of inclination of the running surface of the XYθ stage 10, may be controlled at the resonance frequency of not less than 100 Hz. That is, the error, which is caused by the pitching amount θX and the rolling amount θY measurable by the respective main interferometer bodies 12X, 12Y, is controlled with the high resonance frequency of about 100 Hz. The defocus amount, which is measured, for example, by the AF sensors 44A, 44C, is controlled with the low resonance frequency of about 10 Hz including the pre-reading control.

The only error, which cannot be known only by the measurement with the main interferometer bodies 12X, 12Y, is the displacement of the running surface of the XYθ stage 10 in the Z direction, because the displacement in the Z direction cannot be measured with the main interferometer bodies 12X, 12Y. Accordingly, in this embodiment, for example, with reference to FIG. 11, the main interferometer body 12Y is used to successively measure the pitching amount θX of the sample base 8 every time when the movement is made in a predetermined amount ΔY. The displacement in the Z direction resulting from the pitching amount θX is added up in accordance with the following expression. Thus, the displacement amount $Z_{AC}$ of the sample base 8 in the Z direction is determined. After that, the Z tilt stage 9 is driven so that the displacement amount $Z_{AC}$ is offset. Accordingly, the follow-up velocity of the focusing control is improved.

$$Z_{AC} = \Sigma \theta X \cdot \Delta Y \qquad (11)$$

However, the error is extremely small. Therefore, even when no special correcting operation is performed, it is possible to substantially eliminate the residual error as in this embodiment by performing the follow-up control on the basis of the focus position at the central detecting point 83 in the exposure area 46. When the detection accuracy cannot be enhanced so much for the focus position at the central detecting point 83 in the exposure area 46, the following procedure may be available. That is, only the confirmation is made at the detecting point 83 whether or not any large defocus amount is generated. If any large defocus amount is generated, the error (warning) is provided.

According to the embodiment described above, the rough detecting point is arranged in front of the highly accurate pre-reading areas 81, 82 during the scanning exposure. Therefore, for example, it is possible to highly accurately perform the autofocus and the autoleveling control from the portion disposed just inside the exposure prohibition zone having the width of 3 mm from the outer circumference of the wafer. Further, the error, which is measurable with the respective main interferometer bodies 12X, 12Y, is controlled with the high response of about 100 Hz, while the error, which is measured, for example, by the AF sensors 44A, 44C, is controlled with the low response of about 10 Hz including the pre-reading control. Therefore, it is possible to obtain the high focusing control performance.

Further, the error, which depends on the running surface of the stage from the pre-reading area for the focus position to the exposure central position, can be eliminated by executing at least one of the control methods of (A) successively determining the variation amount of the inclination (pitching amount) of the sample base 8 in the scanning direction with the main interferometer body 12Y to add up obtained amounts, (B) arranging the detecting point 83 for the follow-up control (or for the confirmation) at the center of the exposure area 46 as well in addition to the arrangement of the rough detecting point for the focus position in front of the pre-reading areas 81, 82 to correct the finally remaining minute residual error without performing the pre-reading control, and (C) determining the variation amount of the angle of inclination and the defocus amount for each coordinate from the detection value of, for example, the AF sensors 44A, 44C when the XYθ stage 10 is moved to store obtained results as a map corresponding to the coordinate position of the XYθ stage 10 so that the measured value obtained, for example, by the AF sensor 44A, 44C is corrected on the basis of the map. Accordingly, it is possible to perform the control which does not depends on the change of the attitude of the wafer stage.

When the super flat thick wafer 89 shown in FIG. 12 is used to adjust a plurality of exposure apparatuses, it is possible to provide the plane which serves a common absolute reference. Therefore, it is also possible to mitigate the dispersion of the depth of focus for each of the exposure apparatuses.

In the embodiment of the present invention, the refractive type reduction projection optical system is used. However, if the numerical aperture of the projection optical system is increased, for example, to be about 0.7 to 0.8 in future, it is advantageous to use, as the projection optical system, a cata-dioptric type reduction projection optical system based on the use of an exposure light beam of, for example, an excimer laser beam such as $F_2$ or ArF. Accordingly, the operation distance is further decreased between the wafer and the light-outgoing surface of the projection optical system. It is needless to say that the present invention is also effectively applicable to such an exposure apparatus. Further, this embodiment is based on the use of the stage system having the predetermined stage control ability. The same effect is obtained by optimizing, for example, the arrangement of the pre-reading points for the focus position even when the performance of the stage system is further improved.

Further, in the embodiment of the present invention, the collimator type interferometer is used to measure the pitching and the rolling. However, it is also preferable to apply a method in which a plurality of laser beams are radiated onto a movement mirror (mirror surface) to determine a differential angle of inclination of measured values obtained by the respective laser beams. The embodiment described above may be applied to an EB (electron beam) exposure apparatus and an X-ray exposure apparatus. When the electron beam is used, it is possible to use, as an electron gun, for example, tantalum (Ta) and lanthanum hexaboride (LaB$_6$) of the thermionic emission type. The projection optical system may be a reflecting system, and it is an electromagnetic lens in the case of the EB exposure apparatus. It is needless to say that the optical path, through which the electron beam passes, is in the vacuum state.

The application or use of the exposure apparatus is not limited to the exposure apparatus for producing semiconductors. For example, it is also possible to make wide application to the exposure apparatus for producing liquid crystals in which an angular type glass plate is exposed with a liquid crystal display element pattern, and the exposure apparatus for producing thin film magnetic heads.

As for the magnification of the projection optical system, there is no limitation to the reduction system. It is allowable to use any of the 1×magnification system and the magnifying system. As for the projection optical system, when the far ultraviolet light beam such as the excimer laser is used, a material such as quartz and fluorite, which transmits the far ultraviolet light beam, is used as a saltpeter material. When the F$_2$ laser or the X-ray is used, it is preferable to use the optical system based on the cata-dioptric system or the refractive system. In this case, a reflective type reticle is used as well.

The reaction force, which is generated by the movement of the wafer stage, may be allowed to mechanically escape to the floor (ground) by using a frame member, as described in Japanese Patent Application Laid-Open No. 8-166475 and corresponding to U.S. Pat. No. 5,528,118, the content of which is incorporated hereinto by reference. Further, the reaction force, which is generated by the movement of the reticle stage, may be allowed to mechanically escape to the floor (ground) by using a frame member, as described in Japanese Patent Application Laid-Open No. 8-330224 corresponding to U.S. application Ser. No. 08/416,558, the content of which is incorporated hereinto by reference.

The exposure apparatus of the embodiment of the present invention can be produced by incorporating an illumination optical system and a projection optical system composed of a plurality of lenses into a main exposure apparatus body to perform optical adjustment, attaching a reticle stage and a wafer stage composed of a large number of mechanical parts to the main exposure apparatus body to connect wiring and piping thereto, and performing overall adjustment (for example, electric adjustment and confirmation of operation). It is desirable that the exposure apparatus is produced in a clean room in which, for example, the temperature and the cleanness are managed.

The semiconductor device is produced by performing, for example, a step of designing the function and the performance of the device, a step of producing a reticle based on the designing step, a step of manufacturing a wafer from a silicon material, a step of exposing the wafer with a reticle pattern by using the exposure apparatus of the embodiment described above, a step of assembling the device (including a dicing step, a bonding step, and a packaging step), and an inspection step.

It is a matter of course that the present invention is not limited to the embodiment described above, which may be embodied in other various forms without deviating from the gist or essential characteristics of the present invention.

All of the contents of the disclosure of Japanese Patent Application No. 10-17222 filed on Jan. 29, 1998, including the specification, claims, drawings, and abstract are exactly incorporated herein by reference.

According to the first exposure method of the present invention, even when the running surface of the substrate stage is inclined, the surface of the substrate can be conformed to the image plane of the optical system more highly accurately during the exposure by correcting the height of the surface of the substrate on the basis of the measured angle of inclination of the running surface of the substrate stage.

Further, according to the second exposure method of the present invention, for example, the influence of the error, which would be otherwise caused in the leveling control for the substrate stage performed during the exposure, can be reduced by using the variation values of the rolling amount and the pitching amount of the substrate stage brought about, for example, by the torsion of the substrate stage.

Furthermore, according to the third exposure method of the present invention, for example, when the exposure is performed in accordance with the scanning exposure system, even if the angle of inclination of the running surface of the stage for moving the substrate as the exposure objective is gently varied, then an advantage is obtained such that the surface of the substrate can be highly accurately conformed to the image plane during the scanning exposure.

Moreover, according to the first exposure apparatus of the present invention, it is possible to use the first exposure method of the present invention.

Moreover, according to the second exposure apparatus of the present invention, it is possible to use the second exposure method of the present invention.

Moreover, according to the third exposure apparatus of the present invention, an advantage is obtained such that the first or third exposure method of the present invention can be used, even when the surface of the substrate is greatly wavy, or even when the angle of inclination of the running surface of the substrate stage is greatly varied.

What is claimed is:

1. An exposure method for forming a predetermined image on a substrate by using an optical system which radiates an exposure light beam onto the substrate and a substrate stage which relatively moves the substrate with respect to the optical system, wherein a surface of the substrate and an image plane of the optical system are set to be in a predetermined positional relationship in at least a part of an area in an exposure area defined by the optical system, the method comprising the steps of:

measuring a height of the surface of the substrate at a measuring point disposed in front of the part of the area in the relative movement direction; and setting the positional relationship to perform exposure on the basis of information about the measured height of the surface of the substrate and information about an inclination angle of a running surface of the substrate stage.

2. The exposure method according to claim 1, wherein the measuring point is set in front of the exposure area in the relative movement direction.

3. The exposure method according to claim 1, wherein the information about the height of the surface of the substrate is measured during a period in which the substrate is relatively moved with respect to the optical system while radiating the exposure light beam onto the substrate.

4. The exposure method according to claim 1, further comprising a step of measuring a value concerning the inclination angle of the running surface of the substrate stage.

5. The exposure method according to claim 4, wherein:
the value concerning the inclination angle of the running surface of the substrate stage is a pitching amount of the substrate stage with respect to the relative movement direction of the substrate; and
the exposure is performed while setting the surface of the substrate and the image plane of the optical system to be in the predetermined positional relationship in the exposure area of the optical system on the basis of a result of prediction of a variation amount concerning the height of the surface of the substrate based on a result of measurement of the pitching amount, and the measured height of the surface of the substrate.

6. The exposure method according to claim 1, further comprising the step of:
using a fiducial member having good flatness arranged on the substrate stage to measure a height of a surface of the fiducial member at a plurality of positions within a movement stroke of the substrate stage, and storing a result of measurement, wherein:
the value concerning the inclination angle of the running surface of the substrate stage is calculated on the basis of a stored value.

7. The exposure method according to claim 6, wherein the fiducial member is detachable to an apparatus which performs the exposure, and is commonly used for a plurality of exposure apparatuses.

8. The exposure method according to claim 6, wherein the fiducial member is supported at three points with respect to the apparatus.

9. The exposure method according to claim 1, wherein the predetermined image is an image obtained by projecting a pattern which is formed on a mask and is used for transfer.

10. The exposure method according to claim 1, wherein a plurality of measuring points for measuring the height of the surface of the substrate are provided in a direction substantially perpendicular to the relative movement direction.

11. The exposure method according to claim 10, further comprising a step of controlling an inclination angle of the substrate with respect to the relative movement direction.

12. The exposure method according to claim 1, wherein the image is formed on the substrate during the relative movement with respect to the optical system.

13. An exposure method for forming a predetermined image on a substrate using an optical system which radiates an exposure light beam onto the substrate and a substrate stage which relatively moves the substrate with respect to the optical system, the method comprising the steps of:
measuring at least one of a rolling amount of the substrate stage, a pitching amount of the substrate stage, and a displacement amount of the substrate stage in an optical axis direction of the optical system at a plurality of positions within a movement stroke of the substrate stage using a fiducial member having good flatness arranged on the substrate stage, and storing a result of measurement; and
correcting at least one of a running direction of the substrate stage and a height of a surface of the substrate on the basis of the result of measurement during exposure for the substrate.

14. The exposure method according to claim 13, wherein the fiducial member is detachable with respect to the substrate stage, and is commonly used for a plurality of exposure apparatuses which perform the exposure respectively.

15. The exposure method according to claim 14, wherein the fiducial member is supported at three points with respect to the apparatus.

16. The exposure method according to claim 13, further comprising a step of:
determining and storing a variation value of the pitching amount and a variation value of the rolling amount from the result of measurement of the rolling amount of the substrate stage, the pitching amount of the substrate stage, and the displacement amount of the substrate stage in the optical axis direction of the optical system, wherein:
the rolling amount of the substrate stage, which is detected during the exposure for the substrate, is corrected on the basis of the variation value of the rolling amount; and
the pitching amount of the substrate stage, which is detected during the exposure for the substrate, is corrected on the basis of the variation value of the pitching amount.

17. The exposure method according to claim 13, further comprising a step of:
measuring straightness of the substrate stage in the running direction using a fiducial mark formed on the fiducial member arranged on the substrate stage, wherein:
any discrepancy of the substrate stage in the running direction is corrected during the exposure for the substrate on the basis of a result of measurement of the straightness.

18. The exposure method according to claim 13, wherein the predetermined image is an image obtained by projecting a pattern which is formed on a mask and is used for transfer.

19. The exposure method according to claim 13, wherein the image is formed on the substrate during the relative movement with respect to the optical system.

20. An exposure method for forming a predetermined image on a substrate using an optical system which radiates an exposure light beam onto the substrate and a substrate stage which relatively moves the substrate with respect to the optical system, wherein the substrate and an image plane of the optical system are set to be in a predetermined positional relationship in at least a part of an area in an exposure area defined by the optical system, the method comprising the steps of:
measuring a height position of the substrate at a first measuring point which arrives at an image-forming area on the substrate prior to the part of the area in the relative movement direction;
measuring a height of the substrate at a second measuring point which arrives at the image-forming area on the substrate prior to the first measuring point in the relative movement direction; and
moving the substrate to a height position within a detectable range of a unit for measuring the height position of the substrate at the first measuring point, on the basis of a measured value obtained at the second measuring point.

21. The exposure method according to claim 20, wherein the first measuring point arrives at the image-forming area on the substrate prior to the exposure area.

22. The exposure method according to claim 20, wherein information about the height position of the substrate at the first measuring point and information about the height position of the substrate at the second measuring point are measured during a period in which the substrate is relatively moved with respect to the optical system while radiating the exposure light beam onto the substrate.

23. The exposure method according to claim 20, wherein a detection range, which is used when the height position of the substrate is measured at the second measuring point, is set to be wider than a detection range which is used when the height position of the substrate is measured at the first measuring point.

24. The exposure method according to claim 20, wherein the second measuring point includes a plurality of measuring points.

25. The exposure method according to claim 20, further comprising the steps of:
controlling a position of the substrate concerning an optical axis direction of the optical system on the basis of an intermediate value between a maximum value and a minimum value of the height position of the substrate measured at each of the first measuring point and the second measuring point; and
controlling an inclination angle of the substrate by correcting an error caused when the position in the optical axis direction is controlled, with a value of the height position of the substrate.

26. The exposure method according to claim 20, wherein the predetermined image is an image obtained by projecting a pattern which is formed on a mask and which is used for transfer.

27. The exposure method according to claim 20, wherein the image is formed on the substrate during the relative movement with respect to the optical system.

28. An exposure apparatus which comprises an optical system which radiates an exposure light beam onto a substrate, and a substrate stage which relatively moves the substrate with respect to the optical system, wherein a surface of the substrate and an image plane of the optical system are set to be in a predetermined positional relationship in at least a part of an area in an exposure area defined by the optical system, in order to form a predetermined image on the substrate, the exposure apparatus including:
a focus position-measuring unit which measures a height of the surface of the substrate at a measuring point disposed in front of the part of the area in the relative movement direction; and
a focusing stage which conforms the surface of the substrate to the image plane of the optical system in the exposure area of the optical system on the basis of a value measured by the focus position-measuring unit and information about an inclination angle of a running surface of the substrate stage.

29. The exposure apparatus according to claim 28, wherein the measuring point is set in front of the exposure area in the relative movement direction.

30. The exposure apparatus according to claim 28, wherein the focus position-measuring unit measures the height during a period in which the substrate is relatively moved with respect to the optical system while radiating the exposure light beam onto the substrate.

31. The exposure apparatus according to claim 28, further comprising an inclination angle-measuring unit which measures a value concerning the inclination angle.

32. The exposure apparatus according to claim 28, wherein:
the inclination angle-measuring unit includes a pitching-measuring unit which measures a pitching amount of the substrate stage with respect to the relative movement direction during exposure of the substrate; and
the focusing stage sets the surface of the substrate and the image plane of the optical system to be in the predetermined positional relationship in the exposure area of the optical system on the basis of a result of prediction of a variation amount concerning the height of the surface of the substrate based on a result of measurement of the pitching amount, and the height of the surface of the substrate measured by the focus position-measuring unit.

33. The exposure apparatus according to claim 31, wherein:
the inclination angle-measuring unit measures a height of a surface of a fiducial member which has good flatness and is arranged on the substrate stage at a plurality of positions within a movement stroke of the substrate stage; and
the exposure apparatus further comprises a calculating unit for the focusing stage, and the calculating unit stores a result of measurement performed by the inclination angle-measuring unit, and calculates the value concerning the inclination angle of the running surface of the substrate stage on the basis of the stored result of measurement.

34. The exposure apparatus according to claim 33, wherein the fiducial member is supported at three points with respect to the substrate stage.

35. The exposure apparatus according to claim 28, wherein the predetermined image is an image obtained by projecting a pattern which is formed on a mask and is used for transfer.

36. The exposure apparatus according to claim 28, wherein a plurality of measuring points for measuring the height of the surface of the substrate are provided in a direction substantially perpendicular to the relative movement direction.

37. The exposure apparatus according to claim 36, wherein the focusing stage controls an inclination angle of the substrate concerning the direction substantially perpendicular to the relative movement direction on the basis of a result of measurement performed by an inclination angle-measuring unit.

38. The exposure apparatus according to claim 28, wherein the image is formed on the substrate during the relative movement with respect to the optical system.

39. An exposure apparatus which comprises an optical system which radiates an exposure light beam onto a substrate, and a substrate stage which relatively moves the substrate with respect to the optical system, and which forms a predetermined image on the substrate, the exposure apparatus including:
a measuring unit with a fiducial member having good flatness arranged on the substrate stage, which measures at least one of a rolling amount of the substrate stage, a pitching amount of the substrate stage, and a displacement amount of the substrate stage in an optical axis direction of the optical system at a plurality of positions within a movement stroke of the substrate stage; and
a focusing stage which stores a result of measurement performed by the measuring unit and which corrects at least one of a running direction of the substrate stage and a height of a surface of the substrate on the basis of the result of measurement during exposure for the substrate.

40. The exposure apparatus according to claim 39, wherein the fiducial member is supported at three points with respect to the substrate stage.

41. The exposure apparatus according to claim 39, wherein the focusing stage determines and stores a variation value of the pitching amount and a variation value of the rolling amount from the result of measurement of the rolling amount of the substrate stage, the pitching amount, and the displacement amount in the optical axis direction of the optical system; the rolling amount of the substrate stage, which is detected during the exposure for the substrate, is corrected on the basis of the variation value of the rolling amount; and the pitching amount of the substrate stage, which is detected during the exposure for the substrate, is corrected on the basis of the variation value of the pitching amount.

42. The exposure apparatus according to claim 39, wherein:
  the measuring unit measures straightness of the substrate stage in the running direction by a fiducial mark formed on the fiducial member having the good flatness arranged on the substrate stage; and
  the focusing stage corrects any discrepancy of the substrate stage in the running direction during the exposure for the substrate on the basis of a result of measurement of the straightness.

43. The exposure apparatus according to claim 39, wherein the predetermined image is an image obtained by projecting a pattern which is formed on a mask and is used for transfer.

44. The exposure apparatus according to claim 39, wherein the image is formed on the substrate during the relative movement with respect to the optical system.

45. An exposure apparatus comprising an optical system which radiates an exposure light beam onto a substrate, and a substrate stage which relatively moves the substrate with respect to the optical system, wherein a surface of the substrate and an image plane of the optical system are set to be in a predetermined positional relationship in at least a part of an area in an exposure area defined by the optical system, in order to form a predetermined image on the substrate, the exposure apparatus including:
  a first focus position-measuring unit which measures a height position of a surface of the substrate at a first measuring point disposed in front of the part of the area in the relative movement direction;
  a second focus position-measuring unit which measures a height position of the substrate at a second measuring point set in the vicinity of the first measuring point; and
  a focusing stage which allows a height of the surface of the substrate to be included within a detectable range of the first focus position-measuring unit on the basis of a result of measurement performed by the second focus position-measuring unit.

46. The exposure apparatus according to claim 45, wherein the first measuring point is set in front of the exposure area in the relative movement direction.

47. The exposure apparatus according to claim 45, wherein the first and second focus position-measuring units measure the height during a period in which the substrate is relatively moved with respect to the optical system while radiating the exposure light beam onto the substrate.

48. The exposure apparatus according to claim 45, wherein the second measuring point is arranged in front of the first measuring point in the relative movement direction.

49. The exposure apparatus according to claim 45, wherein a detection range of the second focus position-measuring unit is wider than a detection range of the first focus position-measuring unit.

50. The exposure apparatus according to claim 45, wherein the second measuring point includes a plurality of measuring points.

51. The exposure apparatus according to claim 45, wherein the focusing stage controls a position of the substrate in an optical axis direction of the optical system on the basis of an intermediate value between a maximum value and a minimum value of the height position of the substrate measured at each of the first measuring point and the second measuring point, and controls an inclination angle of the substrate by correcting an error brought about when the position concerning the optical axis direction is controlled, with a value of the height position of the substrate.

52. The exposure apparatus according to claim 45, wherein the predetermined image is an image obtained by projecting a pattern which is formed on a mask and is used for transfer.

53. The exposure apparatus according to claim 45, wherein the image is formed on the substrate during the relative movement with respect to the optical system.

* * * * *